United States Patent
Lerman et al.

(10) Patent No.: US 11,189,753 B2
(45) Date of Patent: Nov. 30, 2021

(54) SOLID STATE LIGHT SHEET HAVING WIDE SUPPORT SUBSTRATE AND NARROW STRIPS ENCLOSING LED DIES IN SERIES

(71) Applicant: Quarkstar LLC, Las Vegas, NV (US)

(72) Inventors: Louis Lerman, Las Vegas, NV (US); Allan Brent York, Fort Langley (CA); Michael David Henry, Albuquerque, NM (US); Robert V. Steele, Redwood City, CA (US); Brian D. Ogonowsky, Mountain View, CA (US)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 16/802,456

(22) Filed: Feb. 26, 2020

(65) Prior Publication Data

US 2020/0194620 A1  Jun. 18, 2020

Related U.S. Application Data

(63) Continuation of application No. 15/894,796, filed on Feb. 12, 2018, now abandoned, which is a
(Continued)

(51) Int. Cl.
*H01L 29/18* (2006.01)
*H01L 33/00* (2010.01)
(Continued)

(52) U.S. Cl.
CPC ............... *H01L 33/08* (2013.01); *F21K 9/20* (2016.08); *F21K 9/64* (2016.08); *H01L 25/0753* (2013.01);
(Continued)

(58) Field of Classification Search
CPC ......... H01L 2924/0002; H01L 25/0753; H01L 2924/00; H01L 33/08; H01L 2933/0033;
(Continued)

(56) References Cited

U.S. PATENT DOCUMENTS 4,445,132 A    4/1984  Ichikawa et al.
5,469,020 A   11/1995  Herrick
(Continued)

FOREIGN PATENT DOCUMENTS

CN       1485929      3/2004
CN     101030627      9/2007
(Continued)

OTHER PUBLICATIONS

English translation of Japanese Patent No. JP08-018105. 12 pages. Put in foreign—redundant.
(Continued)

*Primary Examiner* — Meiya Li
(74) *Attorney, Agent, or Firm* — Fish & Richardson P.C.

(57) ABSTRACT

A solid state light sheet and method of fabricating the sheet are disclosed. In one embodiment, bare LED chips have top and bottom electrodes, where the bottom electrode is a large reflective electrode. The bottom electrodes of an array of LEDs (e.g., 500 LEDs) are bonded to an array of electrodes formed on a flexible bottom substrate. Conductive traces are formed on the bottom substrate connected to the electrodes. A transparent top substrate is then formed over the bottom substrate. Various ways to connect the LEDs in series are described along with many embodiments. In one method, the top substrate contains a conductor pattern that connects to LED electrodes and conductors on the bottom substrate.

23 Claims, 31 Drawing Sheets

Related U.S. Application Data continuation of application No. 14/842,778, filed on Sep. 1, 2015, now abandoned, which is a continuation of application No. 13/730,059, filed on Dec. 28, 2012, now abandoned, which is a continuation of application No. 13/100,231, filed on May 3, 2011, now Pat. No. 8,344,397, which is a continuation of application No. 13/044,456, filed on Mar. 9, 2011, now Pat. No. 8,198,109, which is a continuation-in-part of application No. 13/018,330, filed on Jan. 31, 2011, now Pat. No. 8,461,602, which is a continuation-in-part of application No. 12/917,319, filed on Nov. 1, 2010, now Pat. No. 8,210,716, which is a continuation-in-part of application No. 12/870,760, filed on Aug. 27, 2010, now Pat. No. 8,338,199.

(51) Int. Cl.
  *H01L 33/08* (2010.01)
  *H01L 25/075* (2006.01)
  *F21K 9/20* (2016.01)
  *F21K 9/64* (2016.01)
  *H01L 33/50* (2010.01)
  *H01L 33/60* (2010.01)
  *H01L 33/62* (2010.01)
  *H01S 5/40* (2006.01)
  *F21S 8/06* (2006.01)
  *F21Y 115/10* (2016.01)
  *F21Y 107/90* (2016.01)

(52) U.S. Cl.
  CPC ............ *F21S 8/06* (2013.01); *F21Y 2107/90* (2016.08); *F21Y 2115/10* (2016.08); *H01L 33/507* (2013.01); *H01L 33/60* (2013.01); *H01L 33/62* (2013.01); *H01L 2924/0002* (2013.01); *H01L 2933/0033* (2013.01); *H01L 2933/0066* (2013.01); *H01L 2933/0075* (2013.01); *H01S 5/4025* (2013.01)

(58) Field of Classification Search
  CPC ..... H01L 2933/0066; H01L 2933/0075; H01L 33/507; H01L 33/60; H01L 33/62
  See application file for complete search history.

(56) References Cited

U.S. PATENT DOCUMENTS

| | | | |
|---|---|---|---|
| 5,884,994 | A | 3/1999 | Herst et al. |
| 5,925,897 | A | 7/1999 | Oberman |
| 6,087,680 | A | 7/2000 | Gramann et al. |
| 6,113,433 | A | 9/2000 | Al-Turki |
| 6,270,236 | B1 | 8/2001 | Brussog |
| 6,541,908 | B1 | 4/2003 | Cheung et al. |
| 6,557,393 | B1 | 5/2003 | Gokhfeld et al. |
| 6,599,768 | B1 | 7/2003 | Chen |
| 6,693,551 | B2 | 2/2004 | Pederson |
| 6,786,621 | B2 | 9/2004 | Sviland |
| 6,821,804 | B2 | 11/2004 | Thibeault et al. |
| 6,876,143 | B2 | 4/2005 | Daniels |
| 6,876,149 | B2 | 4/2005 | Miyashita |
| 6,936,855 | B1 | 8/2005 | Harrah |
| 7,052,924 | B2 | 5/2006 | Daniels et al. |
| 7,071,493 | B2 | 7/2006 | Owen et al. |
| 7,217,956 | B2 | 5/2007 | Daniels et al. |
| 7,259,030 | B2 | 8/2007 | Daniels et al. |
| 7,378,124 | B2 | 5/2008 | Daniels |
| 7,404,652 | B2 | 7/2008 | Ng et al. |
| 7,427,782 | B2 | 9/2008 | Daniels et al. |
| 7,476,557 | B2 | 1/2009 | Daniels et al. |
| 7,564,180 | B2 | 7/2009 | Brandes |
| 7,609,006 | B2 | 10/2009 | Gibboney |
| 7,609,241 | B2 | 10/2009 | Chen et al. |
| 7,745,838 | B2 | 6/2010 | Lefevre |
| 7,777,166 | B2 | 8/2010 | Roberts |
| 7,799,699 | B2 | 9/2010 | Nuzzo et al. |
| 7,858,994 | B2 | 12/2010 | Daniels |
| 8,039,850 | B2 | 10/2011 | Lee et al. |
| 8,044,415 | B2 | 10/2011 | Messere et al. |
| 8,189,641 | B2 | 5/2012 | Fukuda et al. |
| 8,193,721 | B2 | 6/2012 | Cho et al. |
| 8,210,716 | B2 | 7/2012 | Lerman et al. |
| 8,227,822 | B2 | 7/2012 | Hung et al. |
| 8,338,199 | B2 | 12/2012 | Lerman et al. |
| 8,338,849 | B2 | 12/2012 | Tischler et al. |
| 8,343,571 | B2 | 1/2013 | Werners et al. |
| 8,366,295 | B2 | 2/2013 | Tanda et al. |
| 8,414,154 | B2 | 4/2013 | Dau et al. |
| 8,502,239 | B2 | 8/2013 | Liu |
| 8,591,057 | B2 | 11/2013 | Kawabata et al. |
| 8,882,290 | B2 | 11/2014 | Hsieh et al. |
| 9,230,943 | B2 | 1/2016 | Harbers et al. |
| 2002/0149933 | A1 | 10/2002 | Archer et al. |
| 2003/0160256 | A1 | 8/2003 | Durocher et al. |
| 2004/0189218 | A1 | 9/2004 | Leong et al. |
| 2005/0174769 | A1 | 8/2005 | Yong et al. |
| 2005/0199899 | A1 | 9/2005 | Lin et al. |
| 2005/0207152 | A1 | 9/2005 | Maxik |
| 2005/0207156 | A1 | 9/2005 | Wang et al. |
| 2005/0214963 | A1 | 9/2005 | Daniels et al. |
| 2005/0224828 | A1 | 10/2005 | Oon et al. |
| 2005/0265024 | A1 | 12/2005 | Luk |
| 2005/0265029 | A1* | 12/2005 | Epstein .............. G09F 9/3026 362/339 |
| 2006/0152931 | A1 | 7/2006 | Holman |
| 2006/0157724 | A1 | 7/2006 | Fujita |
| 2006/0180828 | A1 | 8/2006 | Kim et al. |
| 2006/0221606 | A1 | 10/2006 | Dowling |
| 2007/0001188 | A1 | 1/2007 | Lee |
| 2007/0090387 | A1 | 4/2007 | Daniels et al. |
| 2007/0103066 | A1 | 5/2007 | D'Andrade et al. |
| 2007/0126354 | A1 | 6/2007 | Chao |
| 2007/0228999 | A1 | 10/2007 | Kit |
| 2007/0241355 | A1 | 10/2007 | Chua |
| 2007/0280593 | A1 | 12/2007 | Brychell et al. |
| 2007/0290217 | A1 | 12/2007 | Daniels |
| 2008/0079012 | A1 | 4/2008 | Grote et al. |
| 2008/0080163 | A1 | 4/2008 | Grote, III et al. |
| 2008/0080200 | A1 | 4/2008 | Robbins et al. |
| 2008/0089069 | A1 | 4/2008 | Medendorp |
| 2008/0117500 | A1 | 5/2008 | Narendran et al. |
| 2008/0179602 | A1 | 7/2008 | Negley et al. |
| 2008/0194054 | A1 | 8/2008 | Lin et al. |
| 2008/0238338 | A1 | 10/2008 | Latham et al. |
| 2008/0238649 | A1 | 10/2008 | Arszman et al. |
| 2008/0297071 | A1 | 12/2008 | Ray et al. |
| 2009/0045418 | A1 | 2/2009 | Yeh |
| 2009/0046457 | A1 | 2/2009 | Everhart |
| 2009/0086508 | A1 | 4/2009 | Bierhuizen |
| 2009/0114928 | A1 | 5/2009 | Messere et al. |
| 2009/0140271 | A1* | 6/2009 | Sah .................. F21V 31/04 257/88 |
| 2009/0195787 | A1 | 8/2009 | Granados et al. |
| 2009/0237916 | A1 | 9/2009 | Park |
| 2009/0261357 | A1 | 10/2009 | Daniels |
| 2009/0261743 | A1 | 10/2009 | Chen et al. |
| 2010/0044589 | A1 | 2/2010 | Garcia et al. |
| 2010/0084665 | A1 | 4/2010 | Daniels et al. |
| 2010/0102729 | A1 | 4/2010 | Katzir et al. |
| 2010/0164344 | A1 | 7/2010 | Boerner et al. |
| 2010/0301349 | A1 | 12/2010 | Wang et al. |
| 2010/0301356 | A1 | 12/2010 | Scott et al. |
| 2010/0308350 | A1 | 12/2010 | Bisberg |
| 2010/0308353 | A1 | 12/2010 | Grabowski et al. |
| 2010/0317132 | A1 | 12/2010 | Rogers et al. |
| 2011/0050073 | A1 | 3/2011 | Huang |
| 2011/0058372 | A1 | 3/2011 | Lerman et al. |
| 2011/0069487 | A1 | 3/2011 | Ng et al. |
| 2011/0095318 | A1 | 4/2011 | Liao |
| 2011/0133658 | A1 | 6/2011 | Sauerlaender |
| 2011/0163683 | A1 | 7/2011 | Steele et al. |
| 2011/0170288 | A1 | 7/2011 | Kim |

(56) References Cited

U.S. PATENT DOCUMENTS

| | | |
|---|---|---|
| 2011/0180818 A1 | 7/2011 | Lerman et al. |
| 2011/0204020 A1 | 8/2011 | Ray et al. |
| 2011/0260741 A1 | 10/2011 | Weaver et al. |
| 2011/0267560 A1 | 11/2011 | Usukura |
| 2011/0298371 A1 | 12/2011 | Brandes et al. |
| 2012/0043552 A1 | 2/2012 | David et al. |

FOREIGN PATENT DOCUMENTS

| | | |
|---|---|---|
| CN | 101222010 | 7/2008 |
| CN | 202343061 | 7/2008 |
| CN | 101501871 | 8/2009 |
| CN | 101685783 | 3/2010 |
| CN | 101652601 | 2/2017 |
| DE | 10315417 | 11/2004 |
| EP | 2159780 | 3/2010 |
| JP | 61-198690 | 9/1986 |
| JP | 08-018105 | 1/1996 |
| JP | 2009010204 | 1/2009 |
| JP | 2010147190 | 7/2010 |
| KR | 20100089115 | 8/2010 |
| WO | WO05/099310 | 10/2005 |
| WO | WO2011082497 | 7/2011 |
| WO | WO2013116631 | 8/2013 |

OTHER PUBLICATIONS

English translation of Japanese Patent No. JP61-198690, 11 pages. Put in foreign—redundant.

"A Breakthrought in LED Technology," Lightsheet™ versus the other LED Manufacturing Technology, Lightsheet, Articulux, Articulated Technologies web page downloaded on Aug. 27, 2010 from http://www.buylightsheet.com/how, html, 1 page.

"Competitive Advantage of Lightsheet™ Technology," Articulated Technologies white paper, 4 pages.

"Why pay for the lamp when you just need the light?," Lightsheet, Articulux, Articulated Technologies web page downloaded on Aug. 27, 2010 from http://www.buylightsheet.com/, 1 page.

LED Bulb with 5W Power Consumption, product description, downloaded on Nov. 22, 2010 from http://www.best-b2b.com/Products/867/890-2/led-bulb-with-5w-power-consumption_417 . . . pp. 1-2.

James Gourlay et al., "74.2: High Efficiency Hybrid LED Backlight for Large-area LCD TV," 2010 SID Digest, pp. 1097-1099.

James Gourlay et al., "79.4: Light-Rolls: High Throughput Manufacture for LED Lighting and Displays," SID 2010 DIGEST, pp. 1184-1187.

S. W. Rickly Lee et al., "Process Development and Prototyping for the Assembly of LED Arrays on Flexible Printed Circuit Tape for General Solid State Lighting," 2009 IEEE, 2009 Electronic Components and Technology Conference, pp. 2137-2142.

Louis Lerman et al., "Solid State Light Sheet Using Thin LEDs for General Illumination", U.S. Appl. No. 13/018,330, filed Jan. 31, 2011, 89 pages.

Konstantinos A. Sierros et al., "59.2: Durable Solid State Flexible LED Devices," SID 2010 DIGEST, pp. 882-885.

Vergoosen, Invitation to Pay Additional Fees in PCT/US2011/049233 dated Dec. 22, 2011, 7 pages.

European Application No. 11 761 740.7, Communication pursuant to Article 94(3) EPC, dated Apr. 29, 2016, 7 pages.

Chinese Application No. 201180051875.9, Notification of the Third Office Action, dated Oct. 10, 2016, 20 pages.

European Patent Application No. 11 761 740.7, Communication pursuant to Article 94(3) EPC, dated Sep. 29, 2017, 4 pages.

Chinese Application No. 201710574883.0, Notification of First Office Action, dated Mar. 20, 2019, 21 pages.

Specifications Datasheet, Citizen Electronics Co., Ltd., Ref. CE-P401, Mar. 2009, 9 pages.

\* cited by examiner

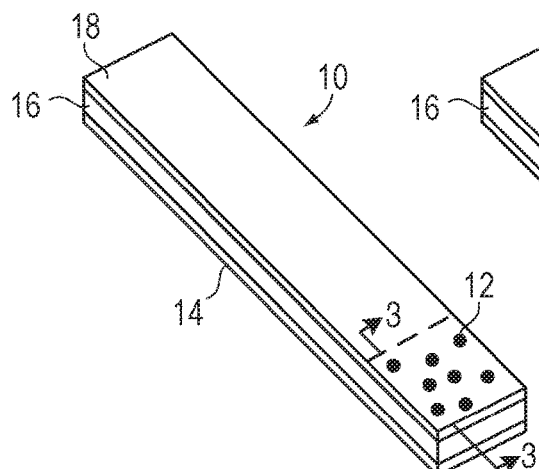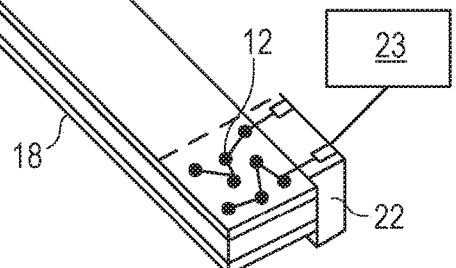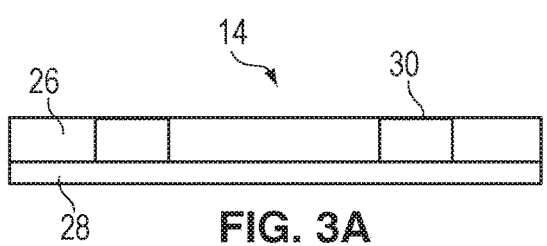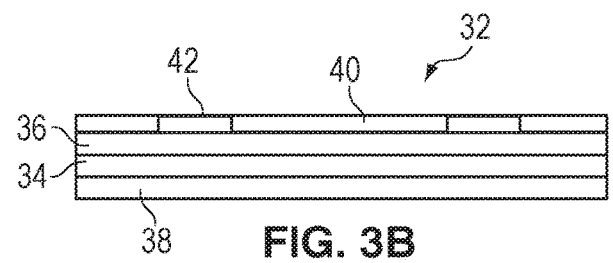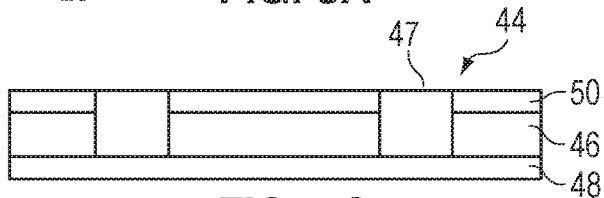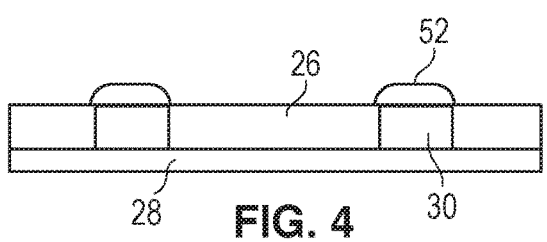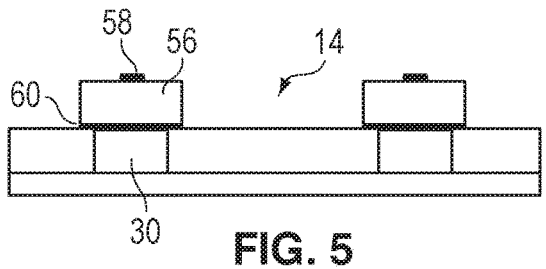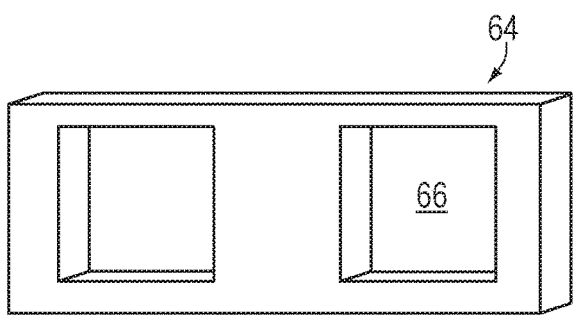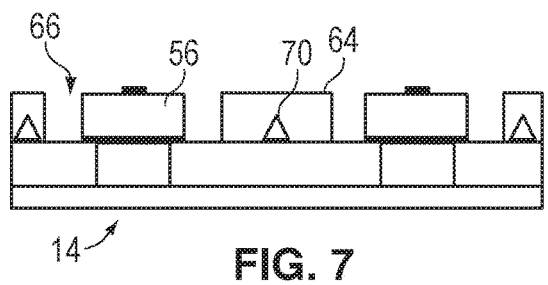

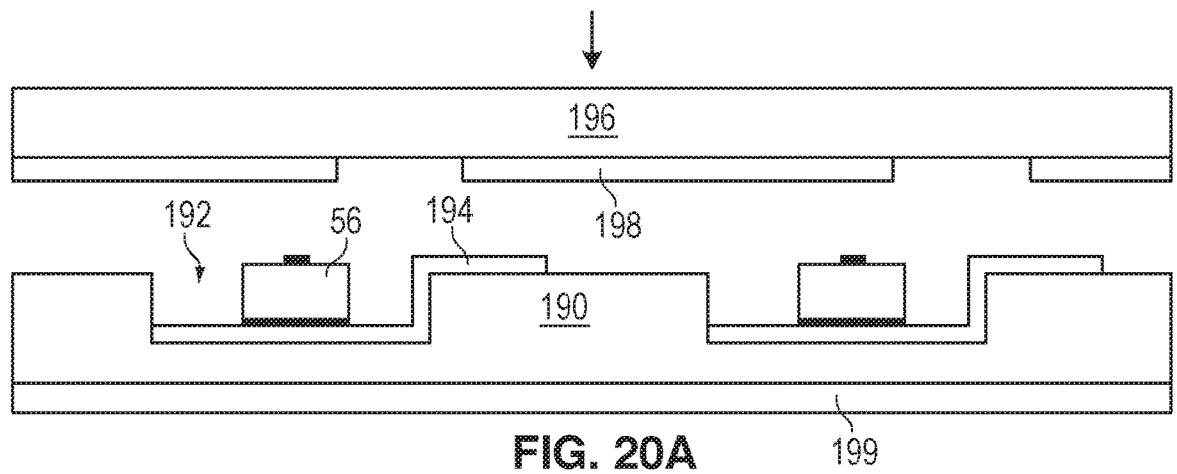
FIG. 20A
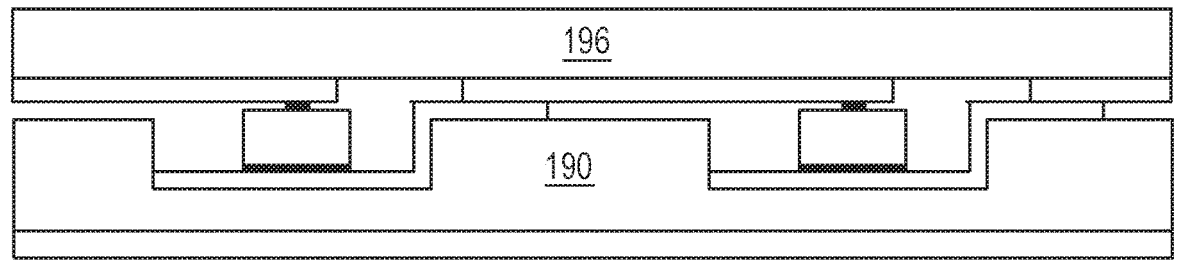
FIG. 20B
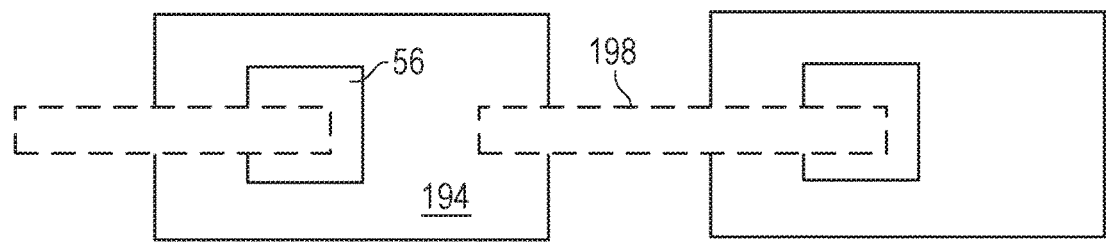
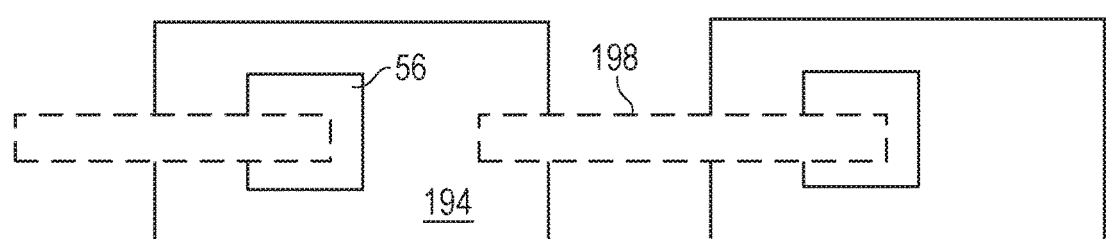
FIG. 20C

SOLID STATE LIGHT SHEET HAVING WIDE SUPPORT SUBSTRATE AND NARROW STRIPS ENCLOSING LED DIES IN SERIES

CROSS-REFERENCE TO RELATED APPLICATIONS

This is a continuation application and claims priority under 35 USC § 120 to U.S. application Ser. No. 15/894,796, filed on Feb. 12, 2018, entitled "Solid State Light Sheet Having Wide Support Substrate and Narrow Strips Enclosing LED Dies in Series", by Louis Lerman et al., which is a continuation application and claims priority under 35 USC § 120 to U.S. application Ser. No. 14/842,778, filed on Sep. 1, 2015, entitled "Solid State Light Sheet Having Wide Support Substrate and Narrow Strips Enclosing LED Dies in Series", by Louis Lerman et al., which is a continuation of U.S. application Ser. No. 13/730,059, filed on Dec. 28, 2012, entitled "Solid State Light Sheet Having Wide Support Substrate and Narrow Strips Enclosing LED Dies in Series", by Louis Lerman et al., which is a continuation of U.S. application Ser. No. 13/100,231, filed on May 3, 2011, entitled "Solid State Light Sheet Having Wide Support Substrate and Narrow Strips Enclosing LED Dies in Series", by Louis Lerman et al., which is a continuation of U.S. application Ser. No. 13/044,456, filed on Mar. 9, 2011, entitled "Manufacturing Methods for Solid State Light Sheet or Strip with LEDs Connected in Series for General Illumination", by Louis Lerman et al., which is a continuation-in-part of U.S. application Ser. No. 13/018,330, filed on Jan. 31, 2011, entitled "Solid State Light Sheet Using Thin LEDs for General Illumination", by Louis Lerman et al., which is a continuation-in-part of U.S. application Ser. No. 12/917,319, filed on Nov. 1, 2010, entitled "Solid State Bidirectional Light Sheet for General Illumination", by Louis Lerman et al., which is a continuation-in-part of U.S. application Ser. No. 12/870,760, filed on Aug. 27, 2010, entitled "Solid State Light Sheet for General Illumination", by Louis Lerman et al., the entire contents of which are incorporated herein by reference.

FIELD OF INVENTION

This invention relates to solid state illumination and, in particular, to a light sheet containing light emitting dies, such as light emitting diodes (LEDs), that may be used for general illumination.

BACKGROUND

High power LEDs are the conventional choice for general solid state lighting applications. Such high power white LEDs are extremely bright and can have luminous efficacies between 100 and 200 lumens/watt. The input power of a single high-power LED is typically greater than 0.5 watt and may be greater than 10 watts. Such LEDs generate considerable heat since they are only about 1 mm$^2$ in area, so the required packaging is fairly complex and expensive. Although a bare high-power LED chip typically costs well under $1.00 (e.g., $0.10), the packaged LED typically costs around $1.50-$3.00. This makes a high output (e.g., 3000+ lumens) solid state luminaire relatively expensive and not a commercially feasible alternative for a standard 2×4 foot fluorescent light fixture, commonly used in offices. Further, the optics required to convert the high brightness point sources into a substantially homogeneous, broad angle emission for an office environment (where glare control is important) is extremely challenging.

To greatly reduce the cost of a large area, high lumen output light source, it is known to sandwich an array of bare LED dice between a bottom sheet having conductors and a top transparent sheet having conductors. The LEDs have top and bottom electrodes that contact a set of conductors. When the conductors are energized, the LEDs emit light. The light sheet may be flexible.

The Japanese published application S61-198690 by Hiroshi (filed in 1985 and published on 3 Sep. 1986) describes a light sheet using a plastic transparent front substrate having thin wires formed on it. A bottom substrate also has thin wires formed on it. An array of bare LED chips with top and bottom electrodes is arranged on the bottom substrate, and the front substrate is adhesively secured over the LED chips. LED chips at the intersections of energized perpendicular wires emit light.

The Japanese published application H08-18105 by Hirohisa (filed in 1994 and published on 19 Jan. 1996) describes a light sheet using a transparent front substrate having transparent electrodes (ITO) connected to metal strips. A backside substrate has metal conductors arranged in strips. Bottom electrodes of bare LED chips are bonded to the metal conductors on the backside substrate, such as using solder paste and reflow. A stamped "epoxy hotmelt adhesive" is provided on the backside substrate surrounding the LED chips. A liquid epoxy molding resin then fills in the inner area within the epoxy hotmelt adhesive. The hotmelt adhesive is then softened, and the front substrate is then affixed over the LED chips using the hotmelt adhesive and the cured molding resin. Applying current to the perpendicular strips of metal conductors on the opposing substrates energizes an LED chip at the intersection of two conductors. In one embodiment, the front and backside conductors/electrodes are formed over the entire surface, so all the LED chips will be energized simultaneously for use as an illuminator.

U.S. Pat. No. 6,087,680 to Gramann (priority filing date 31 Jan. 1997, issued 11 Jul. 2000) describes a light sheet using "elastic plastic" top and bottom substrates. Thin metal conductor strips and electrodes are sputtered onto the substrates or deposited in other conventional ways. Bare LED chips are provided with top and bottom electrodes. A conductive adhesive is used to adhere the bottom electrodes of the LED chips to the bottom substrate electrodes. A "coupling medium" fills in the spaces between the LED chips and is used for increasing light extraction. The coupling medium may be a liquid adhesive such as epoxy, resin, or silicone. The top substrate is then affixed over the LED chips, where the adhesive coupling medium affixes the substrates together and encapsulates the LED chips. Gramann describes the top and bottom substrates being "a structured conducting foil being formed essentially of plastic" that is capable of "plastic or elastic deformation," so the light sheet is flexible.

Various patents to Daniels et al. have been issued relating to the earlier light sheets described above. These include U.S. Pat. Nos. 7,217,956; 7,052,924; 7,259,030; 7,427,782; and 7,476,557. Daniels' basic process for forming a flexible light sheet is as follows. Bare LED chips having top and bottom electrodes are provided. A bottom substrate sheet is provided with metal conductor strips and electrodes. A hotmelt adhesive sheet is formed separately, and the LED chips are embedded into the adhesive sheet. A transparent top substrate sheet is provided with metal conductor strips leading to transparent ITO electrodes. The adhesive sheet, containing the LEDs, is sandwiched between the top and bottom substrates, and the three layers are laminated together using heat and pressure so that there is electrical contact between the LED chips' electrodes and the opposing substrate electrodes. The process is performed as a continuous roll-to-roll process. The roll is later cut for a particular application. The LED chips may be arranged in a pattern to create a sign, or the LED chips may be arranged in an array to provide illumination.

In an alternative Daniels process, described in U.S. Pat. No. 7,259,030, a bottom substrate has an adhesive conductive sheet over it, on which is laminated a double sided adhesive sheet with holes. The LEDs are then placed in the holes, and another conductive sheet is laminated over the double sided adhesive sheet. The top transparent substrate is then laminated over the conductive sheet. The LEDs are electrically bonded to the two conductive layers by a high pressure roller at the end of the lamination process so the LEDs are connected in parallel.

Problems with the above-described prior art include: 1) little or no consideration for removing heat from the LEDs; 2) excessive downward pressure on the LEDs during lamination; 3) total internal reflections (TIR) caused by differences in indices of refraction; 4) difficulty in providing phosphor over/around the LEDs to create white light; 5) no consideration for enabling the light sheet to be optically functional and aesthetically pleasing if one or more LEDs fail (e.g., shorts out); 6) unattractive non-uniformity of light and color over the light sheet area; 7) difficulty of manufacture; 8) unreliability of LED electrode bonding; 9) excessively high lamination pressures needed to create wide light sheets; 10) inefficiency due to light absorption; 11) difficulty in creating series strings of LEDs; 12) impractical electrical drive requirements for the LEDs; and 13) inability of the light sheet to emit light in other than a Lambertian pattern. There are other drawbacks with the above-described light sheets.

What is needed is a cost-effective light sheet that can substitute for a standard fluorescent lamp fixture or that can be used for other lighting applications.

SUMMARY

Light sheets and techniques for fabricating the light sheets are described that overcome drawbacks with the prior art.

In one embodiment, a flexible circuit is formed as a strip, such as 3-4 inches by 4 feet, or in a single large sheet, such as a 2×4 foot sheet. On the bottom of the sheet is formed a conductor pattern using plated copper traces leading to connectors for one or more power supplies. At certain areas of the flex circuit, where bare LED chips are to be mounted, metal vias extend through the flex circuit to form an electrode pattern on the top surface of the flex circuit. In one embodiment, the pattern is a pseudo-random pattern, so if any LED fails (typically shorts) or any electrode bond fails, the dark LED will not be noticeable. In another embodiment, the pattern is an ordered pattern. If the light sheet spreads the LED light laterally, a dark LED may not be noticeable due to the light mixing in the light sheet. The metal vias provide heat sinks for the LEDs, since the rising heat from the LEDs will be removed by the air above the light sheet when the light sheet is mounted in a ceiling. The metal vias can be any size or thickness, depending on the heat needed to be extracted.

In another embodiment, the sheet comprises a highly reflective layer, such as an aluminum layer, having a dielectric coating on both surfaces. The reflective sheet is patterned to have conductors and electrodes formed on it. The aluminum layer also serves to spread the LED heat laterally. The dielectric coatings may have a relatively high thermal conductivity, and since the sheet is very thin (e.g., 1-4 mils, or less than 100 microns), there is good vertical thermal conduction. Such reflective films will reflect the LED light towards the light output surface of the light sheet.

Bare LED chips (also referred to as dice) are provided, having top and bottom electrodes. The bottom electrodes are bonded to the metal vias extending through the top of the flex circuit. A conductive adhesive may be used, or the LEDs may be bonded by ultrasonic bonding, solder reflow, or other bonding technique. In one embodiment, low power (e.g., 60-70 milliwatts) blue or ultraviolet LEDs are used. Using low power LEDs is advantageous because: 1) hundreds of LEDs may be used in the light sheet to spread the light; 2) low power LEDs are far less expensive than high power LEDs; 3) there will be little heat generated by each LED; 4) a failure of a few LEDs will not be noticeable; 5) the localized LED light and slightly varying colors will blend into a substantially homogenous light source a few feet from the light sheet without complex optics; 6) the blue light can be converted to white light using conventional phosphors; 7) higher voltages can be used to power many series-connected LEDs in long strips to reduce power loss through the conductors; and other reasons.

Over the top of the flex circuit is affixed a thin transparent sheet (an intermediate sheet), such as a PMMA sheet or other suitable material, that has holes formed around each LED. The intermediate sheet is formed with reflectors such as prisms on its bottom surface or with reflectors within the sheet, such as birefringent structures, to reflect light upward. The thickness of the intermediate sheet limits any downward pressure on the LEDs during the lamination process. The top electrodes of the LEDs may protrude slightly through the holes in the intermediate sheet or may be substantially flush. The intermediate sheet may be secured to the flex circuit with a thin layer of silicone or other adhesive or bonding technique.

The intermediate sheet may also be provided with a thin reflective layer, such as aluminum, on its bottom surface for reflecting light. Since the flex circuit conductors are on the bottom of the flex circuit, and the metal vias are only in the holes of the intermediate sheet, there is no shorting of the conductors by the metal reflective surface of the intermediate sheet.

In one embodiment, the LEDs have a thickness between about 85-250 microns, and the intermediate sheet surrounding the LEDs is about the same thickness as the LEDs.

In another embodiment, the intermediate sheet is a dielectric sheet having cups molded into it at the positions of the LEDs. The cups have a hole in the bottom for the LEDs to pass through. The surface of the sheet is coated with a reflective layer, such as aluminum, which is coated with a clear dielectric layer. The reflective cups are formed to create any light emission pattern from a single LED. In such an embodiment, the LED light will not mix within the intermediate sheet but will be directly reflected out.

The space between the LEDs and the hole (or cup) walls in the intermediate sheet are then filled with a mixture of silicone and phosphor to create white light. The silicone encapsulates the LEDs and removes any air gaps. The silicone is a high index of refraction silicone so that there will be good optical coupling from the GaN LED (a high index material), to the silicone/phosphor, and to the intermediate sheet. The area around each LED in the light sheet will be the same, even though the alignment is not perfect. The LEDs may be on the order of $0.10\ mm^2$-$1\ mm^2$, and the intermediate sheet holes may have diameters around 3 mm or more, depending on the required amount of phosphor needed. Even if an LED is not centered with respect to the hole, the increased blue light from one side will be offset by the increased red-green light components (or yellow light component) from the other side. The light from each LED and from nearby LEDs will mix in the intermediate sheet and further mix after exiting the light sheet to form substantially homogenous white light.

In one embodiment, the LEDs have a top surface area on the order of 100×100 microns to 300-300 microns, and a thickness of 85-250 microns. Therefore, there is a significant side emission component.

A transparent flex circuit is then laminated over the intermediate sheet, where the top flex circuit has a conductor and electrode pattern. The electrodes may have a conductive adhesive for bonding to the top electrodes of the LEDs. A silicone layer may be provided on the flex circuit or on the intermediate sheet for affixing the sheets together. The transparent flex circuit is then laminated under heat and pressure to create good electrical contact between the LED electrodes and the top circuitry. The intermediate sheet prevents the downward pressure during lamination from excessively pressing down on the LEDs. The intermediate sheet also ensures the light sheet will have a uniform thickness so as to avoid optical distortions.

To avoid a bright blue spot over each LED, when viewed up close, the top flex circuit electrode may be a relatively large diffusing reflector (e.g., silver) that reflects the blue light into the surrounding phosphor. Such a large reflector also reduces the alignment tolerance for the sheets.

Even if a reflector over each LED is not used, and since the LEDs are small and not very bright individually, the blue light from the top surface of the LEDs may be directly output and mixed with the red/green or yellow light generated by the phosphor surrounding the LED to create white light a short distance from the light sheet.

Alternatively, phosphor may be formed as a dot on the top surface of the top flex circuit above each LED. This would avoid a blue spot over each LED. The phosphor/silicone in the holes, encapsulating the LEDs, would then be used just for converting the side light from the LEDs. If light from the top surface of each LED is to exit the top flex circuit for conversion by the remote phosphor, the flex circuit electrode may be transparent, such as a layer of ITO. In an alternative embodiment, there is no phosphor deposited in the holes in the intermediate sheet, and all conversion is done by a remote phosphor layer on the top surface of the top flex circuit.

In one embodiment, the LED chips are flip chips, and all electrodes and conductors are formed on the bottom substrate. This simplifies the series connections of the LEDs and improves electrode bond reliability.

For easing the formation of series connections with LED chips having top and bottom electrodes, the LED chips may be alternately mounted upside down on the bottom substrate so that the cathode of an LED chip can be connected in series to the anode of an adjacent LED chip using the conductor pattern on the bottom substrate. The top substrate also has a conductor pattern for connecting the LEDs in series. Combinations of series and parallel groups can be created to optimize the power supply requirements.

In another embodiment, the intermediate sheet has electrodes formed on opposing walls of its square holes. The LED chips, with top and bottom electrodes, are then inserted vertically in the holes so that the LED electrodes contact the opposing electrodes formed on the walls of the holes. The electrodes formed in the holes extend to a top surface, a bottom surface, or both surfaces of the intermediate sheet for being interconnected by a conductor pattern on the top substrate or bottom substrate. In an alternate embodiment, the conductor pattern for any series connection or series/parallel connection is formed directly on a surface or both surfaces of the intermediate sheet.

In another embodiment, there is no intermediate sheet and conductors are patterned on top and bottom substrates. One or both of the substrates has a cavity or groove to accommodate the thickness of the LEDs. The vertical LEDs are then sandwiched between the two substrates. If the LEDs are thin enough, no cavities are needed to accommodate the thickness of the LEDs since the assembly process can simply rely upon the plastic deformation of materials to encase the LEDs. The conductor patterns on the opposing substrates are such that the sandwiching connects the conductors to couple adjacent LEDs in series. The substrates may be formed as flat strips or sheets, or rounded, or a combination of flat and rounded. In one embodiment, the sandwiched structure forms a flexible cylinder or half cylinder that contains a single string of series connected LEDs. The flexible strings may be connected in series with other strings or connected in parallel with other strings, depending on the desired power supply.

If the light sheet is formed in strips, each strip may use its own power supply and be modular. By fabricating the light sheet in strips, there is less lamination pressure needed, and the lamination pressure will be more uniform across the width of the strip. The strips can be arranged next to each other to create any size light sheet, such as a 2×4 foot light sheet or even a 6 inch by 4 foot or longer light sheet to substitute for light sources within a standard fluorescent fixture in an office environment. It is common for fluorescent fixtures within a given ceiling cut-out to contain two, three, four or more linear fluorescent lamps. Each light sheet strip may substitute for a single fluorescent lamps and have a similar length. This embodiment of the light sheet can generate the roughly 3000 lumens needed to replace the typical fluorescent lamp and, by inserting the required number of strips in a variety of spatial configurations, it is possible to manufacture the lighting fixture with the same flexibility of lumen output to suit the lighting application. The particular design of the light sheet enables the light sheet to be a modular cost-effective solution.

Alternatively, it is known that standard ceiling grid configurations for fluorescent fixtures come in discrete sizes such as 6 inches×4 feet, 1×4 feet, 2×4 feet and 2×2 feet. It is possible to consider the use of narrow 2 foot strips of 1500 lumens each as a standard modular size that could potentially be used as building blocks within each of these configurations. Thus, the manufacturer of the final fixture could stock a single size component by which they could conceivably create any type of lamp configuration and geometry as seen in the majority of applications.

Various light strips in a fixture may be tilted at different angles to direct a peak intensity of the light from an associated light strip at any angle. This greatly expands the ability of a composite fixture to shape and modulate the distribution of light in the far-field away from the light fixture itself.

Alternatively, a single 2×4 foot light sheet (or sheet of any size) may be employed that is, in itself, the fixture without any enclosure.

For the case where the lighting fixture offers significant surface area, such as in a 2×4 foot fluorescent light fixture, there is significant room to blend many smaller LED sources such that their local thermal conditions are better managed than in a retrofit bulb or spot light type light source where the heat becomes highly localized and thus harder to manage.

The light sheets are easily controlled to be automatically dimmed when there is ambient sunlight so that the overall energy consumption is greatly reduced. Since individual light sheets may have combinations of series and parallel strings, it is also possible to create sub-light sheet local dimming. Other energy saving techniques are also discussed herein.

The LEDs used in the light sheet may be conventional LEDs or may be any type of semiconductor light emitting device such as laser diodes, super-luminescent light emitting diodes, etc. Work is being done on developing solid state devices where the chips are not diodes, and the present invention includes such devices as well.

The flexible light sheets may be arranged flat in a support frame, or the light sheets may be bent in an arc for more directed light. Various shapes of the light sheets may be used for different applications. The top flex circuit sheet or the intermediate sheet may have optical features molded into it for collimating the light, spreading the light, mixing the light, or providing any other optical function.

For some applications, such as for using the light sheet in a reflective troffer or hanging from the ceiling, the light sheet is made bidirectional.

In one embodiment of a bidirectional light sheet, the upward emission is UV to disinfect the air, such as from a vent or entering an air return duct. The bottom emission will typically be substantially white light.

In another embodiment, the LEDs are mounted on a snap-in substrate that snaps into a groove or cavity formed in the top substrate. Electrical connections are automatically made by the snap-in fit.

The light strips may be located in a standard fluorescent tube form factor for supporting and powering the LEDs using a standard fluorescent lamp fixture. In one embodiment, the tube form factor has a flat top on which the light strip is mounted. The flat top is directly contacted by ambient air to cool the light strip, or there may be an intermediate layer between the flat top and the air. The variable emission patterns of various light strips in the tube enable the tube to have any emission pattern.

Various techniques of removing heat from the LEDs are also described.

Novel methods of encapsulating the LED dies are also disclosed. In one embodiment, holes are formed in the top substrate aligned with the space around each LED die. After the top substrate is affixed over the LED dies, an encapsulant is injected into the space via the holes in the top substrate. Some holes allow air to escape from the space as the space is filled by the encapsulant.

In another method, the bottom electrodes (e.g., anodes) of vertical LEDs are bonded to metal pads on a flexible circuit. A top substrate layer is then laminated on, sprayed on, or deposited in other ways. The top substrate is not required to have metal traces preformed on it. A laser or other material milling procedure is automatically controlled to drill narrow holes in the top substrate to expose the top contacts of the vertical LEDs and expose conductors leading to the bottom electrodes of the LEDs. A metal or other conductor is then deposited in the holes and over the top substrate, such as by printing, sputtering, plating, etc., to form the series connections between LEDs. Thus, the interconnection is performed by an external conductor in combination with the conductors on the bottom flexible circuit.

Instead of a laser, photoresist posts may be formed over the areas to be contacted by the external conductor. The top substrate is then formed, and the posts are stripped away. A metal is then deposited in the openings and formed to interconnect the LEDs. In one embodiment, where the top substrate overlies the posts, a chemical, mechanical polishing (CMP) step may be performed to expose the posts such that they can be stripped away in another process.

In another embodiment, metal studs are affixed to the LED electrodes and other conductors prior to the top substrate being deposited. The top substrate is then polished down to the studs, and the studs are electrically interconnected by a metal pattern formed on the surface of the top substrate.

In another embodiment, CMP is used to thin a patterned dielectric layer that has metal formed in trenches and holes. The metal that remains forms the external interconnections between LEDs.

Other variations are described herein.

BRIEF DESCRIPTION OF THE DRAWINGS

The below described drawings are presented to illustrate some possible examples of the invention.

FIG. 1 is a simplified perspective view of a portion of the light output side of a light sheet in accordance with one embodiment of the invention.

FIG. 2 is a simplified perspective view of a portion of the underside of a light sheet in accordance with one embodiment of the invention.

FIG. 3A illustrates the flexible bottom substrate having conductors and electrodes, where the electrodes are heat conducting vias through the substrate.

FIG. 3B illustrates a reflective bottom substrate having conductors and electrodes, where the reflector may be an aluminum layer.

FIG. 3C illustrates a reflective bottom substrate having conductors and electrodes, where the reflector is a dielectric and where the electrodes are heat conducting vias through the substrate.

FIG. 4 illustrates a conductive adhesive dispensed over the substrate electrodes.

FIG. 5 illustrates bare LED chips, emitting blue light, affixed to the substrate electrodes.

FIG. 6 is a perspective view of a transparent intermediate sheet having holes for the LEDs. The sheet may optionally have a reflective bottom surface.

FIG. 7 illustrates the intermediate sheet affixed over the bottom substrate.

FIGS. 20A and 20B are cross-sectional views of a light sheet or strip, where a channel or cavity is formed in the bottom substrate, and where a series connection is made by conductors on two opposing substrates.

FIG. 20C is a transparent top down view of the structure of FIG. 20B showing the overlapping of anode and cathode conductors.

FIG. 23B also shows the use of an external phosphor layer on the top substrate outer surface.

FIG. 28 also illustrates an optical sheet over the top substrate that creates any desired emission pattern.

This figure also shows that the shape of the top substrate may be domed or an extended dome structure over the bottom substrate.

Figure 37A:
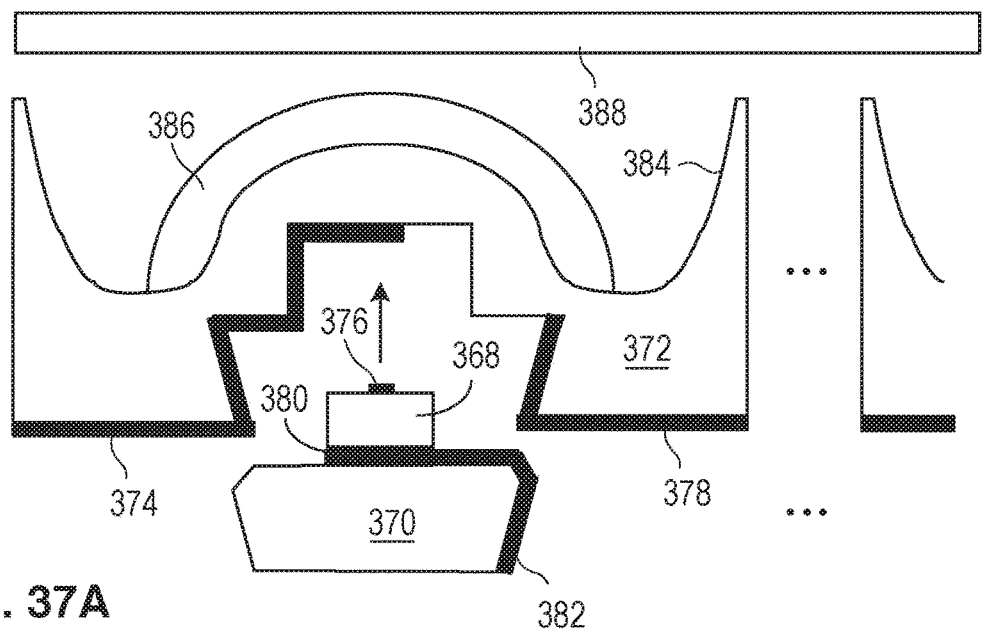
FIG. 37A is a cross-sectional view of a snap-in LED die substrate, which may be an LED strip or a single LED module.
Figure 40:
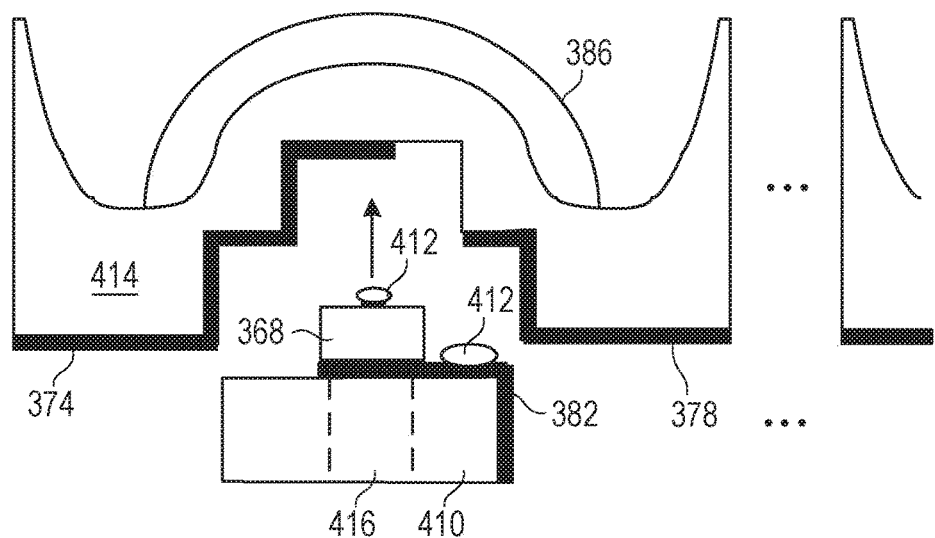

FIG. 40 is similar to FIG. 37A except that the LED die substrate is fixed in place by a conductive adhesive or solder reflow.

Figure 41:
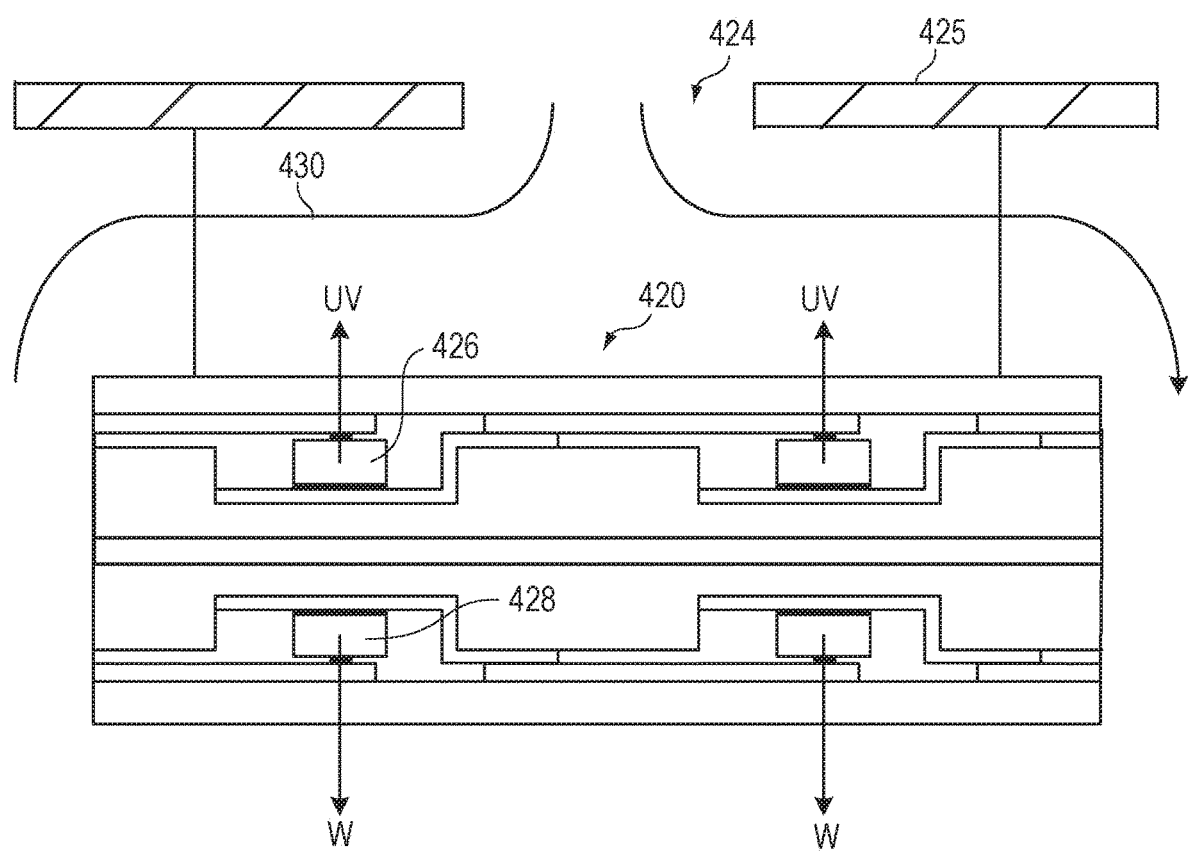

FIG. 41 illustrates a small portion of a bidirectional light sheet positioned in front of an air vent, where the top emission is UV for disinfecting air, and the bottom emission is substantially white light for illumination.

Figure 42:
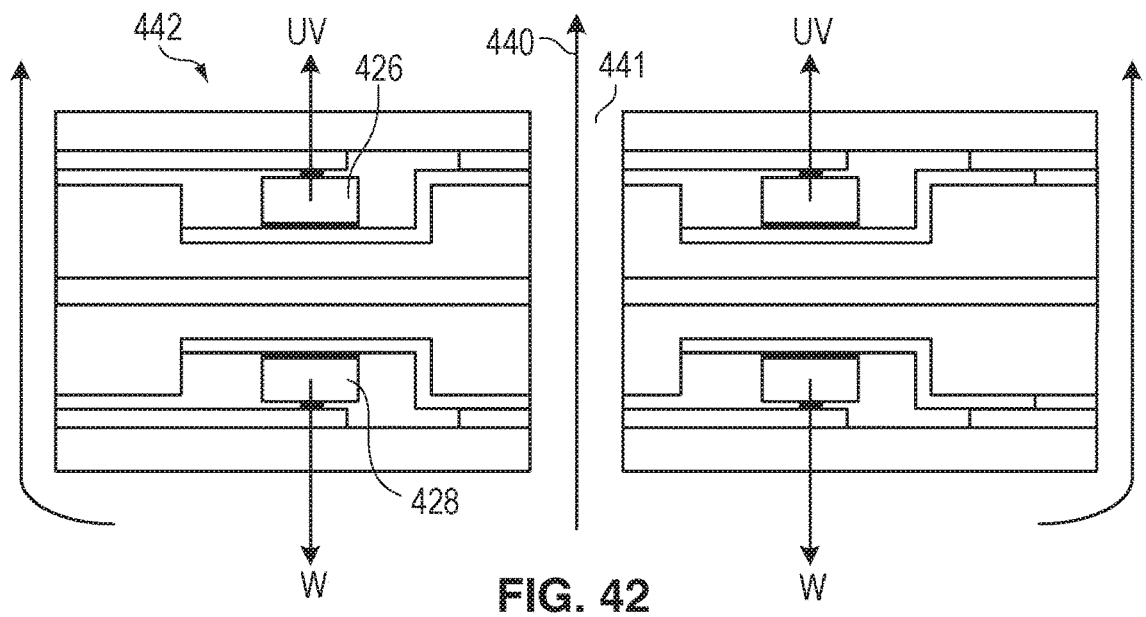

FIG. 42 is similar to FIG. 41 but the air is allowed to flow through the light sheet. The light sheet may be installed as a ceiling panel.

Figure 43:
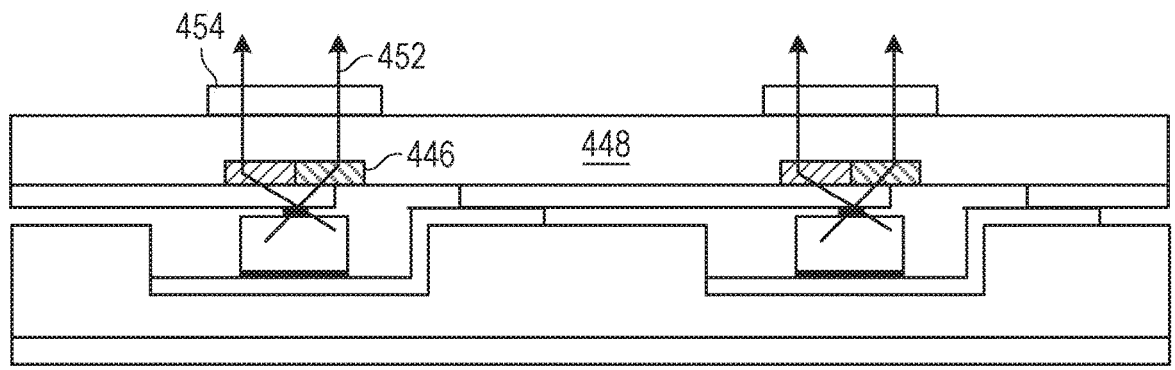

FIG. 43 illustrates how optics may be formed in the top substrate on the surface opposing the LEDs.

Figure 44:
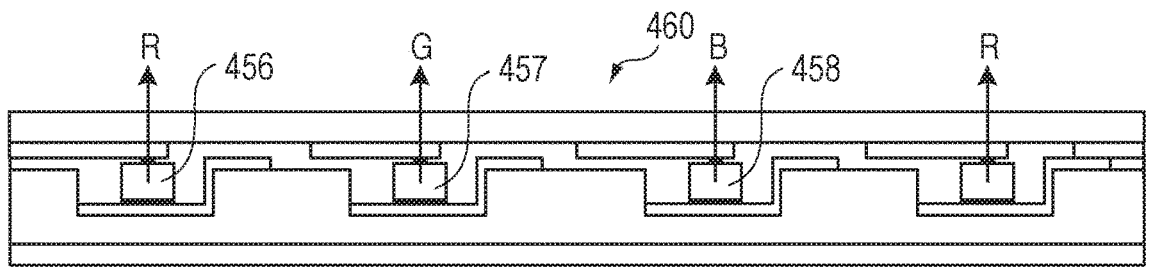

FIG. 44 illustrates that red, green, and blue LEDs, or red, green, blue and white LEDs or combinations thereof, may make up the light sheet and be controllable to achieve any white point.

Figure 45:
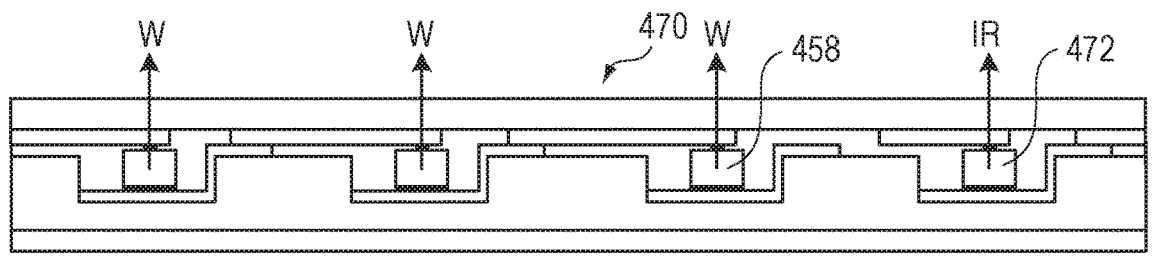

FIG. 45 illustrates that blue and infrared LEDs may make up the light sheet, where the blue LEDs are used for generating white light and the infrared LEDs are only energized while the blue LEDs are off, such as in response to a motion sensor, for providing low energy lighting for surveillance cameras.

Figure 46A:
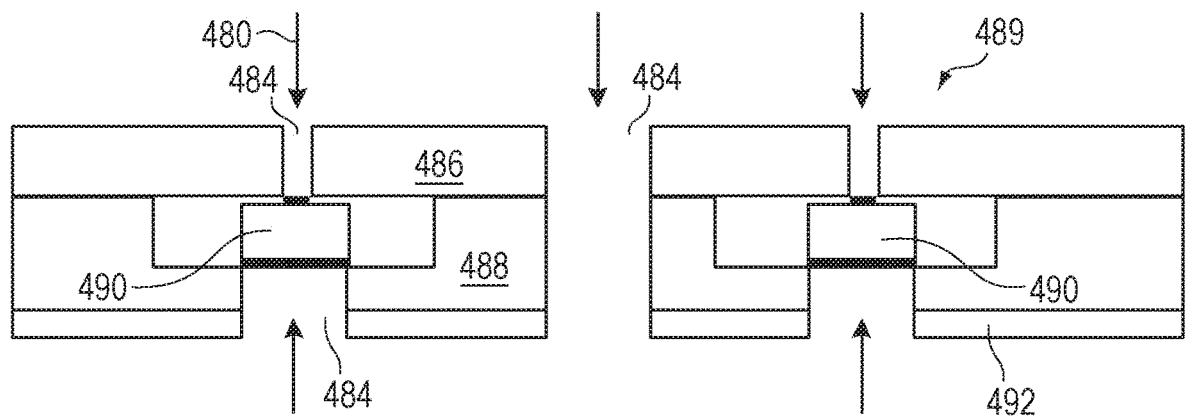

FIG. 46A illustrates a laser ablating openings in top and bottom substrates for exposing the electrodes of LEDs.

Figure 46B:
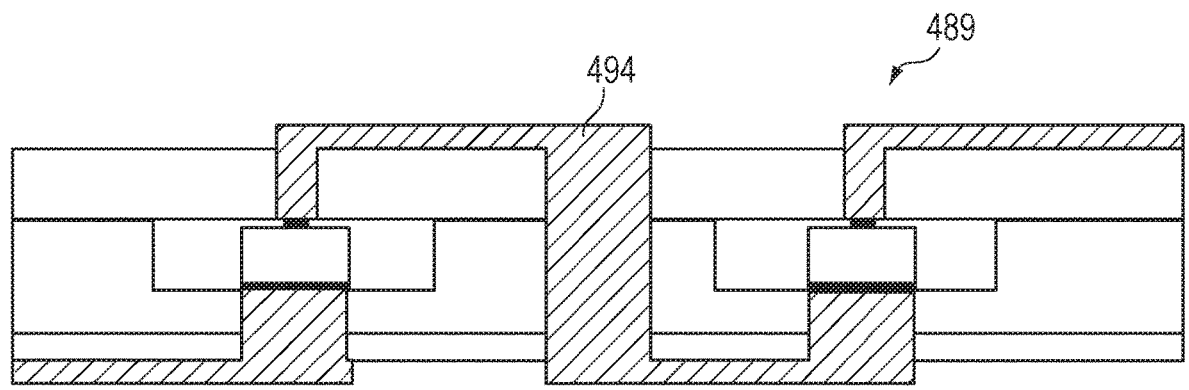

FIG. 46B illustrates the openings of FIG. 46A being filled with metal, or metal filled epoxy, or printing material that is cured to provide electrical contact to the LEDs and to provide heat sinking.

Figure 47A:
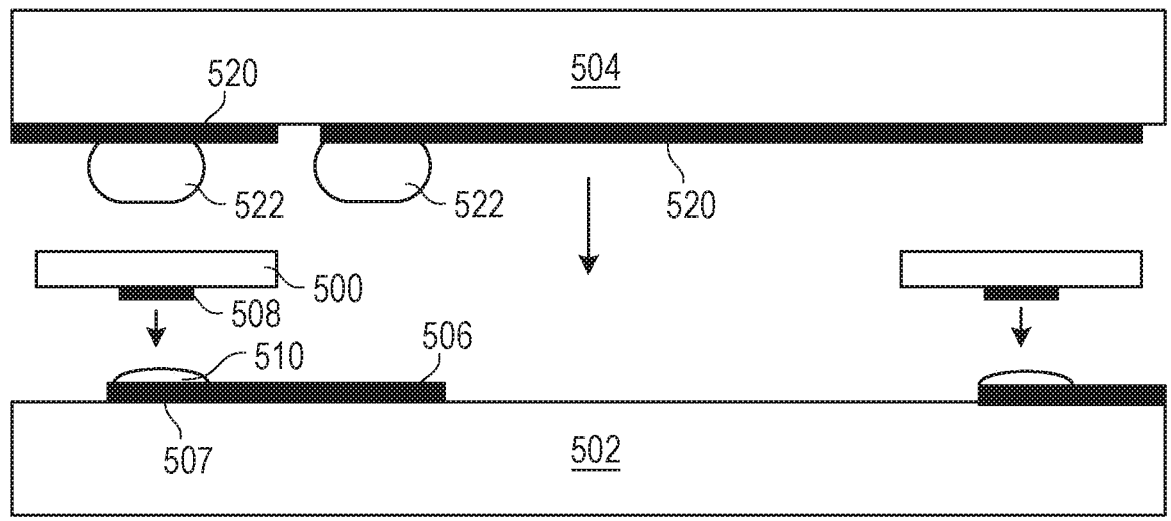

FIG. 47A illustrates LEDs being mounted with their small electrodes aligned to substrate electrodes to make use of the high positional accuracy of automatic pick and place machines.

Figure 47B:
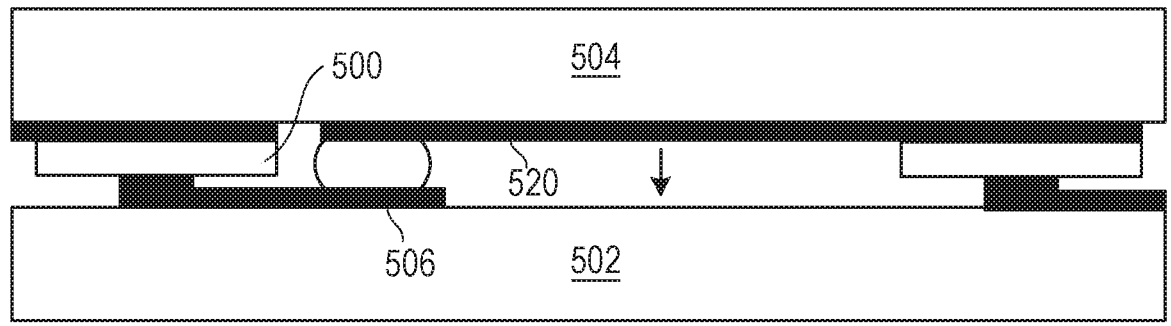

FIG. 47B illustrates the LEDs of FIG. 47A being sandwiched between two substrates without any cavity or intermediate layer due to the thinness of the LEDs. A series connection between LEDs is automatically made by the conductors formed on the substrates.

Figure 47C:
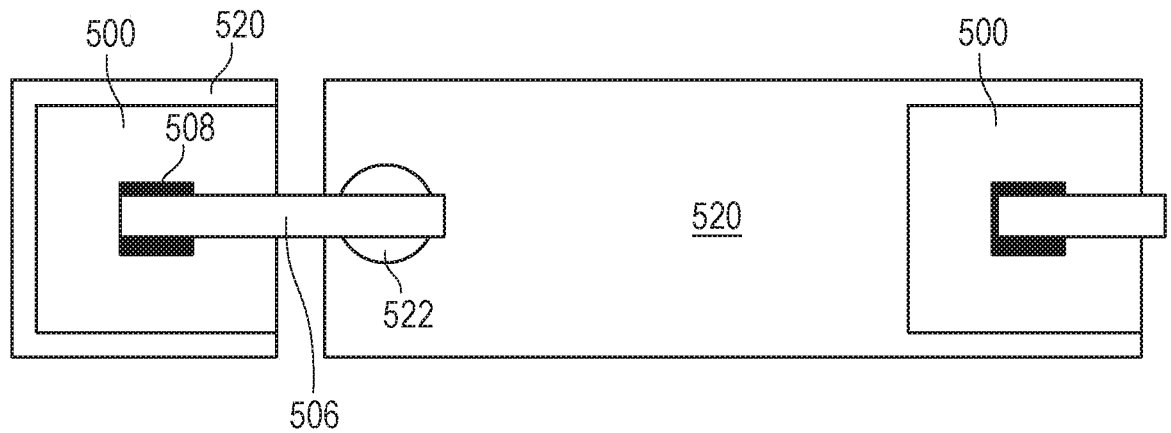

FIG. 47C is a bottom up view of FIG. 47B illustrating the series connections between LEDs.

Figure 48:
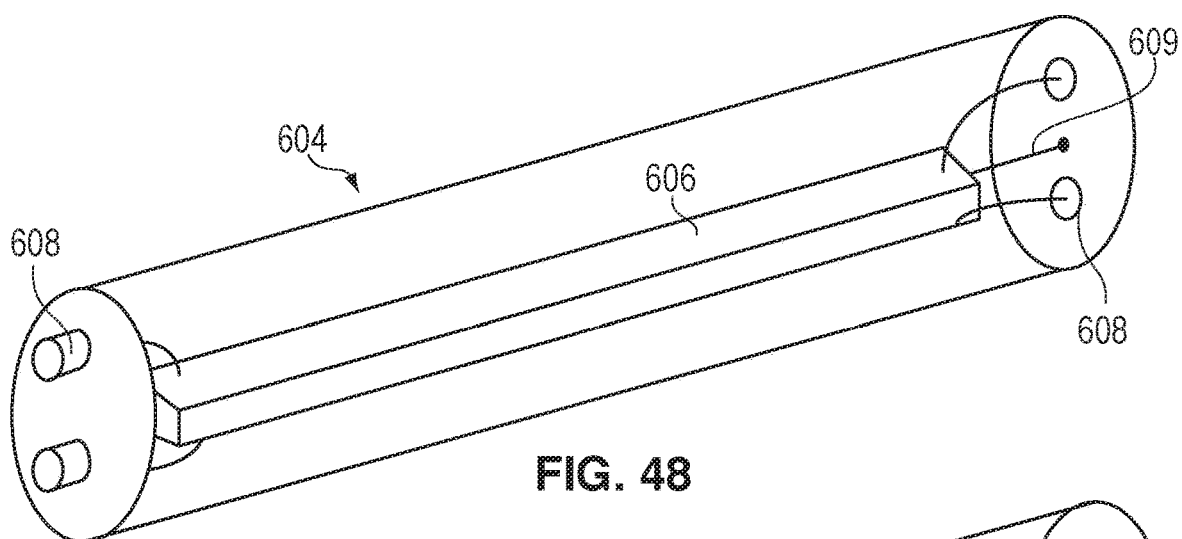

FIG. 48 is a perspective view of a lighting structure, illustrating how the LED strips of any embodiment may be positioned in a transparent or diffusing tube so as to be used in standard fluorescent lamp fixtures.

Figure 49:
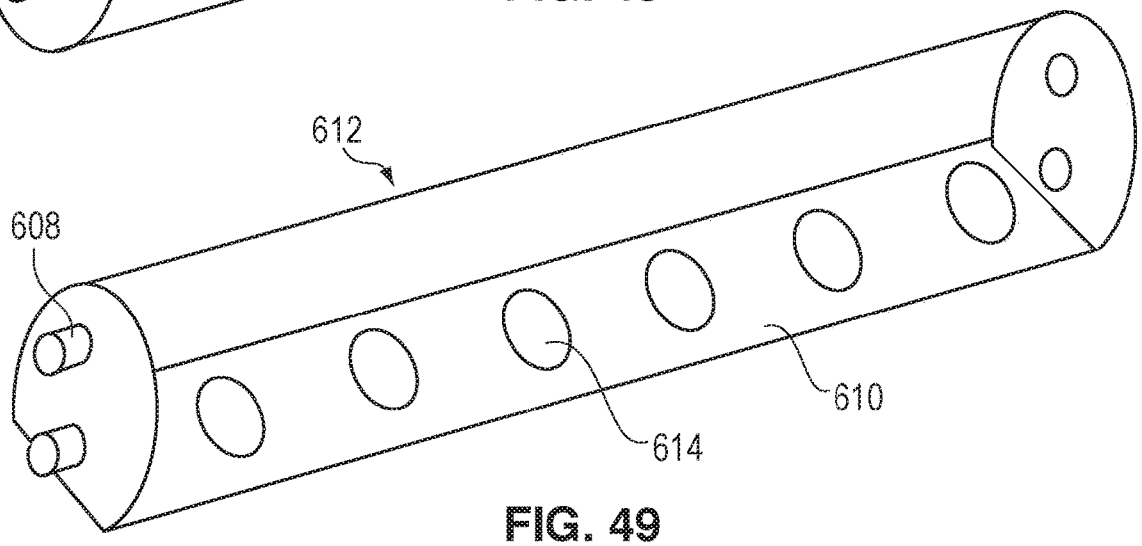

FIG. 49 illustrates how the tube form factor may be changed to have a flat surface, or any other non-cylindrical feature, for supporting the LED strip and improving heat transfer to the ambient air.

Figure 50:
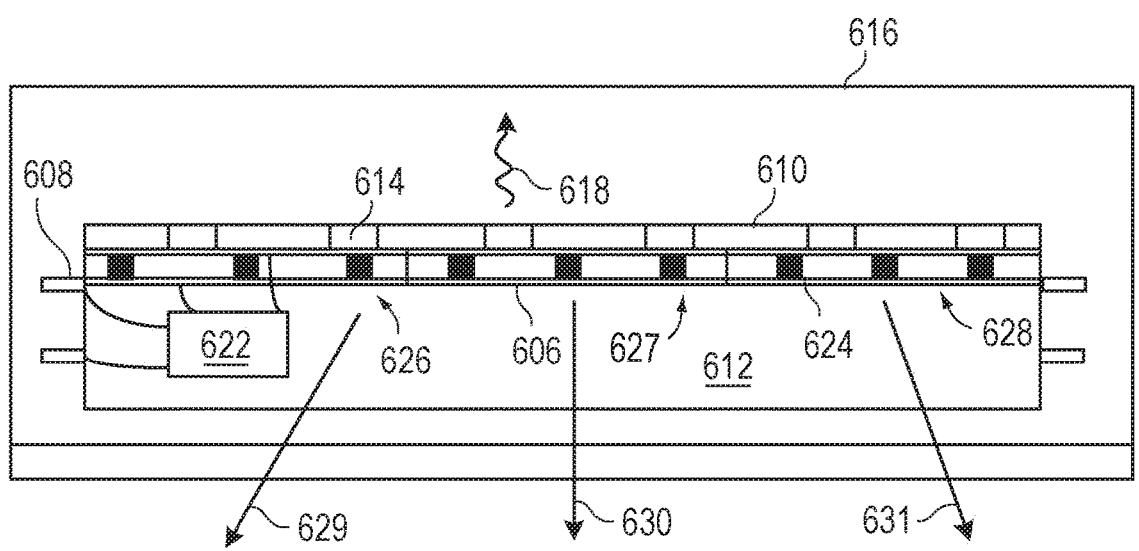

FIG. 50 is a cross-sectional view of a fixture incorporating the light structure of FIG. 41, with a light strip being supported by the top flat surface of the tube and heat escaping through holes in the flat surface and holes in the LED strip.

Figure 51:
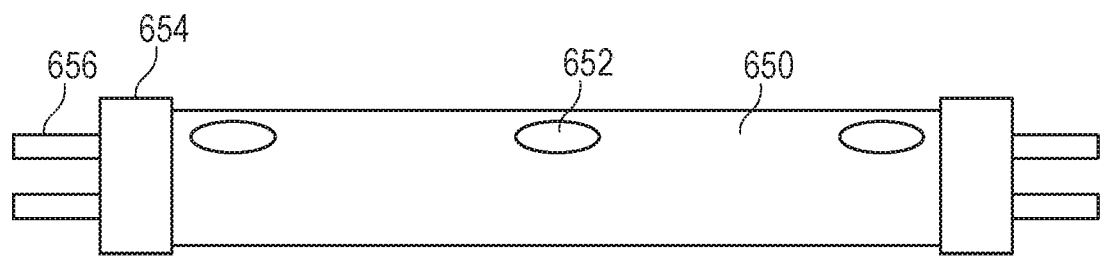

FIG. 51 is a side view of an embodiment where the tube shape is formed by the flexible light sheet itself.

Figure 52:
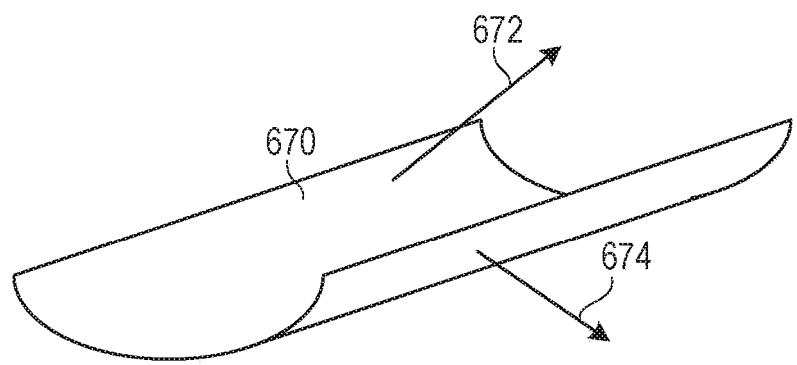

FIG. 52 is a perspective view illustrating that a bidirectional light sheet may be bent to have a rounded shape to form a partial tube or a much larger luminaire.

Figure 53:
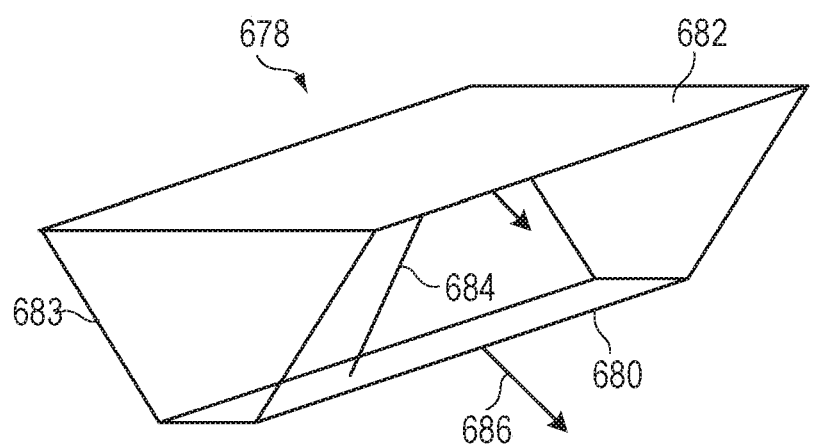

FIG. 53 is a perspective view illustrating a light sheet having a top emission directed toward a top panel, where the top panel may be diffusively reflective or have a phosphor coating.

Figure 54A:
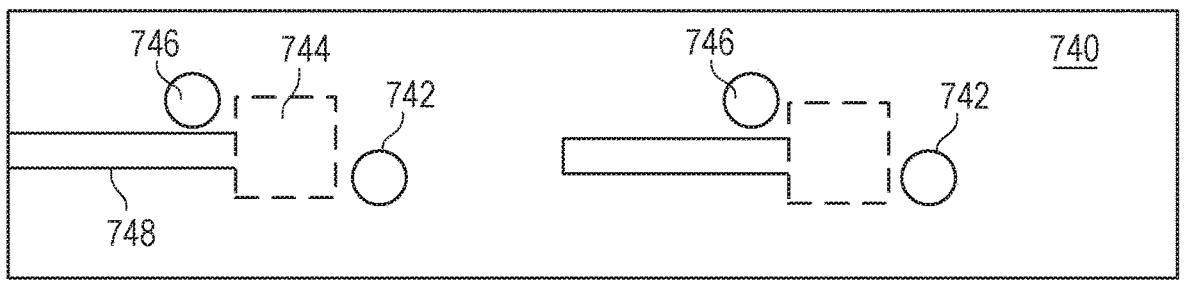

FIG. 54A is a top down view of a top substrate with holes for filling spaces around the LED dies with an encapsulant and holes for allow air to escape the spaces.

Figure 54B:
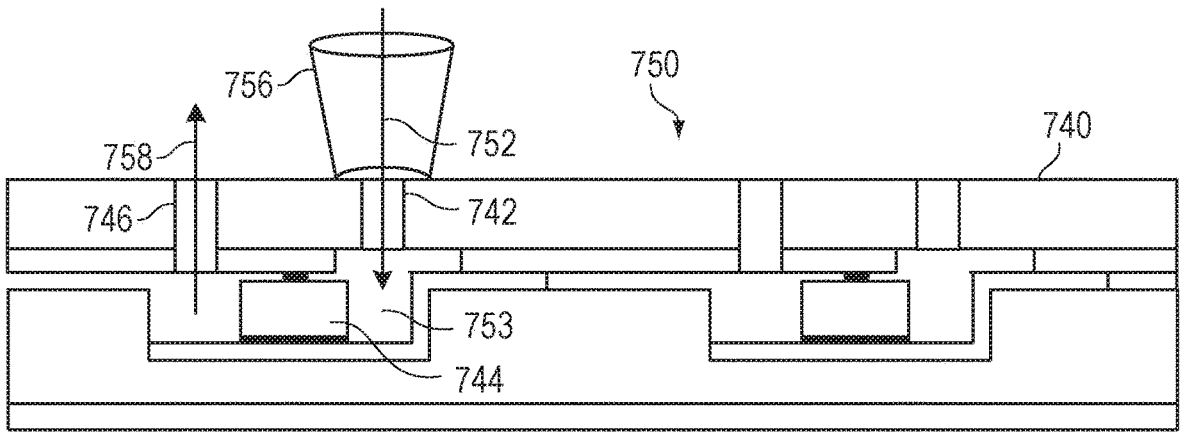

FIG. 54B is a cross-sectional view of a light sheet showing a liquid encapsulant being injected into the space around each LED die through the holes in the top substrate.

Figure 55A:
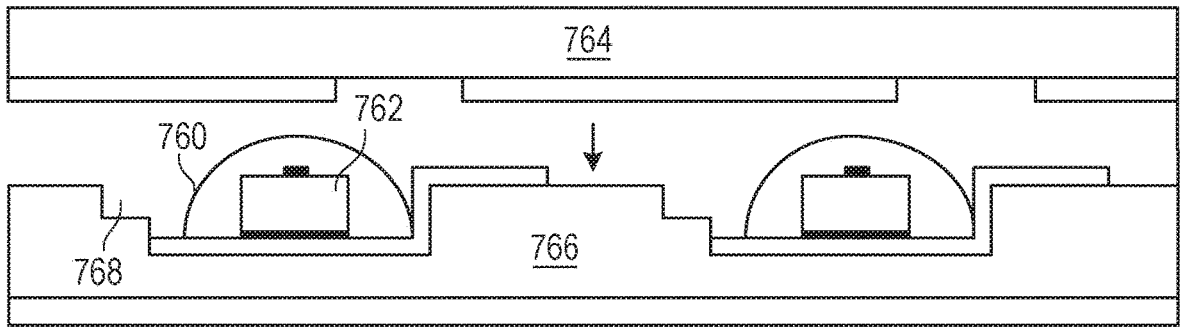

FIG. 55A is a cross-sectional view showing a blob of softened encapsulant material deposited over the LED dies.

Figure 55B:
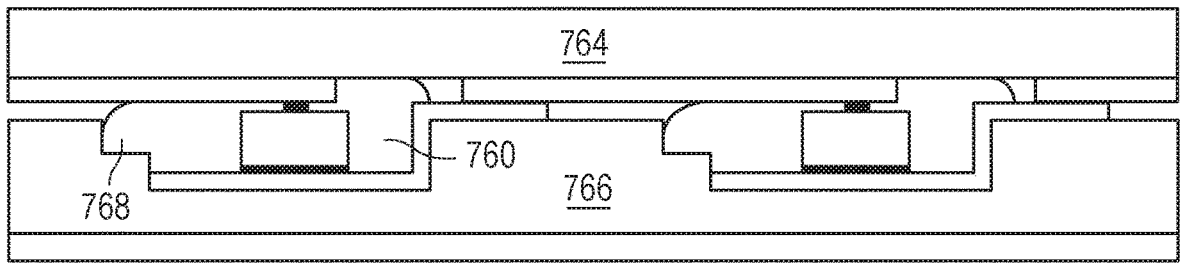

FIG. 55B illustrates the softened encapsulant material being pressed and spread out within the space around the LED dies, with any excess material overflowing into a reservoir.

Figure 56A:
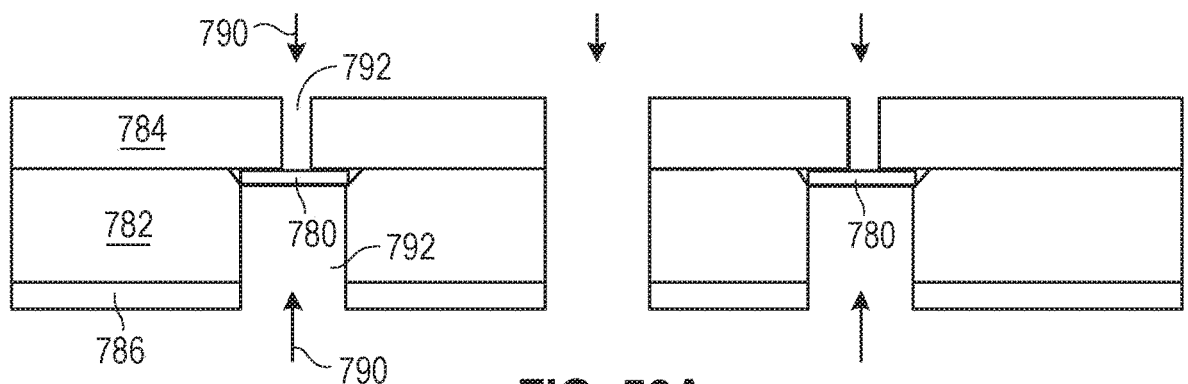

FIG. 56A illustrates thin LEDs being sandwiched between two substrates, with no pre-formed cavity or intermediate layer to accommodate the thickness of the LED, wherein openings in the substrates are made by a laser to expose the electrodes of the LEDs.

Figure 56B:
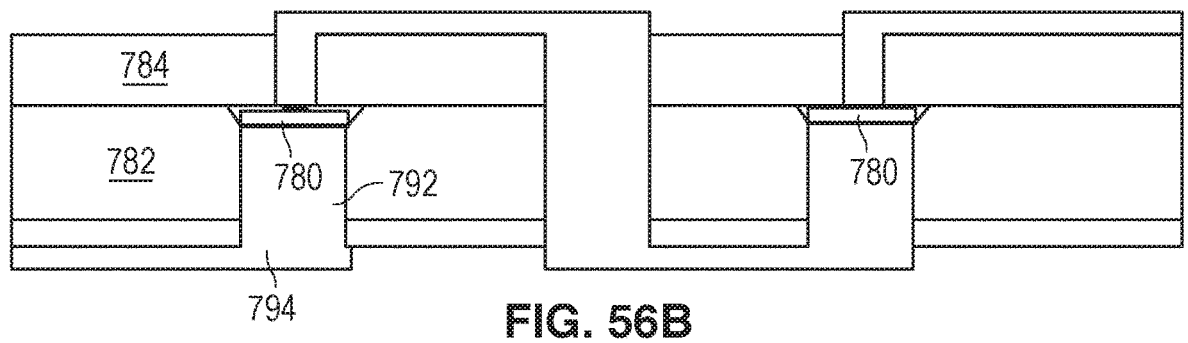

FIG. 56B illustrates the light sheet/strip of FIG. 56A where the openings are filled with a conductive material, and the conductive material is patterned to connect some or all of the LEDs in series or in any other configuration.

Figure 57:
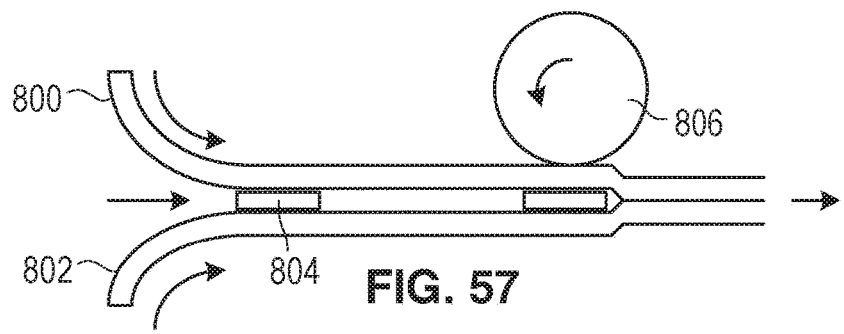

FIG. 57 illustrates a roll-to-roll process, where two substrates are laminated together with LEDs inserted in-between. Any conductor technique can be used to connect the LEDs in series or in any other configuration.

Figure 58A:
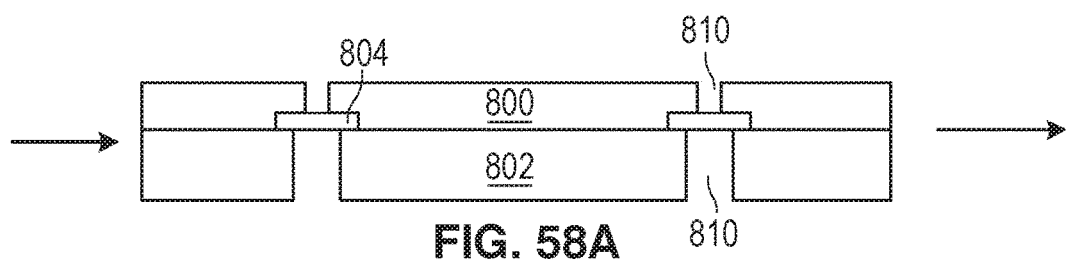

FIG. 58A illustrates a roll-to-roll process where a laser ablates openings in the top and bottom substrates for interconnecting the LEDs with a conductive material, similar to FIG. 56B.

Figure 58B:
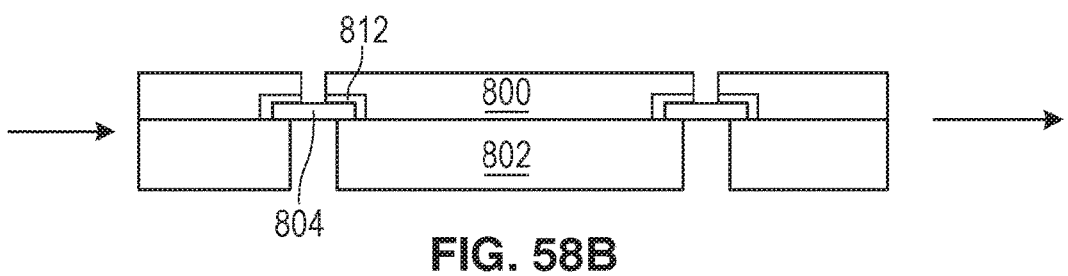

FIG. 58B illustrates a roll-to-roll process where a laser ablates openings in the top and bottom substrates, as well as through a phosphor layer on the LED, for interconnecting the LEDs with a conductive material, similar to FIG. 56B.

Figure 59:
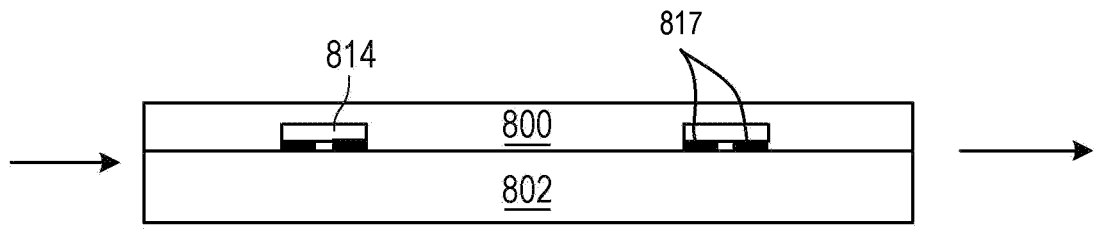

FIG. 59 illustrates a roll-to-roll process where the LEDs are flip-chips, and the bottom substrate has a conductor pattern that interconnects the LEDs.

Figure 60:
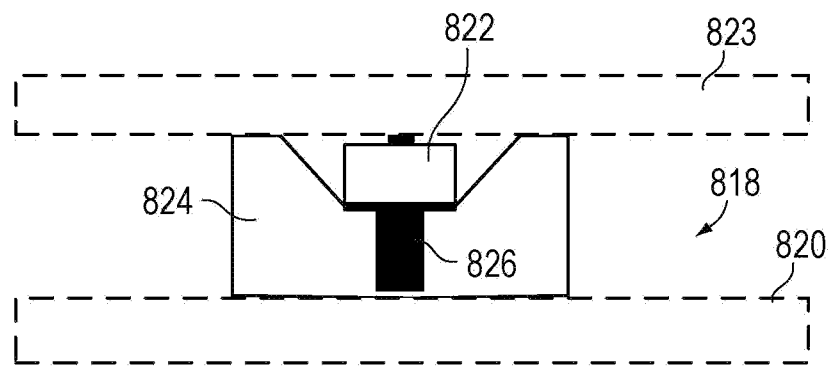

FIG. 60 is a cross-sectional view of a single light source element that is positioned by a pick-and place machine onto a bottom substrate, where the element is an LED mounted in a reflective cup to avoid issues with side emission.

Figure 61:
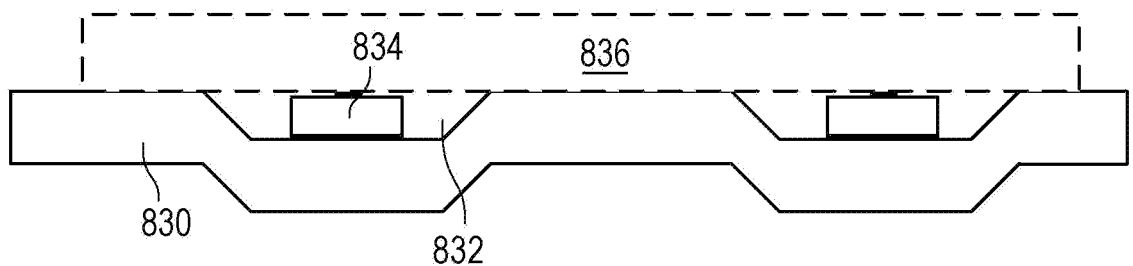

FIG. 61 is a cross-sectional view of a light sheet/strip, where the bottom substrate is a reflective sheet that is formed with indentations, where the sides of the indentations reflect side light upward.

Figure 62:
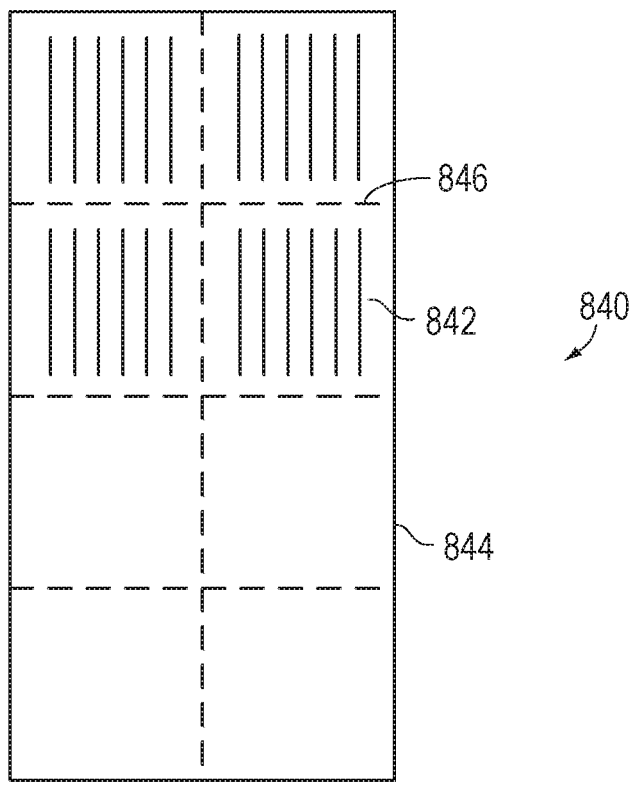

FIG. 62 is a front view of a 2×4 foot solid state fixture, where the light sources are LEDs encapsulated in strips, where the strips are tested for their color temperatures or spectral distributions, and where the strips used in each of the eight sections are selected so that each section outputs the same overall target color temperature or spectral distribution.

Figure 63:
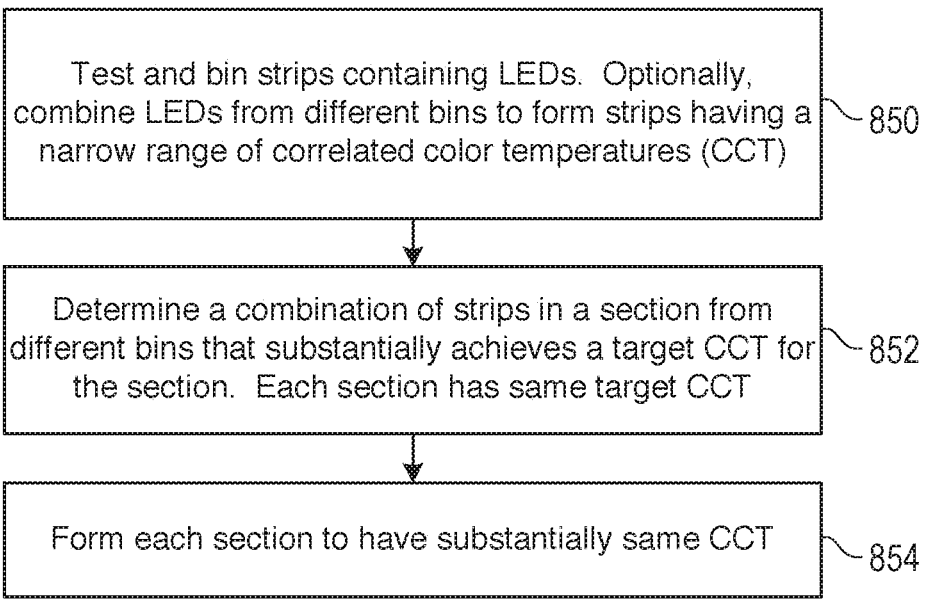

FIG. 63 is a flowchart of the process used to form the fixture of FIG. 62.

Figure 19A:
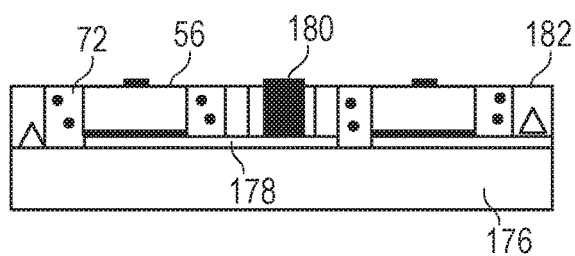
FIGS. 19A and 19B illustrate the LEDs being connected in series by a metal via bonded to a bottom electrode and extending through the intermediate layer.
Figure 64:
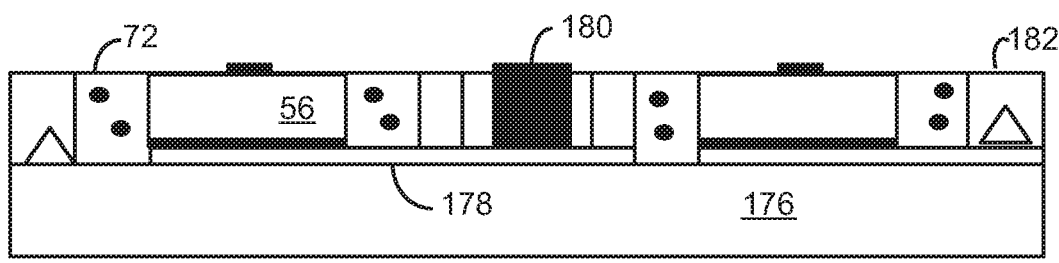

FIG. 64 is similar to FIG. 19A and illustrates a metal via (e.g., a slug or other conductor or circuit element) bonded to a bottom electrode and extending through the intermediate layer.

Figure 65:
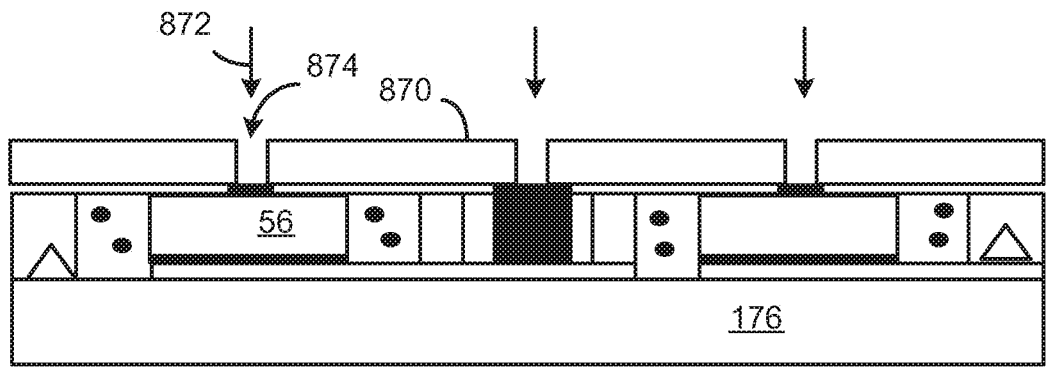

FIG. 65 illustrates a top substrate material deposited over the LEDs and laser drilled to form holes to expose metal areas to be contacted by an external metal pattern.

Figure 66:
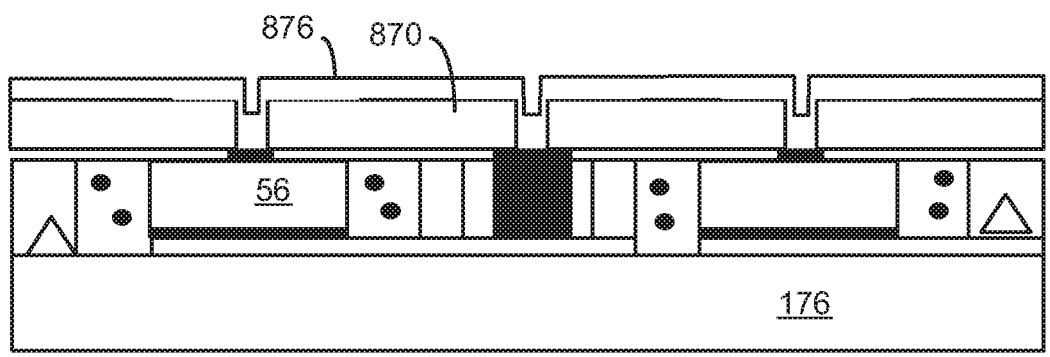

FIG. 66 illustrates a metal seed layer deposited over the surface of the structure.

Figure 67:
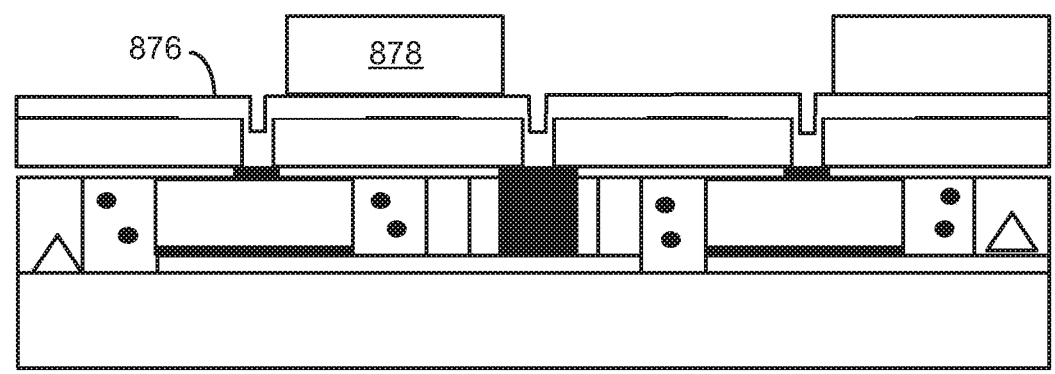

FIG. 67 illustrates the seed layer being selectively patterned with a photoresist.

Figure 68:
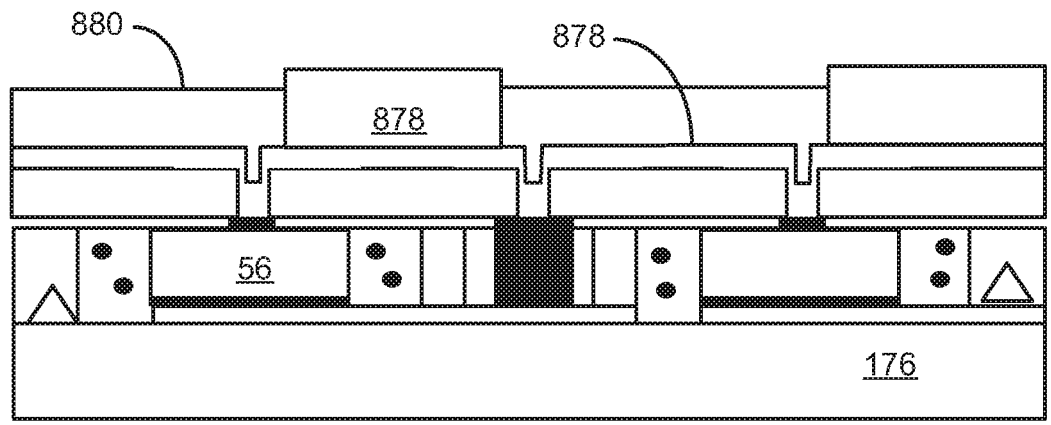

FIG. 68 illustrates the exposed seed layer being electro-plated with copper.

Figure 69:
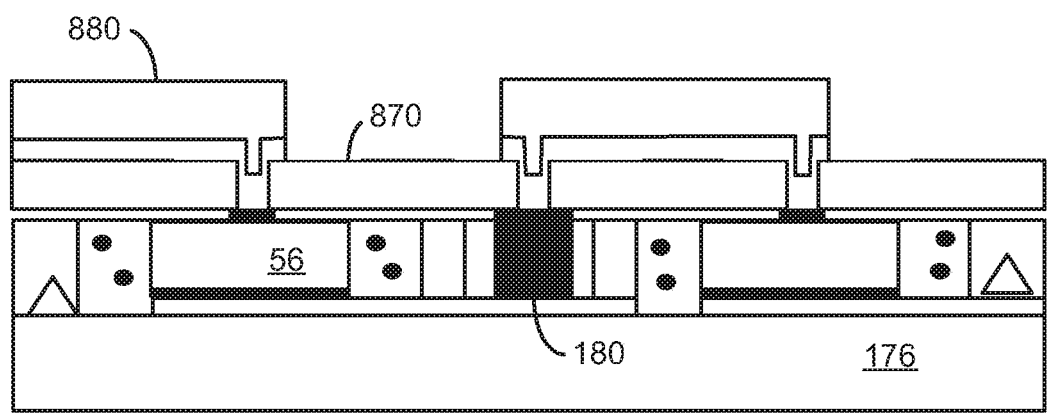

FIG. 69 illustrates the LED structure after the photoresist has been stripped and after the exposed seed layer has been etched away to interconnect the LEDs in series.

Figure 70:
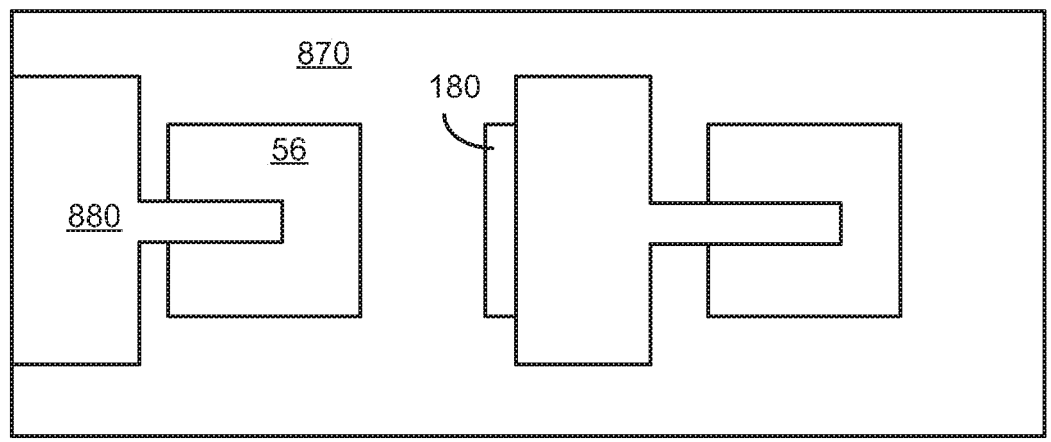

FIG. 70 is a top down view of two LEDs connected in series, where the interconnecting metal may be formed to have a wide area between LEDs to reduce resistance.

Figure 71:
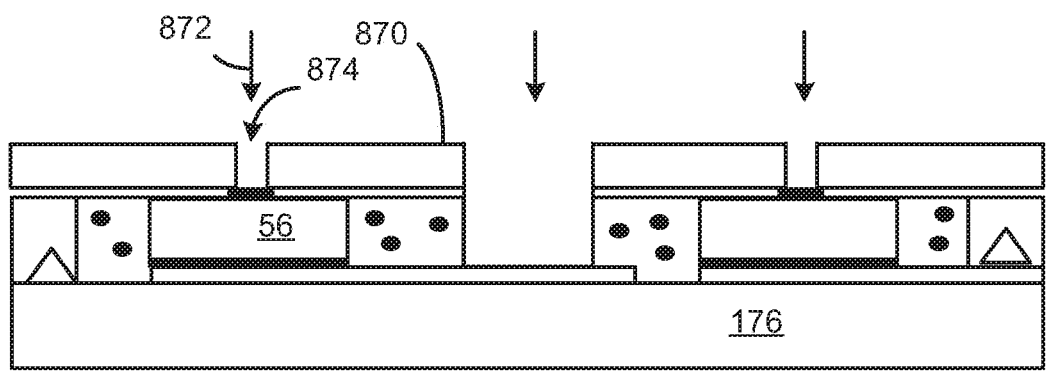

FIG. 71 illustrates a variation of FIGS. 64-70 where there is no interconnector 180 positioned a hole in the intermediate layer 182.

Figure 72:
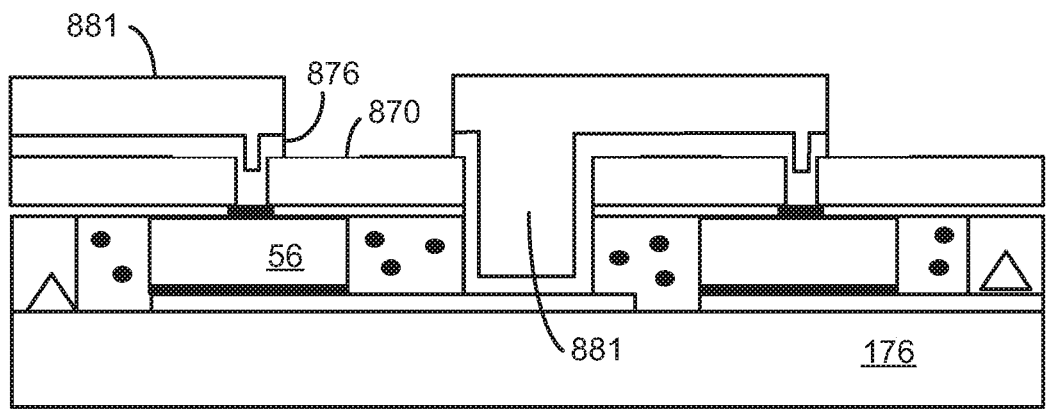

FIG. 72 illustrates the structure of FIG. 71 after the seed layer is electroplated with copper, which fills (or partially fills) the hole to create a series connection.

Figure 73:
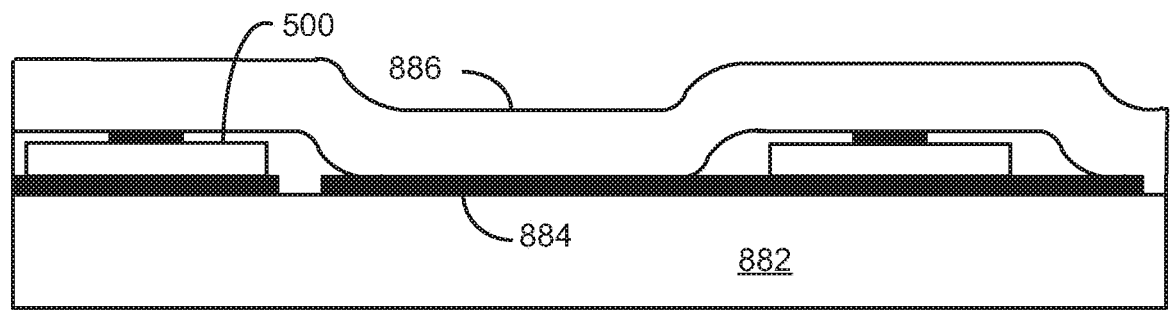

FIG. 73 illustrates thin LEDs similar to FIG. 47A where there is no intermediate layer used. A top substrate is deposited over the LEDs, where the substrate may be infused with a YAG phosphor or other wavelength conversion material.

Figure 74:
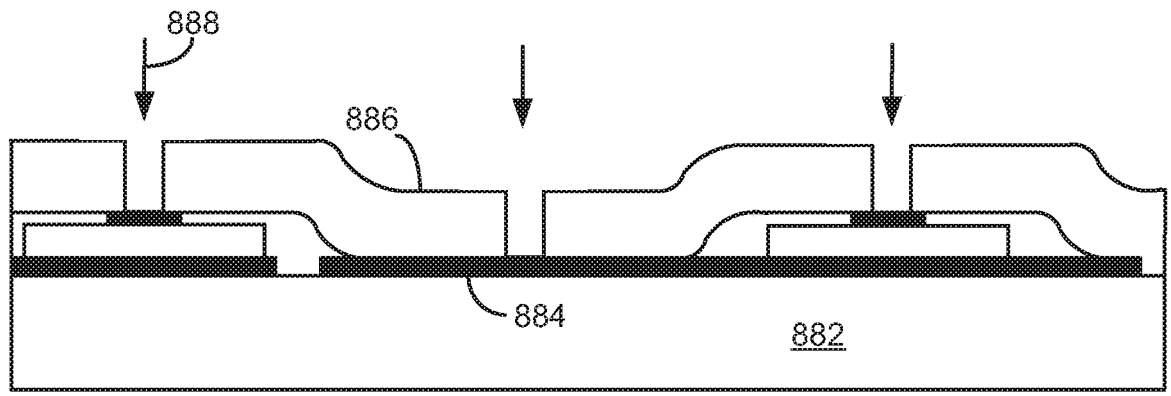

FIG. 74 illustrates the top substrate being laser drilled to form holes to expose metal areas to be contacted by an external conductor pattern.

Figure 75:
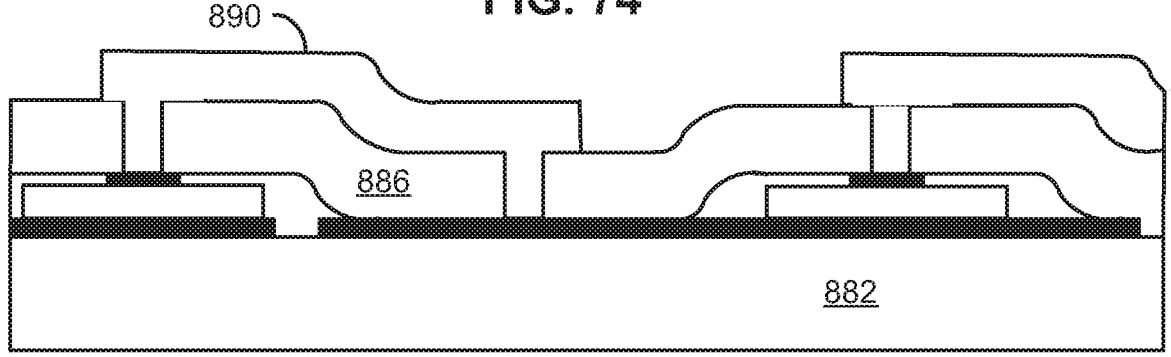

FIG. 75 illustrates a metal or other conductor (e.g., conductive ink) deposited over the top substrate and into the holes to interconnect the LEDs in series.

Figure 76:
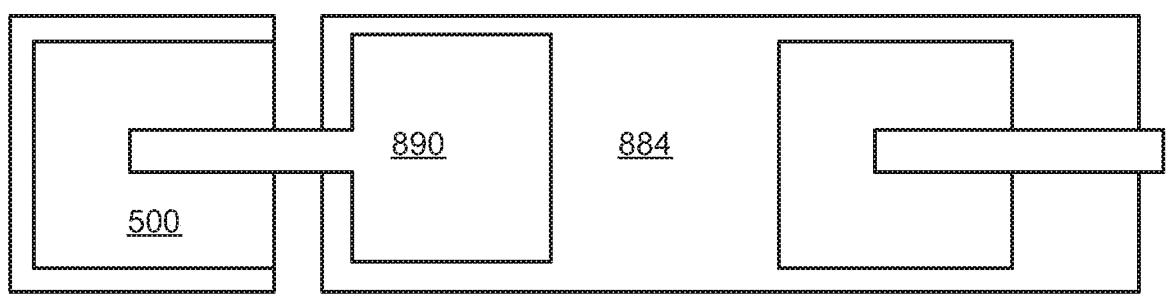

FIG. 76 is a top down view of two LEDs connected in series, where the interconnecting conductor may be formed to have a wide area between LEDs to reduce resistance.

Figure 77:
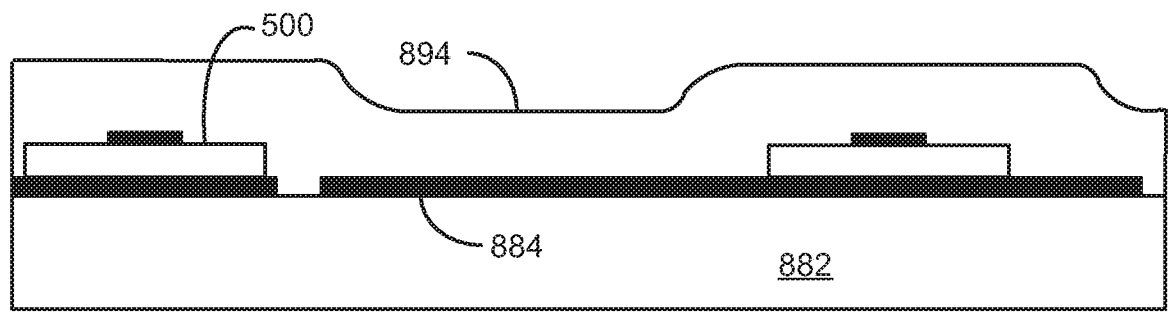

FIG. 77 illustrates a liquid encapsulant sprayed on, spun on, or otherwise deposited over the LEDs to form the top substrate. The encapsulant may be planar.

Figure 78:
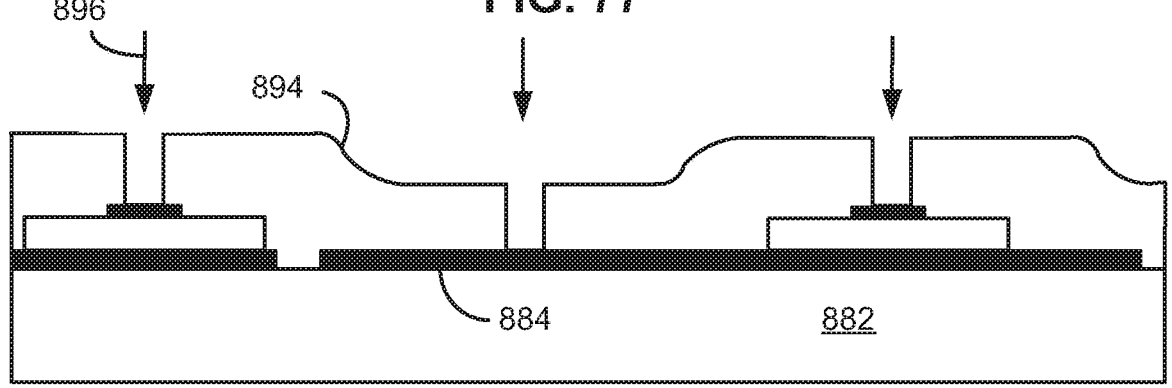

FIG. 78 illustrates the top substrate being laser drilled to form holes to expose metal areas to be contacted by an external conductor pattern.

Figure 79:
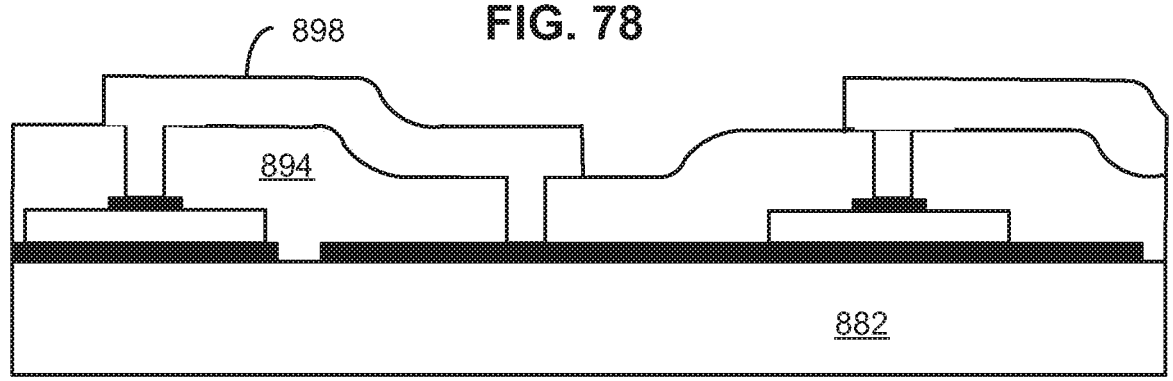

FIG. 79 illustrates a metal or other conductor (e.g., conductive ink) deposited over the top substrate and into the holes to interconnect the LEDs in series.

Figure 80:
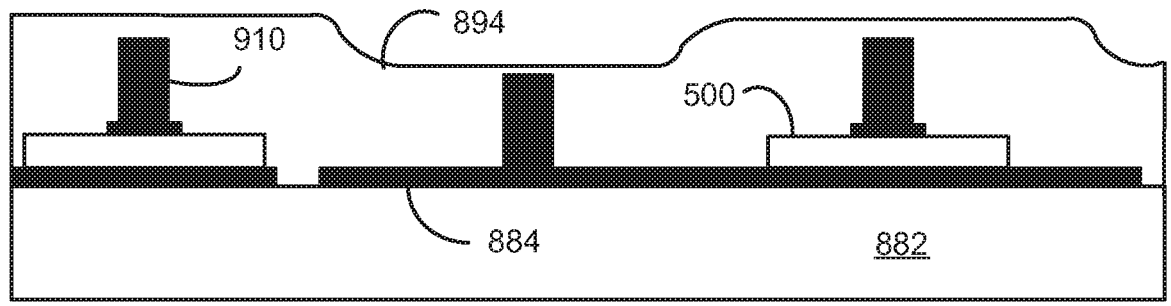

FIG. 80 illustrates photoresist posts or metal studs over areas to be contacted by an external metal layer and also illustrates the structure being coated with a liquid encapsulant material.

Figure 81:
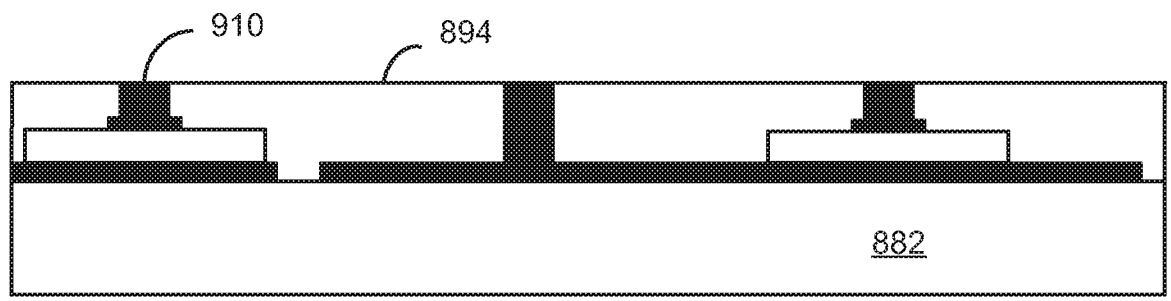

FIG. 81 illustrates the cured encapsulant material being polished or etched to expose the photoresist or metal studs. Any photoresist posts are then stripped away.

Figure 82:
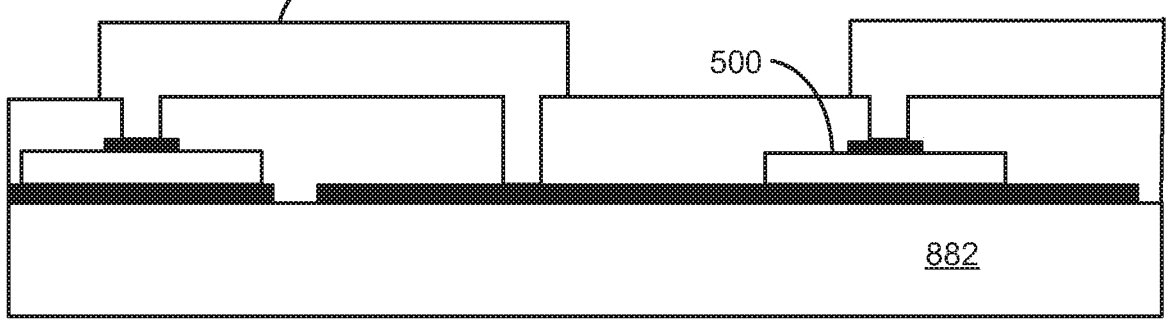

FIG. 82 illustrates a conductor filling the holes and forming a series connection between LEDs.

Figure 83:
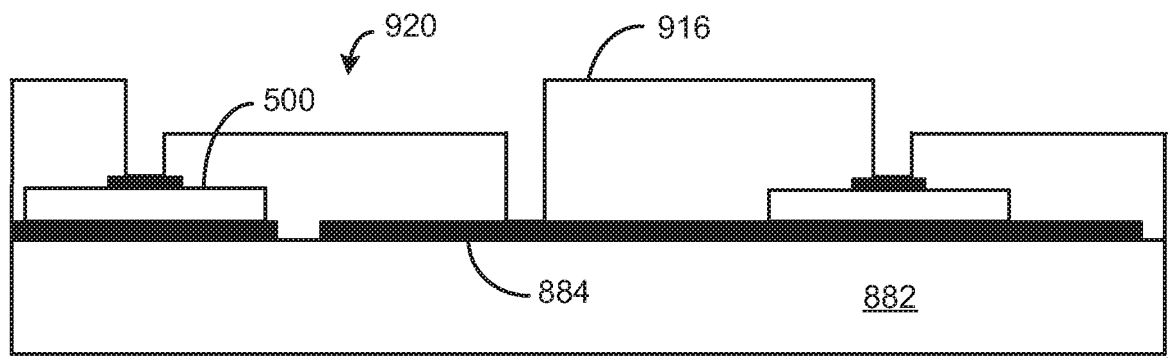

FIG. 83 illustrates a dielectric layer that is patterned with trenches and holes that define an interconnection pattern.

Figure 84:
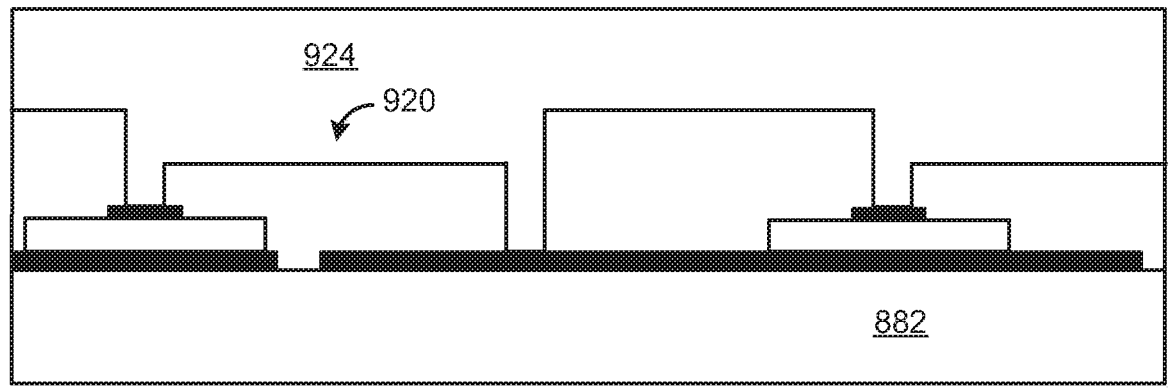

FIG. 84 illustrates a metal blanket-deposited over the structure.

Figure 85:
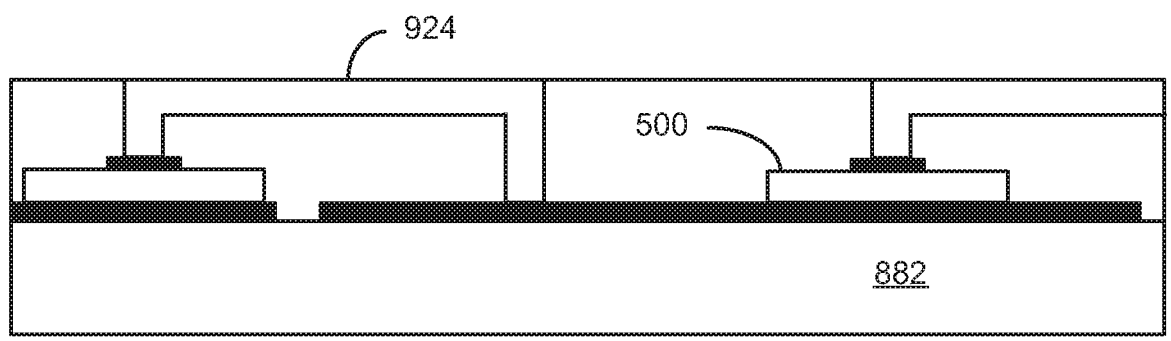

FIG. 85 illustrates the metal being polished down to the dielectric layer to create a series connection between LEDs.

Figure 86:
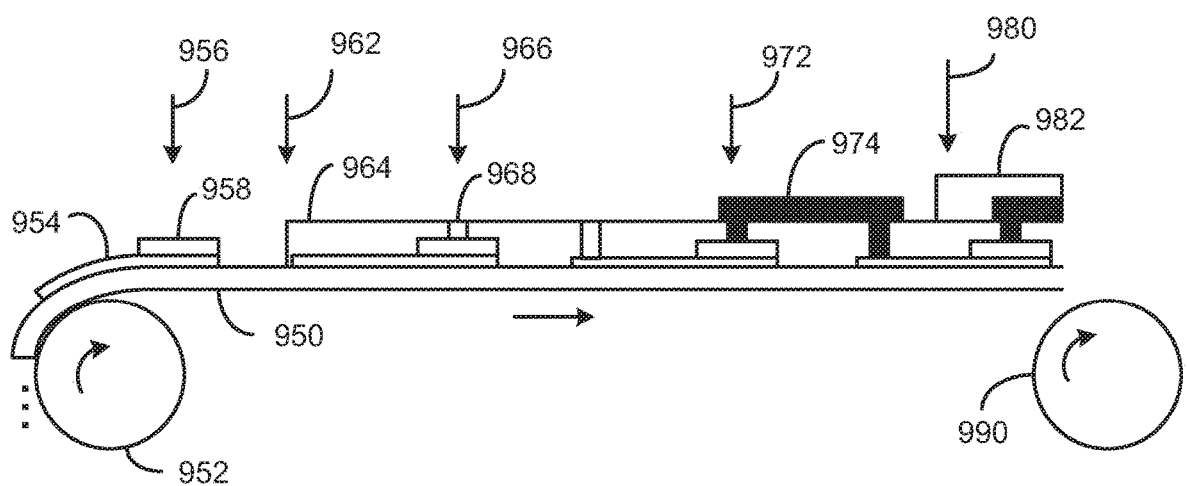

FIG. 86 illustrates a roll-to-roll process for forming LED strips (single column of series-connected LEDs) or LED sheets (arrays of LEDs).

Any of the various substrates and intermediate layers may be mixed and matched in other embodiments.

Elements that are the same or similar are labeled with the same numerals.

DETAILED DESCRIPTION

FIG. 1 is a perspective view of a portion of the light output side of a light sheet 10, showing a simplified pseudo-random pattern of LED areas 12. The LED areas 12 may instead be in an ordered pattern. There may be 500 or more low power LEDs in a full size 2×4 foot light sheet to generate the approximately 3700 lumens (per the DOE CALiPER benchmark test) needed to replace a standard fluorescent fixture typically found in offices.

The pseudo-random pattern may repeat around the light sheet 10 (only the portion within the dashed outline is shown). A pseudo-random pattern is preferred over an ordered pattern since, if one or more LEDs fail or have a poor electrical connection, its absence will be significantly harder to notice. The eye is drawn to defects in an ordered patterns where spacings are consistent. By varying the spacing in a pseudo-random pattern such that overall light uniformity is achieved and where there may be a low amplitude variation in luminance across the surface of the fixture, then the loss of any one LED would not be perceived as a break in the pattern but blend in as a small drop in local uniformity. Typical viewers are relatively insensitive to local low gradient non-uniformities of up to 20% for displays. In overhead lighting applications, the tolerable levels are even higher given that viewers are not prone to staring at fixtures, and the normal angle of view is predominantly at high angles from the normal, where non-uniformities will be significantly less noticeable.

An ordered pattern may be appropriate for applications where there is a substantial mixing space between the light sheet and the final tertiary optical system which would obscure the pattern and homogenize the output adequately. Where this would not be the case and there is a desire to have a thinner profile fixture, then the pseudo random pattern should be employed. Both are easily enabled by the overall architecture.

Alternatively, a variably ordered pattern of LED areas 12 may modulate across the light sheet 10.

The light sheet 10 is generally formed of three main layers: a bottom substrate 14 having an electrode and conductor pattern; an intermediate sheet 16 acting as a spacer and reflector; and a transparent top substrate 18 having an electrode and conductor pattern. The LED chips are electrically connected between electrodes on the bottom substrate 14 and electrodes on the top substrate 18. The light sheet 10 is very thin, such as a few millimeters, and is flexible.

FIG. 2 is a perspective view of a portion of the underside of the light sheet 10 showing the electrode and conductor pattern on the bottom substrate 14, where, in the example, the LED chips in the LED areas 12 are connected as two groups of parallel LEDs that are connected in series by conductors not shown in FIG. 2. The series connections may be by vias through the light sheet layers or through switches or couplings in the external connector 22. A conductor pattern is also formed on the top substrate 18 for connection to the LED chips' top electrodes. The customizable interconnection of the LED chips allows the drive voltage and current to be selected by the customer or requirements of the design. In one embodiment, each identical group of LED chips forms a series-connected group of LED chips by the conductor pattern and the external interconnection of the conductors, and the various groups of series connected LED chips may then be connected in parallel to be driven by a single power supply or driven by separate power supplies for high reliability. In yet another embodiment, the LED chips could be formed into a series-parallel connected mesh with additional active components as may be needed to distribute current amongst the LEDs in a prescribed fashion.

In one embodiment, to achieve a series connection of LED chips using top and bottom conductors, some LEDs chips are mounted on the bottom substrate with their anodes connected to the bottom substrate electrodes and other LED chips are mounted with their cathodes connected to the bottom electrodes. Ideally, adjacent LED chips are reversely mounted to simplify the series connection pattern. The conductor between the electrodes then connects the LED chips in series. A similar conductor pattern on the top substrate connects the cathodes of LED chips to the anodes of adjacent LED chips.

An DC or AC power supply 23 is shown connected to the connector 22. An input of the power supply 23 may be connected to the mains voltage. If the voltage drop of an LED series string is sufficiently high, the series string of LEDs may be driven by a rectified mains voltage (e.g., 120 VAC).

In another embodiment, it is also possible to connect the LED chips in two anti-parallel series branches, or derivatives thereof, that will enable the LED chips to be driven directly from AC, such as directly from the mains voltage.

FIGS. 3-5, 7, 8, 10-14, and 16-19 are cross-sectional views along line 3-3 in FIG. 1, cutting across two LED areas 12, showing the light sheet at various stages of fabrication and various embodiments.

FIG. 3A shows a bottom substrate 14, which may be a commercially available and customized flex circuit. Any suitable material may be used, including thin metals coated with a dielectric, polymers, glass, or silicones. Kapton™ flex circuits and similar types are commonly used for connecting between printed circuit boards or used for mounting electronic components thereon. The substrate 14 has an electrically insulating layer 26, a patterned conductor layer 28, and metal electrodes 30 extending through the insulating layer 26. The electrodes 30 serve as heat sinking vias. Flexible circuits with relatively high vertical thermal conductivities are available. The substrate 14 is preferably only a few mils thick, such as 1-5 mils (25-125 microns), but may be thicker (e.g., up to 3 mm) for structural stability. The conductor layer 28 may be plated copper or aluminum. The electrodes 30 are preferably copper for high electrical and thermal conductivity. The conductor layer 28 may instead be formed on the top surface of the substrate 14.

The conductor layer 28 may be any suitable pattern, such as for connecting the LED chips in series, parallel, or a combination, depending on the desired power supply voltage and current, and depending on the desired reliability and redundancy.

FIG. 3B illustrates another embodiment of a bottom substrate 32, which has a metal reflective layer 34 (e.g., aluminum) sandwiched between a top insulating layer 36 and a bottom insulating layer 38. A conductor layer 40 and electrodes 42 are formed over the top insulating layer 36. The thickness of the bottom substrate 32 may be 1-5 mils, or thicker, and flexible.

FIG. 3C illustrates another embodiment of a bottom substrate 44, which has a dielectric reflective layer 46. This allows the heat conducting metal electrodes 47 to be formed through the reflective layer 46. A conductor layer 48 is formed on the bottom of the substrate, but may instead be formed on the top surface of the substrate. An optional insulating layer 50 overlies the reflective layer 46.

Suitable sheets having a reflective layer may be MIRO IV™, Vikuiti DESR™, or other commercially available reflective sheets.

In one embodiment, components of the drive circuitry may be patterned directly on the bottom substrate 44 to avoid the need for separate circuits and PCBs.

FIG. 4 illustrates a conductive adhesive 52, such as epoxy infused with silver, applied over the electrodes 30. Such a conductive adhesive 52 simplifies the LED chip bonding process and increases reliability. Any of the bottom substrates described herein may be used, and only the bottom substrate 14 of FIG. 3A is used in the examples for simplicity.

FIG. 5 illustrates commercially available, non-packaged blue LED chips 56 being affixed to the bottom substrate 14 by a programmed pick-and-place machine or other prescribed die placement method. The LED chips 56 have a small top electrode 58 (typically used for a wire bond) and a large bottom electrode 60 (typically reflective). Instead of a conductive adhesive 52 (which may be cured by heat or UV) affixing the bottom electrode 60 to the substrate electrode 30, the bottom electrode 60 may be ultrasonically welded to the substrate electrode 30, solder reflowed, or bonded in other ways. Suitable GaN LED chips 56 with a vertical structure are sold by a variety of manufacturers, such as Cree Inc., SemiLEDs, Nichia Inc., and others. Suitable Cree LEDs include EZ 290 Gen II, EZ 400 Gen II, EZ Bright II, and others. Suitable SemiLEDs LEDs include the SL-V-B15AK. Such LEDs output blue light, have a top area of less than about 350×350 microns, and a have a thickness of 170 microns. The specifications for some suitable commercially available blue LEDs, in combination with phosphors to create white light, identify a lumens output in the range of 5-7 lumens per LED at a color temperature of about 4,100K.

Other types of LED chips are also suitable, such as LED chips that do not have a top metal electrode for a wire bond. Some suitable LED chips may have a transparent top electrode or other electrode structures.

FIG. 6 is a perspective view of a transparent intermediate sheet 64 having holes 66 for the LED chips 56. Although the LED chips 56 themselves may have edges on the order of 0.3 mm, the holes 66 should have a much larger opening, such as 2-5 mm to receive a liquid encapsulant and sufficient phosphor to convert the blue light to white light or light with red and green, or yellow, components. The thickness of the intermediate sheet 64 is approximately the thickness of the LED chips 56 used, since the intermediate sheet 64 has one function of preventing excess downward pressure on the LED chips 56 during lamination. Transparent sheets formed of a polymer, such as PMMA, or other materials are commercially available in a variety of thicknesses and indices of refraction.

In one embodiment, the bottom surface of the intermediate sheet 64 is coated with a reflective film (e.g., aluminum) to provide a reflective surface. The intermediate sheet may also optionally have a further coating of dielectric to prevent electrical contact with traces and to prevent oxidation during storage or handling.

To adhere the intermediate sheet 64 to the bottom substrate 14, the bottom surface of the intermediate sheet 64 may be coated with a very thin layer of silicone or other adhesive material. The silicone may improve the total internal reflection (TIR) of the interface by selection of a suitably low index of refraction relative to the intermediate sheet 64.

FIG. 7 illustrates the intermediate sheet 64 having been laminated over the bottom substrate 14 under pressure. Heat may be used to cure the silicone. The thickness of the intermediate sheet 64 prevents a potentially damaging downward force on the LED chips 56 during lamination.

In one embodiment, the intermediate sheet 64 is molded to have prisms 70 formed in its bottom surface for reflecting light upward by TIR. If the bottom surface is additionally coated with aluminum, the reflection efficiency will be improved. Instead of, or in addition to, a prism pattern, the bottom surface may be roughened, or other optical elements may be formed to reflect the light through the light output surface.

Figure 8A:
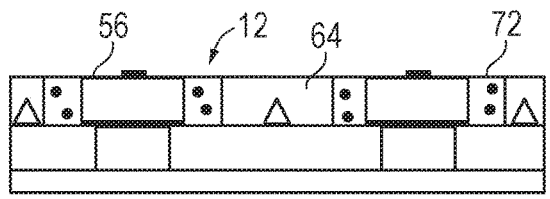
FIG. 8A illustrates the holes surrounding the LEDs filled with a silicone/phosphor mixture to encapsulate the LEDs.

FIG. 8A illustrates the area 12 surrounding the LED chips 56 filled with a silicone/phosphor mixture 72 to encapsulate the LED chips 56. The mixture 72 comprises phosphor powder in a curable liquid silicone or other carrier material, where the powder has a density to generate the desired amount of R, G, or Y light components needed to be added to the blue light to create a white light having the desired color temperature. A neutral white light having a color temperature of 3700-5000K is preferred. The amount/density of phosphor required depends on the width of the opening surrounding the LED chips 56. One skilled in the art can determine the proper types and amounts of phosphor to use, such that the proper mixture of blue light passing through the phosphor encapsulant and the converted light achieves the desired white color temperature. The mixture 72 may be determined empirically. Suitable phosphors and silicones are commercially available. The mixture 72 may be dispensed by silk screening, or via a syringe, or by any other suitable process. The dispensing may be performed in a partial vacuum to help remove any air from the gap around and under the LED chips 56. The conductive adhesive 52 (FIG. 4) helps fill in air gaps beneath the LED chips 56.

In another embodiment, the phosphor around the LED chips 56 in the holes may be preformed and simply placed in the holes around the LED chips 56.

Instead of the intermediate sheet 64 having holes with straight sides, the sides may be angled or be formed as curved cups such that reflectance of light outwards is enhanced.

Figure 8B:
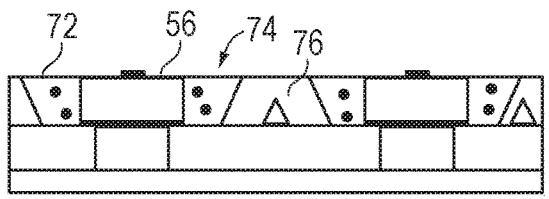
FIG. 8B illustrates the holes surrounding the LEDs filled with a silicone/phosphor mixture, where the holes are tapered to reflect light toward the light output surface of the light sheet.

FIG. 8B illustrates the area surrounding the LED chips 56 filled with the silicone/phosphor mixture 72, where the holes 74 in an intermediate sheet 76 are tapered to reflect light toward the light output surface of the light sheet.

All the various examples may be suitably modified if the phosphor is provided by the LED manufacturer directly on the LED chips 56. If the LED chips 56 are pre-coated with a phosphor, the encapsulant may be transparent silicone or epoxy.

Even if the LED chips 56 are not perfectly centered within a hole 66/74, the increased blue light passing through a thin phosphor encapsulant will be offset by the decreased blue light passing through the thicker phosphor encapsulant.

Figure 8C:
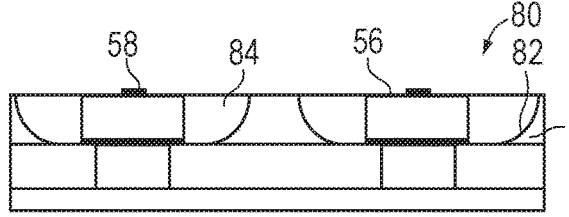
FIG. 8C illustrates the intermediate sheet molded to have cups surrounding each LED, where a reflective layer is formed on the cups to reflect light toward the light output surface of the light sheet.

FIG. 8C illustrates an intermediate sheet 78 molded to have cups 80 surrounding each LED chip 56, where a reflective layer 82 (e.g., aluminum with an insulating film over it) is formed over the sheet 78 to reflect light toward the light output surface of the light sheet. In the embodiment shown, the cups 80 are filled with a silicone encapsulant 84 rather than a silicone/phosphor mixture, since a phosphor tile will be later affixed over the entire cup to convert the blue light to white light. In another embodiment, the cups 80 may be filled with a silicone/phosphor mixture.

Figure 8D:
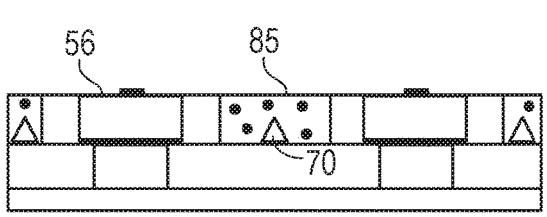
FIG. 8D illustrates the intermediate sheet being formed of phosphor or having phosphor powder infused in the intermediate sheet.

FIG. 8D illustrates an embodiment where the intermediate sheet 85 is formed of a phosphor or is infused with a phosphor powder, or any other wavelength conversion material. For example, the intermediate sheet 85 may be a molded silicone/phosphor mixture. Since the light generated by phosphor widely scatters, the prisms 70 used in other embodiments may not be needed.

Figure 8E:
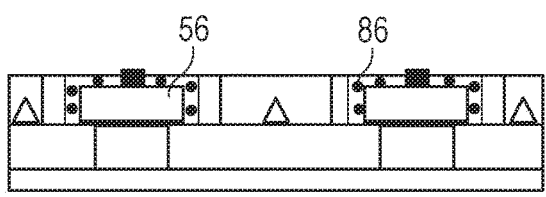
FIG. 8E illustrates that the LED chips may be pre-coated with phosphor on any sides of the chips.

FIG. 8E illustrates that the LED chips 56 may be pre-coated with phosphor 86 on any sides of the chips, such as on all light-emitting sides or only on the sides and not on the top surface. If the top surface is not coated with a phosphor, such as to not cover the top electrode, the blue light emitted from the top surface may be converted by a remote phosphor overlying the LED chip 56.

Figure 9:
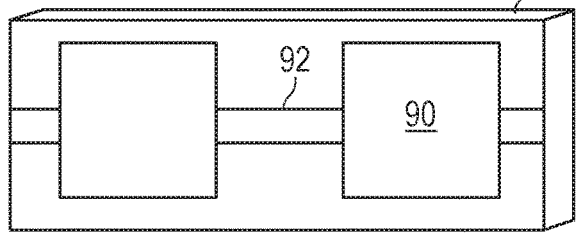
FIG. 9 is a perspective view of a top transparent substrate having a conductor pattern and electrode pattern. The electrodes may be reflective or transparent.

FIG. 9 is a perspective view of a transparent top substrate 88 having electrodes 90 and a conductor layer 92 formed on its bottom surface. The electrodes 90 may be reflective (e.g., silver) or transparent (e.g., ITO). The top substrate 88 may be any clear flex circuit material, including polymers. The top substrate 88 will typically be on the order of 1-20 mils thick (25 microns-0.5 mm). Forming electrodes and conductors on flex circuits is well known.

A thin layer of silicone may be silk-screened, sprayed with a mask, or otherwise formed on the bottom surface of the top substrate 88 for affixing it to the intermediate sheet 64. The electrodes 90 are preferably not covered by any adhesive in order to make good electrical contact with the LED chip electrodes 58.

Figure 10:
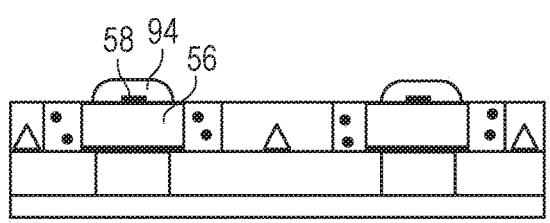
FIG. 10 illustrates a conductive adhesive dispensed over the LEDs' top electrodes.

FIG. 10 illustrates a conductive adhesive 94 (e.g., silver particles in epoxy or silicone) dispensed over the top electrodes 58 of the LED chips 56.

Figure 11:
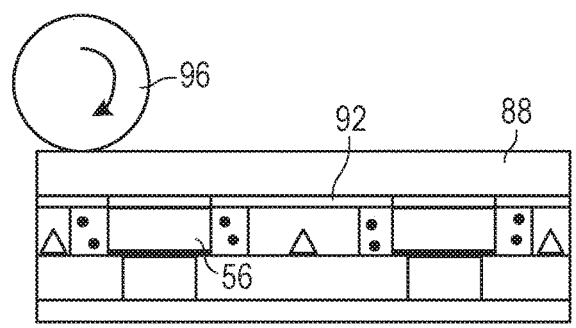
FIG. 11 illustrates the top substrate laminated over the LEDs, where side light is reflected through the light output surface of the light sheet by prisms molded into the intermediate sheet.

FIG. 11 illustrates the transparent top substrate 88 laminated over the LED chips 56, using pressure and heat. Heat is optional, depending on the type of curing needed for the various adhesives. A roller 96 is shown for applying uniform pressure across the light sheet as the light sheet or roller 96 is moved. Other means for applying pressure may be used, such as a flat plate or air pressure. The thickness of the intermediate sheet 64, matched to the thickness of the LED chips 56, ensures that the laminating force does not exert a pressure on the LED chips 56 above a damaging threshold. In the preferred embodiment, the force exerted on the LED chips 56 is substantially zero, since the conductive adhesive 94 is deformable to ensure a good electrical connection. Further, even if there is some slight protrusion of the LED chip electrode 58 above the intermediate sheet 64, the elasticity of the top substrate 88 will absorb the downward laminating pressure.

The thickness of the completed light sheet may be as little as 1-2 mm or less, resulting in little optical absorption and heat absorption. For added structural robustness, the light sheet can be made thicker. If additional optics are used, such as certain types of reflecting cups and light-shaping layers, the total thickness can become up to 1 cm and still maintain flexibility. The structure is cooled by ambient air flow over its surface. Any of the substrates and intermediate sheets described herein can be mixed and matched depending on the requirements of the light sheet.

FIGS. 12A-12D illustrate various phosphor conversion techniques that can be used to create white light. If UV LED chips are used, an additional phosphor generating a blue light component would be used.

Figure 12A:
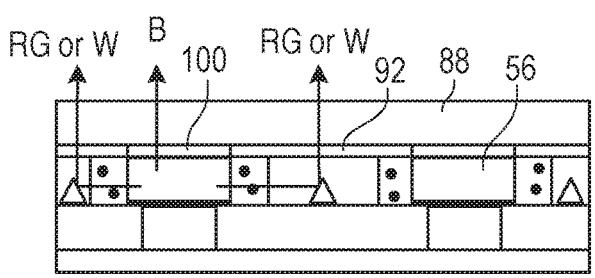
FIG. 12A illustrates the top substrate laminated over the LEDs, where side light is converted to a combination of red and green light, or yellow light, or white light and reflected through the light output surface of the light sheet, while the blue light from the LEDs is directly transmitted through the transparent electrodes on the top transparent substrate for mixing with the converted light.

FIG. 12A illustrates the LED chips' side light being converted to red and green light, or yellow light, or white light and reflected through the light output surface of the light sheet, while the blue light from the LED chips 56 is directly transmitted through the transparent electrode 100 on the transparent sheet 88 for mixing with the converted light a short distance in front of the light sheet. An observer would perceive the light emitted by the light sheet as being substantially uniform and white.

Figure 12B:
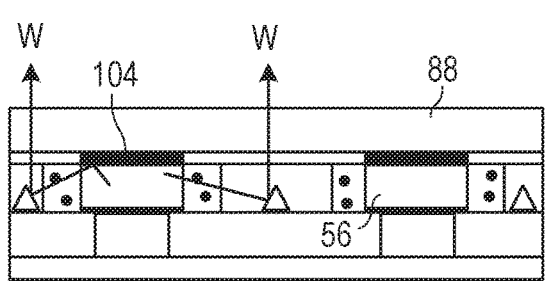
FIG. 12B illustrates the top substrate laminated over the LEDs, where a reflector overlies the LED so that all light is converted to white light by the phosphor and reflected through the light output surface of the light sheet.

FIG. 12B illustrates all the light from the LED chips 56 being emitted from the side due to a reflective electrode 104 on the top transparent sheet 88 overlying the LED chips 56. All light is then converted to white light by the phosphor and reflected through the light output surface of the light sheet.

Figure 12C:
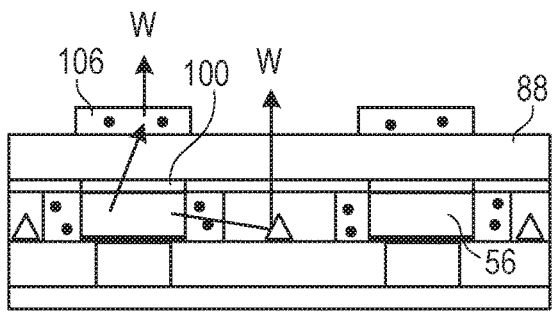
FIG. 12C illustrates the top substrate laminated over the LEDs, where side light is converted to white light by the phosphor surrounding the LEDs, and the top light is converted to white light by a remote phosphor layer over the LEDs.

FIG. 12C illustrates side light being converted to white light by the phosphor surrounding the LED chips 56, and the blue top light, emitted through the transparent electrode 100, being converted to white light by a remote phosphor layer 106 formed on the top surface of the top substrate 88 over the LED chips 56. The phosphor layer 106 may be flat or shaped. The area of the phosphor layer 106 is preferable the same as or slightly larger than the LED chips 56. The phosphor layer 106 can be rectangular or circular. The phosphor layer 106 is formed such that blue light passing through the phosphor layer 106 combined with the converted light produces white light of the desired color temperature.

Figure 12D:
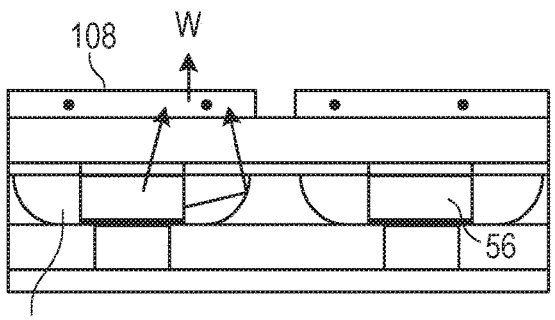
FIG. 12D illustrates the top substrate laminated over the LEDs, where the LEDs are positioned in a reflective cup, and where side light and top light are converted to white light by a large phosphor layer over the LEDs.

FIG. 12D illustrates the LED chips 56 being positioned in reflective cups 80 filled with a transparent silicone encapsulant, and where side light and top light are converted to white light by a large phosphor layer 108 over each cup 80. In one embodiment, the area of each phosphor layer 108 is adjusted to allow a selected amount of blue light to be directly emitted (not passed through the phosphor) to create the desired white light color temperature. Such phosphor layer sizes can be custom tailored at the end of the fabrication process, such as by masking or cutting phosphor tile sizes, to meet a customer's particular requirements for color temperature.

The top substrate 88 (or any other sheets/substrates described herein) may have a roughened top or bottom surface for increasing the extraction of light and providing a broad spread of light. The roughening may be by molding, casting, or micro bead blasting.

Figure 13:
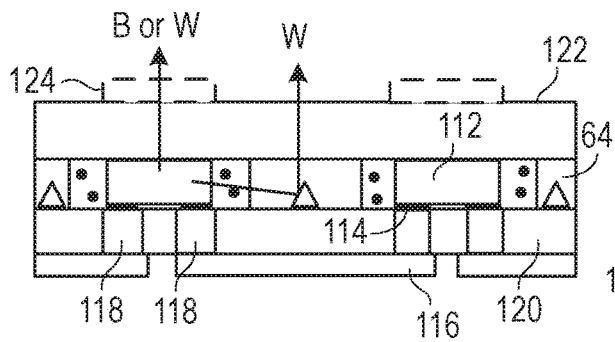
FIG. 13 illustrates the use of a flip chip LED in the light sheet, where the flip chip may be used in any of the embodiments described herein.

In another embodiment, shown in FIG. 13, the LED chips 112 may be flip chips, with anode and cathode electrodes 114 on the bottom surface of the LED chips 112. In such a case, all conductors 116 and electrodes 118 would be on the bottom substrate 120. This would greatly simplify the series connection between LED chips, since it is simple to design the conductors 116 to connect from a cathode to an anode of adjacent LED chips 112. Having all electrodes on the bottom substrate 120 also improves the reliability of electrical connections of the substrate electrodes to the LED electrodes since all bonding may be performed conventionally rather than by the lamination process. The top substrate 122 may then be simply a clear foil of any thickness. The top substrate 122 may employ the reflectors (from FIG. 12B) above each LED chip 112 for causing the chips to only emit side light, or a phosphor layer 124 can be positioned on the substrate 122 above each LED chip 112 for converting the blue light into white light, or any of the other phosphor conversion techniques and intermediate sheets described herein may be used to create white light.

In another embodiment, LED chips are used where both electrodes are on the top of the chip, where the electrodes are normally used for wire bonding. This is similar to FIG. 13 but where the LEDs are flipped horizontally and the conductors/electrodes are formed on the top substrate 122. The bottom substrate 120 (FIG. 13) may contain metal vias 118 for heat sinking, where the vias 118 are bonded to a bottom of the LED chips to provide a thermal path between the LED chips and the metal via 118 surface exposed on the bottom surface of the bottom substrate. The chips can then be air cooled. A thermally conductive adhesive may be used to adhere the LED chips to the vias 118.

Figure 14:
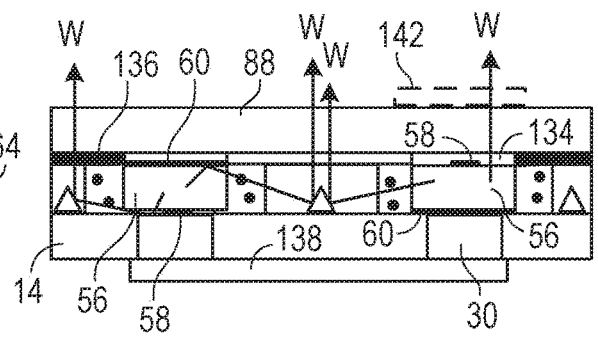
FIG. 14 illustrates the reverse mounting of alternate LEDs on the bottom substrate to achieve a series connection between LEDs.

FIG. 14 illustrates LED chips 56 that are alternately mounted on the bottom substrate 14 so that some have their cathode electrodes 60 connected to the bottom substrate electrodes 30 and some have their anode electrodes 58 connected to the bottom substrate electrodes 30. The top substrate 88 transparent electrodes 134 then connect to the LED chips' other electrodes. Since the LED chips' cathode electrode 60 is typically a large reflector, the LED chips connected with their cathodes facing the light output surface of the light sheet will be side emitting. The electrodes 30 on the bottom substrate 14 are preferably reflective to reflect light upward or sideward. The connectors 136 on the top substrate 88 and the connectors 138 on the bottom substrate 14 can then easily connect the adjacent LED chips in series without any vias or external connections. For converting the top blue light from some LED chips to white light, a phosphor layer 142 may be used above the LED chips.

FIGS. 15-18 illustrate other embodiments that better enable the LED chips 56 to be connected in series within the light sheet 10.

Figure 15:
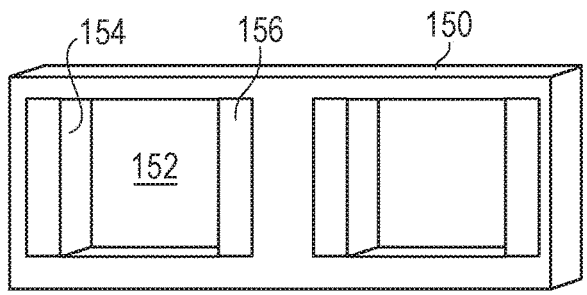
FIG. 15 illustrates the intermediate sheet having electrodes formed on opposing walls of its holes for contacting the top and bottom electrodes of the LEDs.

FIG. 15 illustrates an intermediate sheet 150 having square holes 152 with metal electrodes 154 and 156 formed on opposing walls of the holes 152, where the electrode metal wraps around a surface of the intermediate sheet 150 to be contacted by a conductor pattern on the surface of the intermediate sheet 150 or one or both of the top substrate or bottom substrate. The electrodes may be formed by printing, masking and sputtering, sputtering and etching, or by other known methods.

Figure 16:
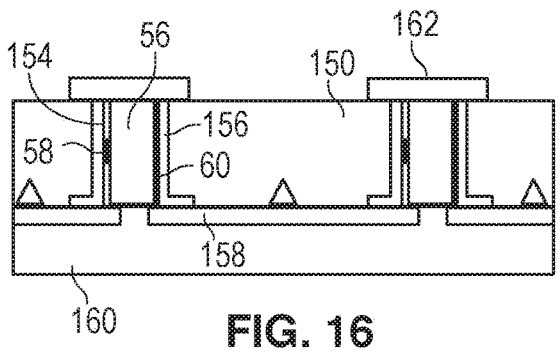
FIG. 16 illustrates the LEDs inserted into the holes of the intermediate sheet and the electrodes on the intermediate sheet being interconnected together by a conductor pattern on any of the layers for connecting the LEDs in any combination of serial and parallel.

As shown in FIG. 16, the LED chips 56, with top and bottom electrodes, are then inserted vertically in the holes 152 so that the LED electrodes 58 and 60 contact the opposing electrodes 154 and 156 formed on the walls of the holes 152. The electrodes 154 and 156 may be first coated with a conductive adhesive, such as silver epoxy, to ensure a good contact and adhesion. The intermediate sheet 150 has about the same thickness of the chips 56, where the thickness of the chips 56 is measured vertically. This helps protect the chips 56 from physical damage during lamination.

In the example of FIG. 16, the electrodes 154 and 156 extend to the bottom surface of the intermediate sheet 150 for being interconnected by conductors 158 formed on the bottom substrate 160. In one embodiment, the bottom substrate 160 has a metal reflector layer on its bottom surface or internal to the substrate for reflecting the side light back up though the light output surface of the light sheet. The reflective layer may also be a dielectric layer.

The conductors 158 in FIG. 16 connect the anode of one LED chip 56 to the cathode of an adjacent LED chip 56. The conductors 158 may additionally connect some series strings in parallel (or connect parallel LED chips in series).

Figure 17:
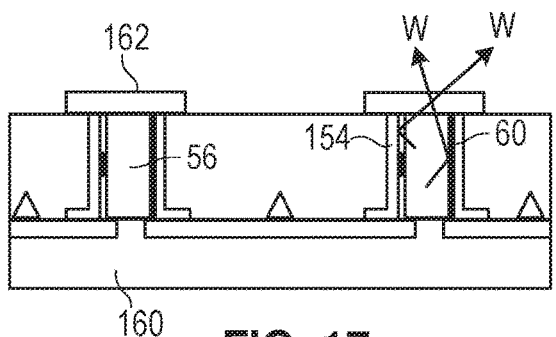
FIG. 17 illustrates two light rays being reflected off the reflective electrodes on the intermediate sheet or the bottom reflective electrode of the LED and being converted to white light by a phosphor layer.

FIG. 17 illustrates two light rays generated by the LED chip 56 being reflected by the LED chip's bottom reflective electrode 60 and the reflective electrode 154 or reflective scattering conductive adhesive. Since the bottom substrate 160 also has a reflector, all light is forced through the top of the light sheet.

Any air gaps between the LED chips 56 and the holes 152 may be filled in with a suitable encapsulant that improves extraction efficiency.

A phosphor layer 162 converts the blue light to white light.

FIGS. 16 and 17 also represent an embodiment where the conductor pattern is formed directly on the bottom or top surface of the intermediate sheet 150, so all electrodes and conductors are formed on the intermediate sheet 150. No top substrate is needed in these embodiments, although one may be desired to seal the LED chips 56.

Figure 18:
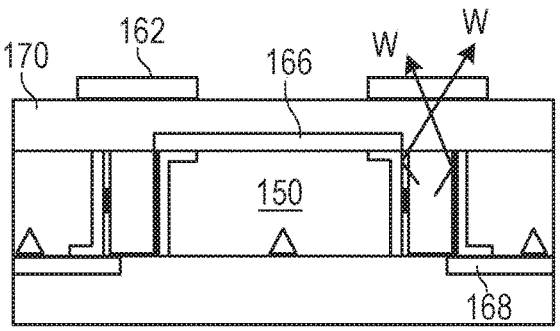
FIG. 18 illustrates an alternative embodiment where the conductors for interconnecting the LEDs are formed on opposite surfaces of the intermediate sheet or on surfaces of the top and bottom substrates.

FIG. 18 illustrates an embodiment where the conductors 166 and 168 are formed on both sides of the intermediate sheet 150 or formed on the transparent top substrate 170 and bottom substrate 160. The LED chips 56 can easily be connected in any combination of series and parallel.

Figure 19B:
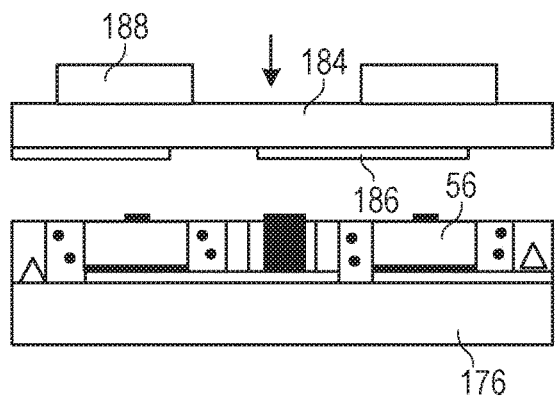

FIGS. 19A and 19B represent an embodiment where the bottom substrate 176 has conductors 178 formed on its top surface. The bottom electrodes (e.g., cathodes) of the LED chips 56 are bonded to the conductors 178. For a series connection between LED chips 56, solid metal interconnectors 180 are also bonded to the conductors 178. The intermediate sheet 182 has holes that correspond to the LED chip 56 locations and interconnector 180 locations, and the tops of the chips 56 and interconnectors 180 are approximately planar with the top of the intermediate sheet 182. The areas surrounding the LED chips 56 may be filled in with a phosphor/silicone mixture 72.

In FIG. 19B, a transparent top substrate 184 has anode conductors 186 that interconnect the anode electrodes of LED chips 56 to associated interconnectors 180 to create a series connection between LED chips 56. This series interconnection technique may connect any number of LED chips 56 in series in the sheet or strip. A pick and place machine is simply programmed to place an LED chip 56 or an interconnector 180 at selected locations on the bottom substrate 176. The bonding may be performed by ultrasonic bonding, conductive adhesive, solder reflow, or any other technique.

The interconnector 180 may also be a plating of the hole in the intermediate sheet 182 or a soft conductor paste that is injected into the hole, printed within the hole, etc.

A phosphor layer or tile 188 may be affixed on the top substrate 184 over the LED chips 56 to convert the blue light emitted from the top surface of the chips 56 to white light. If the phosphor layer/tile 188 was large enough, then phosphor need not be used in the encapsulant.

The bottom substrate 176 may have a reflective layer either imbedded in it or on its bottom surface, as previously described, for reflecting light toward the light output surface.

In a related embodiment, the hole for the interconnector may be formed completely through the light sheet, then filled with a metal or coated with a metal. The hole may be formed using a laser or other means. The metal may be a printed solder paste that is reflowed to make electrical contact to the conductors formed on the substrates to complete the series connection. Extending the metal external to the light sheet will improve heat sinking to ambient air or to an external heat sink material. If the metal has a central hole, cooling air may flow through it to improve heat sinking.

FIGS. 20-31 illustrate various embodiments where there is no intermediate sheet or strip. Instead, the top substrate and/or bottom substrate is provided with cavities or grooves to accommodate the thickness of the LED chips 56.

In FIGS. 20A and 20B, the bottom substrate 190 has cavities 192 molded in it or grooves molded in it. Grooves may also be formed by extruding, machining, or injection molding the substrate 190. The width of the bottom substrate 190 may be sufficient to support one, two, three or more columns of LED chips 56, where each column of chips 56 is connected in series, as described below.

Cathode conductors 194 are formed on the bottom substrate 190 and are bonded to the cathode electrodes of the vertical LED chips 56.

A top substrate 196 has anode conductors 198 that are aligned with the anode electrodes of the LED chips 56 and also make contact with the cathode conductors 194 to connect the LED chips 56 in series. The area around each LED chip 56 may be filled in with a phosphor/silicone mixture to encapsulate the chips 56, or just silicone may be used as the encapsulant and the top surface of the top substrate 196 is coated with a layer of phosphor to create white light.

FIG. 20B shows the top substrate 196 laminated onto the bottom substrate 190. A thin layer of silicone may be printed on the top substrate 196 or bottom substrate 190, except where the conductors are located, to affix the substrates to each other and to fill in any gaps between the two substrates. Alternatively, lamination may be achieved by use of other adhesive materials, ultrasonic bonding, laser welding, or thermal means. A conductive paste or adhesive may be deposited over the anode conductors 198 to ensure good electrical contact to the cathode conductors 194 and chips' anode electrodes. A phosphor tile or layer may be formed on the top substrate 196 for creating white light from the blue light emitted vertically from the chip 56. A reflective layer 199 is formed on the bottom substrate 190 for reflecting light toward the output surface.

Instead of the groove or cavity being formed in the bottom substrate 190, the groove or cavity may be formed in the top substrate 196, or partial-depth grooves or cavities may be formed in both substrates to account for the thickness of the chips 56.

FIG. 20C is a transparent top down view of FIG. 20B illustrating one possible conductor pattern for the conductors 194 and 198, where the LED chips 56 are connected in series, and two sets of series-connected LED strings are shown within the laminated substrates. The anode conductors 198 above the LED chips 56 are narrow to block a minimum amount of light. The various metal conductors in all embodiments may be reflective so as not to absorb light. Portions of the anode conductors 198 over the LED chips 56 may be transparent conductors.

Figure 20D:
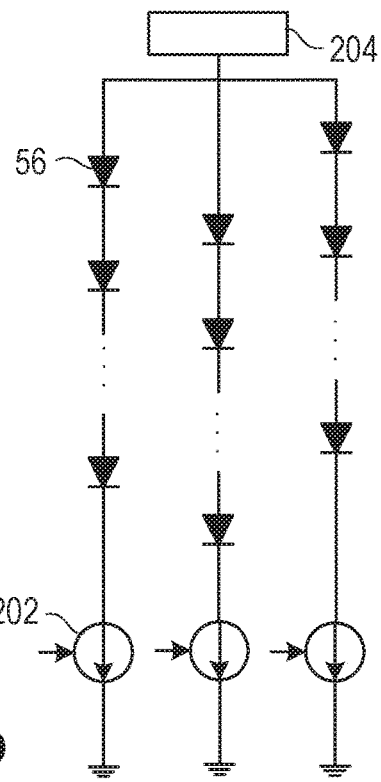
FIG. 20D illustrates multiple series strings of LEDs being connected in the light sheet or strip of FIG. 20B.

As shown in FIG. 20D, any number of LED chips 56 may be connected in series in a strip or sheet, depending on the desired voltage drop. Three series strings of LED chips 56 in a single strip or sheet are shown in FIG. 20D, each series string being connected to a controllable current source 202 to control the string's brightness. The LED chips 56 are offset so as to appear to be in a pseudo-random pattern, which is aesthetically pleasing and makes a failed LED chip not noticeable. If there is sufficient diffusion of the light, each string of LED chips may create the same light effect as a fluorescent tube. A cathode connector and an anode connector may extend from each strip or sheet for coupling to a power supply 204 or to another strip or sheet. This allows any configuration of series and parallel LED chips.

In all the embodiments described herein, metal slugs may be provided that extend through the bottom substrate so as to provide a metal heat path between the bottom electrodes of the LED chips and air. The slugs may be similar to the electrodes 30 in FIGS. 3A-5 but may be electrically insulated from other slugs or electrically connected to the electrodes of other LEDs by a conductor layer for a series connection. A thin dielectric may separate the LED electrodes from the slugs if the slugs are to be electrically floating.

Figure 21A:
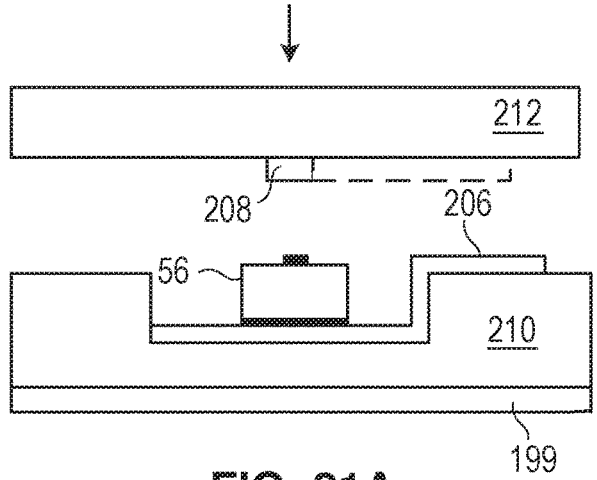
FIG. 21A is a cross-section of structure that contains a series string of LEDs sandwiched between two substrates.
Figure 21B:
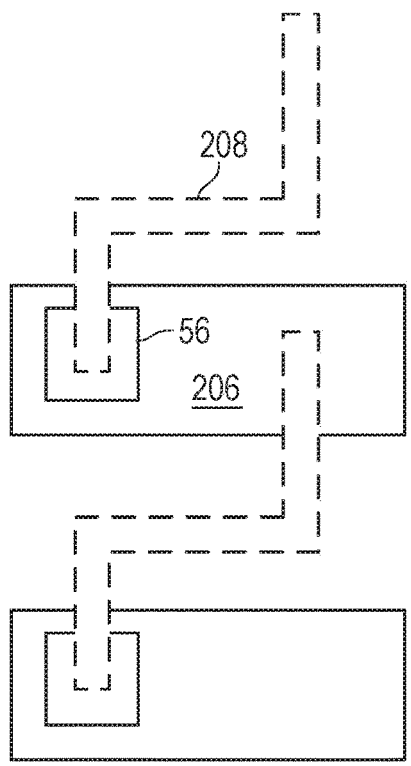
FIG. 21B is a top down view of the structure of FIG. 21A showing the overlapping of anode and cathode conductors.
Figure 21C:
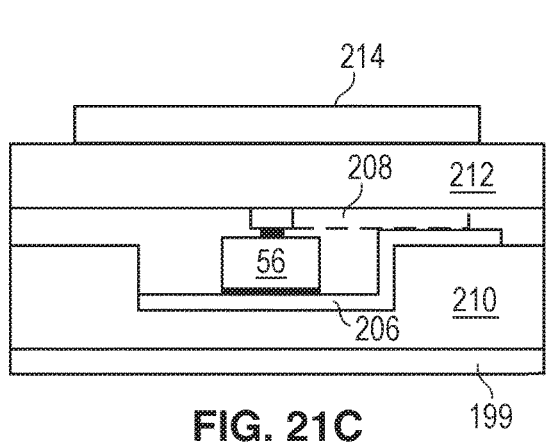
FIG. 21C illustrates the sandwiched LED of FIG. 21A.

FIGS. 21A, 21B, and 21C illustrate a different configuration of cathode conductors 206 and anode conductors 208 on a bottom substrate 210 and top substrate 212 for connecting the LED chips 56 in series when the substrates are brought together. In FIGS. 21A-C, there is only one LED chip 56 mounted along the width of the structure, and the flexible structure can be any length depending on the number of LED chips to connect in series and the desired distance between LED chips 56. In FIG. 21C, the LED chip 56 may be encapsulated in silicone or a phosphor/silicone mixture, and a phosphor tile or phosphor layer 214 is affixed over the LED chip 56 to generate white light. The phosphor layer 214 may be deposited over the entire top surface of the top substrate 212. The bottom substrate 210 has a reflective layer 199.

Figure 22:
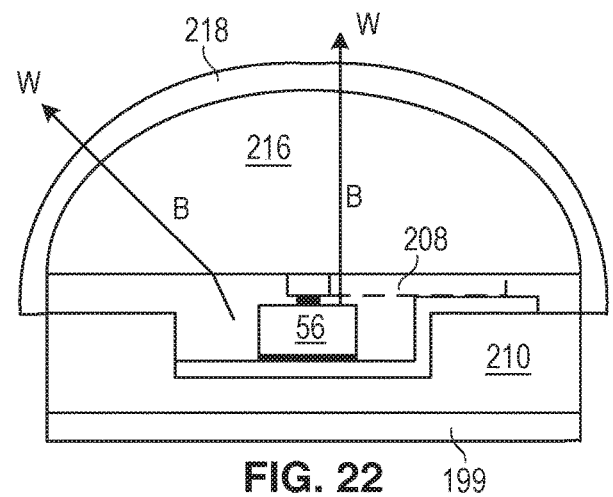
FIG. 22 is a cross-sectional view of a substrate structure having a hemispherical top substrate, where the structure contains a series string of LEDs sandwiched between two substrates.

FIG. 22 illustrates that the top substrate 216 may be hemispherical with a phosphor layer 218 over the outer surface of the top substrate 216 for converting the blue LED light to white light. Silicone encapsulates the chip 56. By providing the top substrate 216 with a rounded surface, there is less TIR and the emitted white light pattern is generally lambertian. Also, for all embodiments, shaping the top substrate can be used to shape the light emission pattern. For example, the top substrate shape can act as a lens to produce a batwing or other non-lambertian emission pattern for more uniform illumination.

The diameters/widths of the substrates in FIGS. 21-22 and the substrates described below may be on the order of 2-10 mm to limit light attenuation, to maintain high flexibility, to minimize the height of the light fixture, and to enable handling of the substrates using conventional equipment. The substrates can, however, be any size.

Figure 23A:
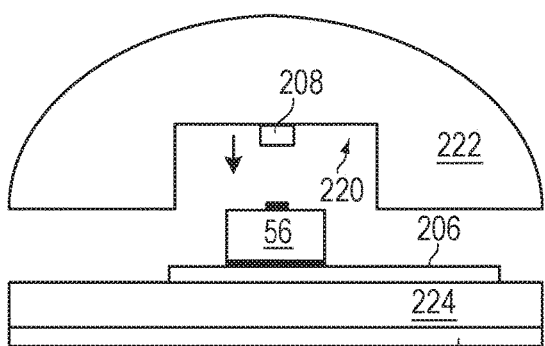
FIGS. 23A and 23B are cross-sectional views of a substrate structure where a channel or cavity is formed in the top substrate, where the structure contains a series string of LEDs sandwiched between two substrates.
Figure 23B:
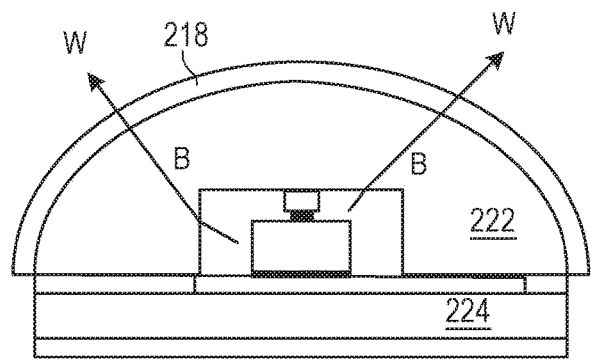

FIGS. 23A and 23B illustrate that the groove 220 or cavity for the LED chip 56 may be formed in the top substrate 222 rather than in the bottom substrate 224.

In the various embodiments where the LED dies have a semicircular top substrate, the light emitted from the dies in the direction of the substrate surface less than the critical angle is transmitted through the surface. However, light emitted from the dies in the direction of the top substrate's length may be subject to more total internal reflection. Therefore, such low angle light or internally reflected light should be reflected toward the surface of the top substrate by angled prisms or other reflectors positioned between adjacent LED dies along the length of the top substrate to provide a uniform emission pattern along the length of the light strip. The reflectors may be formed in the top or bottom substrates similar to the prisms 70 shown in FIG. 7. Since there is some light mixing along the length of the top substrate, the light from the various LEDs will mix to create a more uniform correlated color temperature along the length of the top substrate. Therefore, any reflectors in the top substrate or roughening of the top substrate to extract light should take into consideration the extent of light mixing desired.

Figure 25:
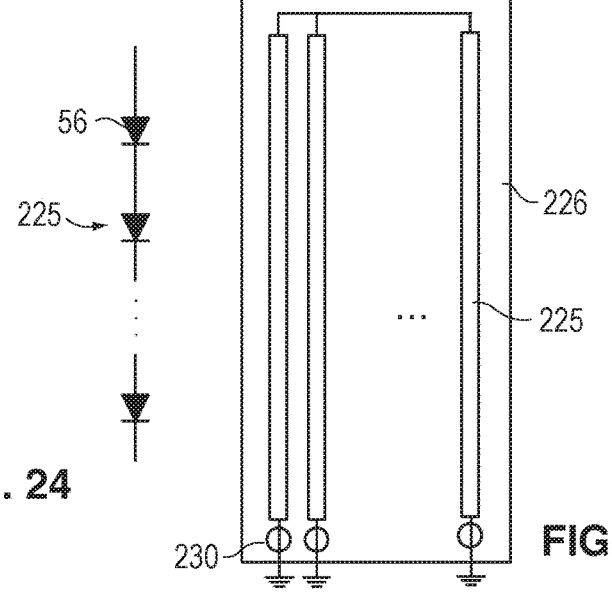
FIG. 25 is a top down view of a single substrate structure or a support base supporting multiple substrate structures.

The bottom substrate 224 may be widened to support any number of LED chips along its width, and a separate hemispherical top substrate 222 may be used to cover each separate series string of LED chips mounted on the single bottom substrate (shown in FIG. 25).

Figure 24:
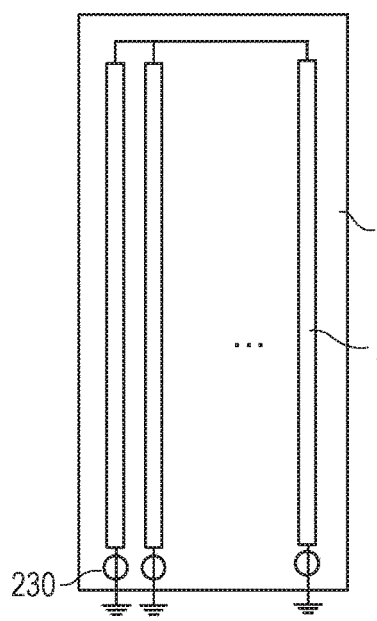
FIG. 24 is a schematic view of a series string of LEDs that may be in the substrate structures of FIGS. 20-23.

FIG. 24 is a schematic diagram representing that any number of LED chips 56 may be connected in a series string 225 in the substrate structure of FIGS. 21-23.

FIG. 25 illustrates a support base 226 for the separate strings 225 of LED chips 56. The support base 226 may be a bottom substrate, such as substrates 210 or 224 in FIGS. 21-23, or may be a separate support base for strings 225 encased in the top and bottom substrates shown in FIGS. 21-23. Each string 225 may be controlled by a separate current source 230 and powered by a single power supply voltage connected to the anodes of the strings 225. If some strings output light of a different chromaticity, or color temperature, the current applied to the various strings may be controlled to make the overall chromaticity, or color temperature, of the light sheet a target chromaticity, or color temperature. Many driving arrangements are envisioned. In one embodiment, the support base 226 is nominally 2×4 feet to be a replacement for a 2×4 foot standard ceiling fluorescent fixture. Since each series string 225 of LED chips 56 is very thin, any number of strings can be mounted on the support base 226 to generate the required number of lumens to substitute for a standard 2×4 foot fluorescent fixture.

Figure 26A:
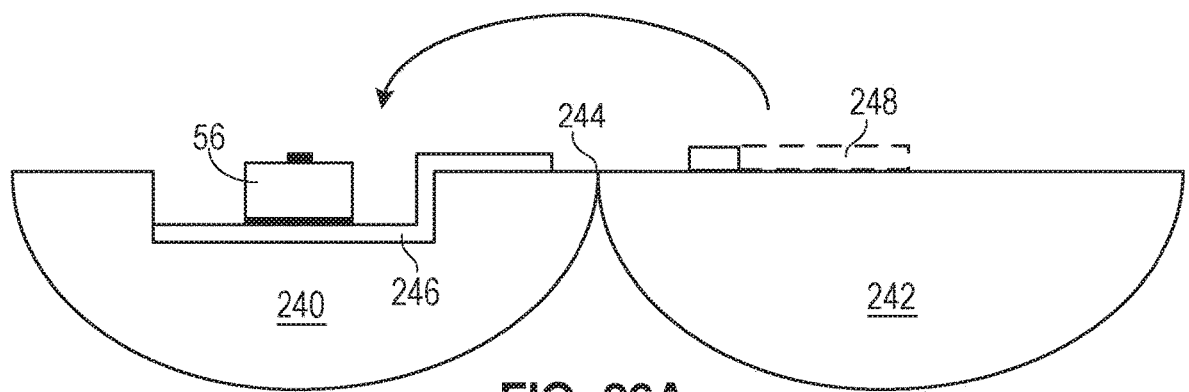
FIG. 26A is a cross-sectional view of two substrates connected together by a narrow region so the substrates can sandwich a string of LEDs.
Figure 26B:
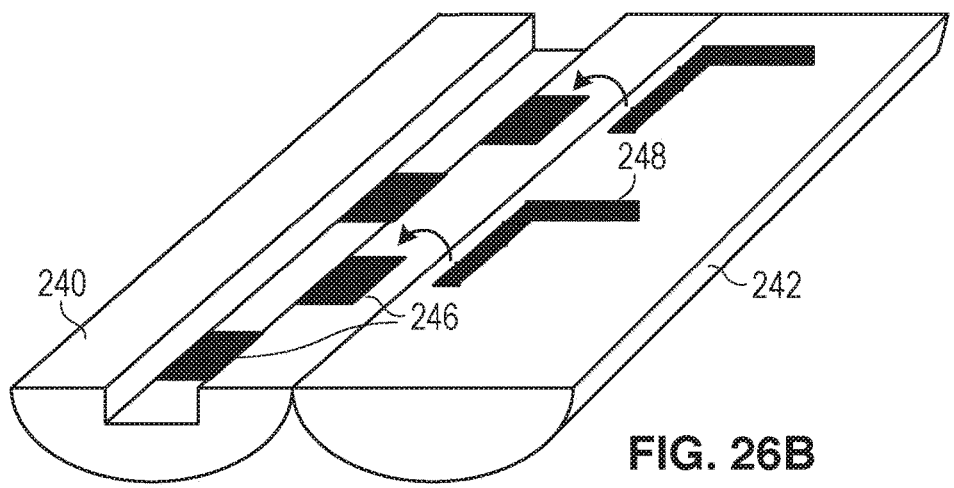
FIG. 26B is a perspective view of the substrates of FIG. 26A.
Figure 26C:
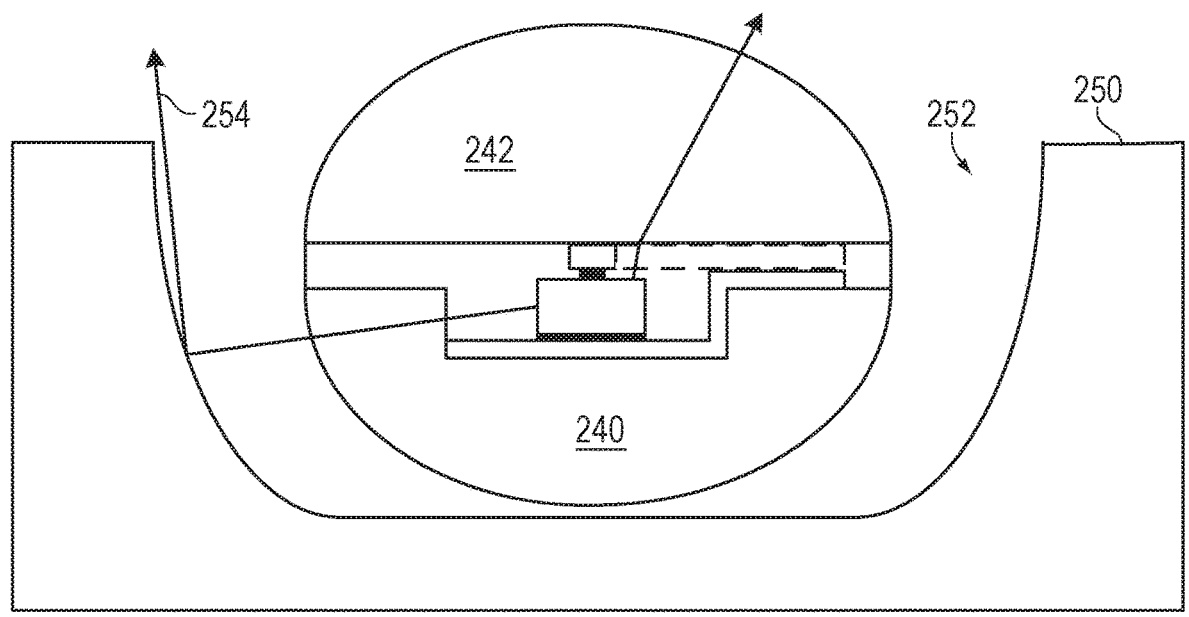
FIG. 26C illustrates the structure of FIG. 26A being supported in a reflective groove in a support base.

FIGS. 26A-26C illustrate a variation of the invention, where the substrates are connected together when initially molded or extruded. One or both substrates may be rounded.

In FIG. 26A, a bottom substrate 240 and a top substrate 242 are molded or extruded together and connected by a resilient narrow portion 244. This allows the top substrate 242 to be closed over the bottom substrate 240 and be automatically aligned. Cathode conductors 246 and anode conductors 248 are formed on the substrates 240 and 242 in the arrangement shown in FIG. 26B so that, when the substrates 240 and 242 are brought together, the LED chips 56 are connected in series. Silicone or a phosphor/silicone mixture may be used to encapsulate the LED chips 56, or the outer surface of the substrates is coated with a phosphor layer to convert the blue light to white light. Any number of LED chips 56 can be connected in series within the substrates.

FIG. 26C illustrates the resulting substrate structure affixed to a support base 250. The support base 250 may have a reflective groove 252 for reflecting light 254. The groove 252 may be repeated along the width of the support base 250 for supporting a plurality of substrate structures.

The bottom substrate 240 may have a flat bottom while the top substrate is hemispherical. This helps mounting the bottom substrate on a reflective support base. Providing the top substrate as hemispherical, with an outer phosphor coating, results in less TIR and a more lambertian emission.

In the various embodiments describing overlapping conductors on the top and bottom substrates forming a series connection, the connection may be enhanced by providing solder paste or a conductive adhesive on the conductor surfaces, followed by solder reflow or curing.

Figure 27:
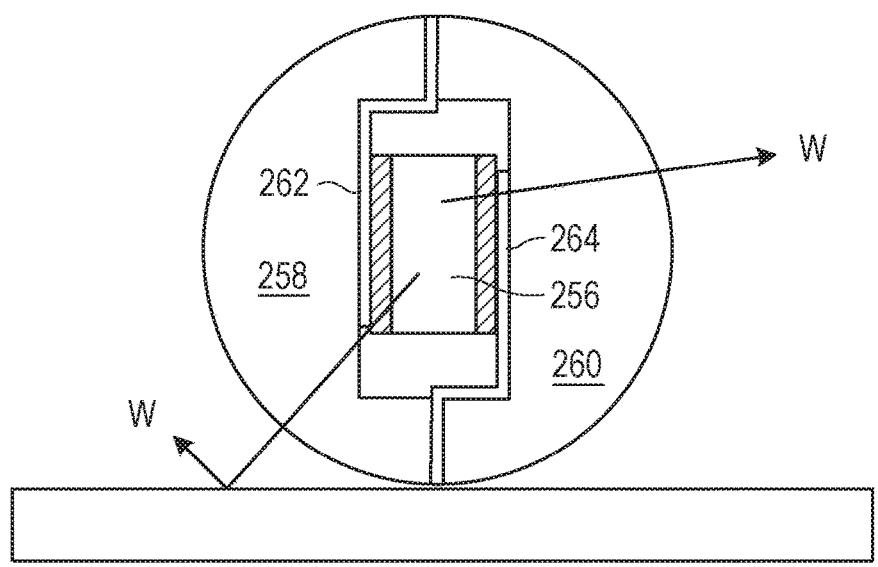
FIG. 27 is a cross-sectional view of an LED that emits light from opposing sides of the chip, where the structure contains a series string of LEDs sandwiched between two substrates.

FIG. 27 illustrates the use of an LED chip 256 that emits light through all surfaces of the chip. For example, its cathode electrode may be a small metal electrode that contacts a transparent (e.g., ITO) current spreading layer. Such a chip 256 is sandwiched between two substrates 258 and 260 that have anode and cathode connectors 262 and 264 that contact the chips' electrodes and connect multiple chips in series, similar to the embodiments of FIGS. 20-26.

Figure 28:
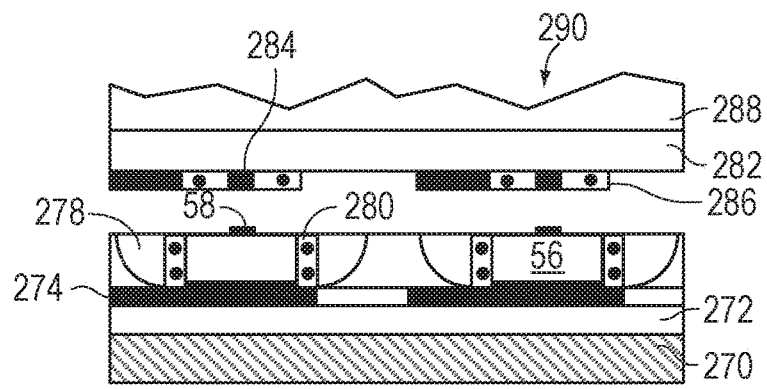
FIG. 28 illustrates a phosphor technique where the phosphor over the top of the LED chips is provided on the top substrate.

FIG. 28 illustrates an embodiment where the bottom substrate includes a reflective layer 270, such as aluminum, a dielectric layer 272, and conductors 274. The LED chips 56 are in reflective cups 278, such as molded cups with a thin reflective layer deposited in the cups. The cups 278 may be formed in a separate intermediate sheet that is laminated before or after the LED chips 56 are affixed to the bottom substrate. Phosphor 280 fills the area surrounding the LED chips 56. In one embodiment, the phosphor 280 may fill the entire cup 278 so that the cup 278 itself is the mold for the phosphor 280. In another embodiment, some or all of the light-emitting surfaces of the LED chips 56 are coated with phosphor 280 prior to the LED chips 56 being affixed on the bottom substrate.

The top substrate 282 has conductors 284 that contact the top electrodes 58 of the LED chips 56, and the conductors 274 and 284 may come in contact with each other using the various techniques described herein to connect the LED chips 56 in series. The top substrate 282 has formed on its surface a phosphor layer 286 that converts the LED chips' top-emitted light to white light. The top substrate 282 may have an optical layer 288 laminated over it. The optical layer 288 has a pattern 290 molded into it that is used to create any light emission pattern desired. The pattern 290 can be a Fresnel lens, diffuser, collimator, or any other pattern.

In one embodiment, the bottom substrate of FIG. 28 is 1-2 mm thick, the cup layer is 2-3 mm, the top substrate 282 is 1-2 mm, and the optical layer 288 is 2-3 mm, making the overall thickness about 0.6-1 cm.

Figure 29:
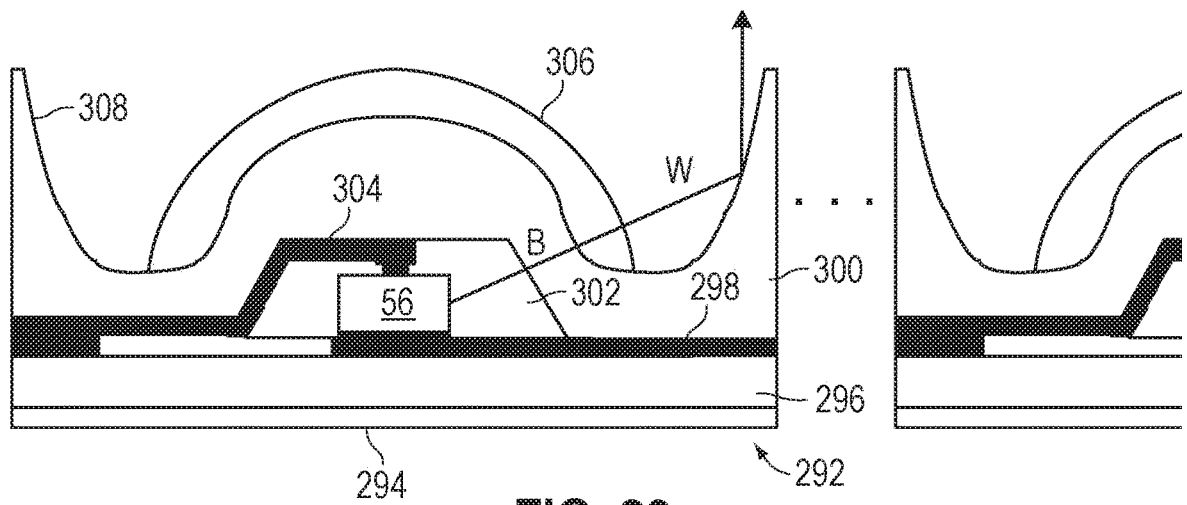
FIG. 29 illustrates a top substrate that is formed to have a hemispherical remote phosphor and reflecting grooves for reflecting side light toward a light output surface.

FIG. 29 illustrates a portion of a light sheet with a repeating pattern of strings of LED chips 56. The view of FIG. 29 is looking into an end of a series string of LED chips 56. A bottom substrate 292 includes a reflective layer 294 and a dielectric layer 296. Conductors 298 are formed on the dielectric layer 296, and LED chip electrodes are electrically connected to the conductors 298.

A top substrate 300 has cavities or grooves 302 that extend into the plane of FIG. 29 and contain many LED chips 56 along the length of the light sheet. If the top substrate 300 extends across the entire light sheet, there would be many straight or meandering grooves 302, where the number of grooves depends on the number of LED chips used. The top substrate 300 has conductors 304 that contact the top electrodes of the LED chips 56 and contact the conductors 298 on the bottom substrate 292 for creating series strings of LED chips 56 extending into the plane of FIG. 29. The series strings and light sheet structure may resemble that of FIG. 25, having an integral top substrate extending across the entire sheet. The conductors 304 may be transparent directly above the LED chips 56.

The portions of the top substrate 300 directly over the LED chips 56 have a phosphor coating 306 for generating white light. The top substrate 300 is molded to have reflecting walls 308 along the length of the string of LED chips to direct light outward to avoid internal reflections. The reflective walls 308 may have a thin metal layer. The top and bottom substrates may extend across an entire 2×4 foot light sheet. Alternatively, there may be a separate top substrate for each string of LED chips 56.

Figure 30A:
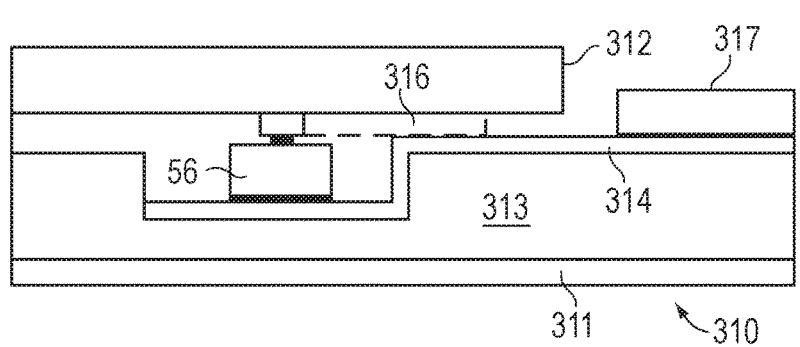
FIG. 30A illustrates an end of a sheet or strip where the bottom substrate is extended to provide connection terminals leading to the anode and cathode conductors on the top and bottom substrates for connection to a power supply or to another string of LEDs.
Figure 30B:
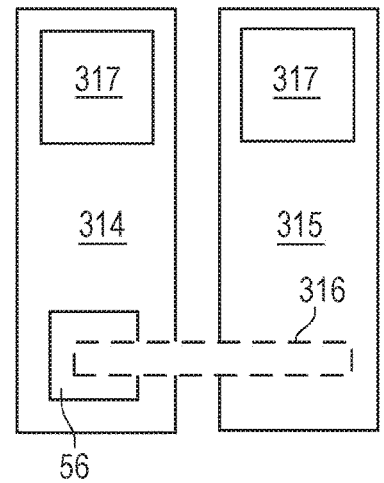
FIG. 30B is a top down view of FIG. 30A illustrating an example of the connection terminals at one end of a sheet or strip.
Figure 31:
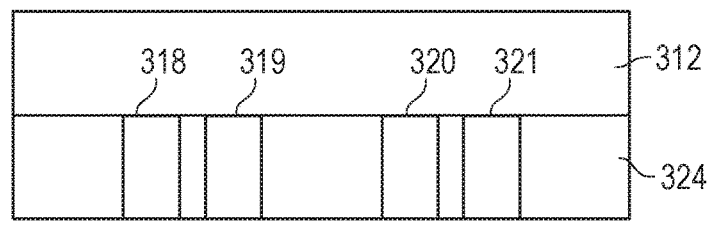
FIG. 31 is a side view of a portion of a longer strip of LEDs showing anode and cathode connection terminals at the ends of two serial strings of LEDs within the strip so the strings can be either connected together in series or parallel, or connected to other strings in other strips, or connected to a power supply.

At the end of each series string of LED chips or at other points in the light sheet, the anode and cathode conductors on the substrates must be able to be electrically contacted for connection to a current source or to another string of LED chips, whether for a series or parallel connection. FIGS. 30A, 30B, and 31 illustrate some of the many ways to electrically connect to the various conductors on the substrates.

FIG. 30A illustrates an end of a sheet or strip where the bottom substrate 310 extends beyond the top substrate 312, and the ends of conductor 314 and 315 on the bottom substrate 310 are exposed. Substrate 310 is formed of a reflective layer 311 and a dielectric layer 313. FIG. 30B is a top down view of the end conductors 314 and 315 on the bottom substrate 310 and an end conductor 316 on the top substrate 312. The conductor 316 contacts the anode electrode of the LED chip 56 and contacts the conductor 315.

The ends of the exposed portions of the conductors 314 and 315 are thickly plated with copper, gold, silver, or other suitable material to provide connection pads 317 for solder bonding or for any other form of connector (e.g., a resilient clip connector) to electrically connect the anode and cathode of the end LED chip 56 to another string or to a power supply. The connection pads 317 may be electrically connected to a connector similar to the connector 22 in FIG. 2 so the connections to and between the various strings of LED chips 56 can be determined by the customized wiring of the connector 22 to customize the light sheet for a particular power supply.

FIG. 31 is a side view of a portion of a light sheet showing plated connection pads 318-321 formed along the bottom substrate 324 that lead to conductors, such as conductors 314 in FIG. 30A, on the bottom substrate 324. Pads 318 and 319 may connect to the anode and cathode electrodes of an LED chip at the end of one string of LED chips, and pads 320 and 321 may connect to the anode and cathode electrodes of an LED chip at the end of another string of LED chips. These pads 318-321 may be suitably connected to each other to connect the strings in series or parallel, or the strings may be connected to power supply terminals. In one embodiment, a string of LED chips consists of 18 LED chips to drop approximately 60 volts. The pads 318-321 may act as surface mounted leads soldered to a conductor pattern on a support base, since solder will wick up on the pads 318-321 while soldering to the conductor pattern. The pads 318-321 may also be connected using a resilient clip connector or other means. The pads 318-321 may also extend to the bottom surface of the substrate 324 for a surface mount connection.

In the various embodiments, the material for the substrates preferably has a relatively high thermal conductivity to sink heat from the low power LED chips. The bottom substrates may even be formed of aluminum with a dielectric between the conductors and the aluminum. The aluminum may be the reflector 199 in FIG. 20A or other figures. The backplane on which the LED/substrates are affixed may be thermally conductive.

The various conductors on the transparent top substrates may be metal until proximate to each LED chip, then the conductors become a transparent conductor (e.g., ITO) directly over the LED chip to not block light. A conductive adhesive (e.g., containing silver) may be used to bond the LED chips' anode electrode to the ITO.

The wavelength converting material, such as phosphor, can be infused in the top substrate, or coated on the top substrate, or used in the LED chip's encapsulant, or deposited directly over the LED chip itself, or formed as a tile over the LED, or applied in other ways.

The LED chips/substrate structures may be mounted on any suitable backplane that may include reflective grooves in a straight or meandering path. It is preferable that the LED chips appear to be in a pseudo-random pattern since, if an LED chip fails (typically shorts), it will not be noticeable to a viewer.

The top substrate may be molded with any optical pattern to shape the light emission. Such patterns include Fresnel lenses or holographic microstructures. Also, or instead, an additional optical sheet may be positioned in front of the substrate structures for shaping the light, such as diffusing the light, to meet the requirements of office lighting directed by the Illuminating Engineering Society of North America, Recommended Practice 1-Office Lighting (IESNA-RP1).

In addition, having a plurality of strips of LED chips, with the strips having different optical structures for different light emission patterns, could be used with a controller that controls the brightness of each strip to create a variable photometric output.

The number of LED chips, chip density, drive current, and electrical connections may be calculated to provide the desired parameters for total flux, emission shape, and drive efficiency, such as for creating a solid state light fixture to replace standard 2×4 foot fluorescent fixtures containing 2, 3, or 4 fluorescent lamps.

Since the substrates may be only a few millimeters thick, the resulting solid state luminaire may be less than 1 cm thick. This has great advantages when there is no drop ceiling or in other situations where space above the luminaire is limited or a narrow space is desirable.

In embodiments where there is a conductor over the LED chip, a phosphor layer may be deposited on the inside surface of the substrate followed by an ITO deposition over the phosphor so that LED light passes through the ITO then excites the phosphor.

To avoid side light from the LED chips becoming scattered in the substrates and attenuated, 45 degree reflectors, such as prisms, may be molded into the bottom substrate surrounding each LED chip, similar to the prisms 70 in FIG. 7, to reflect light toward the light output surface of the light sheet.

Since the substrates are flexible, they may be bent in circles or arcs to provide desired light emission patterns.

Although adhesives have been describe to seal the substrates together, laser energy, or ultrasonic energy may also be used if the materials are suitable.

It is known that LED chips, even from the same wafer, have a variety of peak wavelengths so are binned according to their tested peak wavelength. This reduces the effective yield if it is desired that the light sheet have a uniform color temperature. However, by adjusting the phosphor density or thickness over the various LED chips used in the light sheet, many differently binned LED chips can be used while achieving the same color temperature for each white light emission.

The LEDs used in the light sheet may be conventional LEDs or may be any type of semiconductor light emitting device such as laser diodes, etc. Work is being done on developing solid state devices where the chips are not diodes, and the present invention includes such devices as well.

Quantum dots are available for converting blue light to white light (the quantum dots add yellow or red and green components to create white light). Suitable quantum dots can be used instead of or in addition to the phosphors described herein to create white light.

To provide high color rendering, the direct emissions of LED chips in the light sheet emitting red and green light can be controlled to mix with the white light emitted by phosphor-converted LED chips to produce a composite light that achieves high color rendering and enables the possibility of tuning the light by independent or dependent control of the red and green LEDs by open loop deterministic means or closed loop feedback means or any combination thereof. In one embodiment, different strings of LED chips have different combinations of the red, green, and phosphor-converted LEDs, and the strings are controlled to provide the desired overall color temperature and color rendering.

Since the light sheet is highly flexible and extremely light, it may be retained in a particular shape, such as flat or arced, using a light-weight frame.

Figure 32:
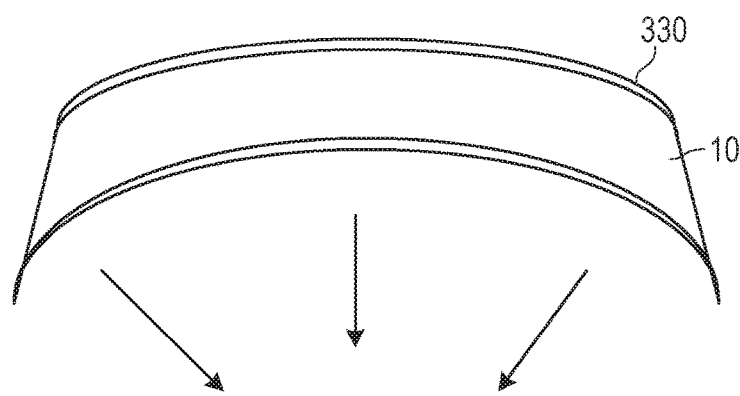
FIG. 32 is a perspective view of a frame for supporting a flexible light sheet strip or sheet to selectively direct light.

FIG. 32 is a perspective view of a plastic frame 330 for supporting the flexible light sheet strip or sheet 10 by its edges or over other portions of its surface (depending on the width of the light sheet) to selectively direct light toward an area directly under the light sheet. Other configurations are achievable. Thin sheets containing optical elements for further control of the light emission from the light sheet may be supported by the frame 330.

In some applications, it may be desirable to have a luminaire emit light generally downward and off the ceiling for a certain lighting effect. Accordingly, all the light sheet/strip embodiments may be adapted to create a bidirectional sheet or strip.

Multiple light sheets may also be mounted in a ceiling fixture as flat strips, and each strip is tilted at a different angled relative to the floor so that the peak intensities of the strips are at different angles. In one embodiment, the peak intensity is normal to the flat surface of the light sheet, assuming no re-directing lenses are formed in the light sheet. Therefore, the shape of the light pattern from the fixture can be customized for any environment and can be made to merge with light from other fixtures. In one embodiment, some light strips are angled downward at 55 degrees, and other light sheets are angled upward to reflect light off the ceiling.

Figure 33:
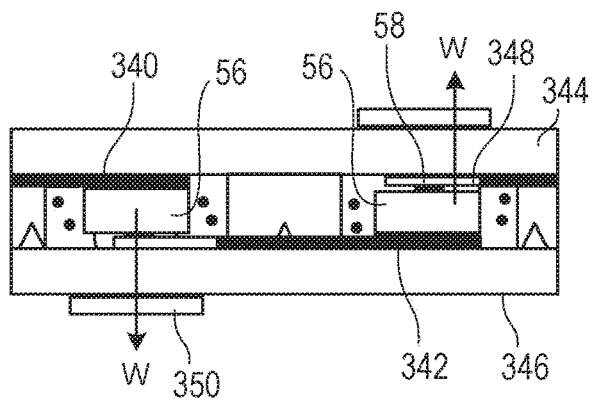
FIG. 33 illustrates LED dies that are oppositely mounted in a light sheet to create a bidirectional emission pattern.

FIG. 33 illustrates LED dies 56 that are oppositely mounted in a light sheet to create a bidirectional emission pattern. This is similar to FIG. 14, but there is no reflector covering the entire bottom substrate. In FIG. 33, any number of LED dies 56 are connected in series by alternating the orientation of the LED dies along the light sheet to connect the anode of one LED die to the cathode of an adjacent LED die using metal conductors 340 and 342 formed on the top substrate 344 and bottom substrate 346. The substrate electrodes contacting the LED electrodes 58, formed on the light-emitting surface of the LED dies, may be transparent electrodes 348 such as ITO (indium-doped tin oxide) or ATO (antimony-doped tin oxide) layers. A phosphor layer 350 may be deposited to generate white light from the blue LED emission.

Figure 34:
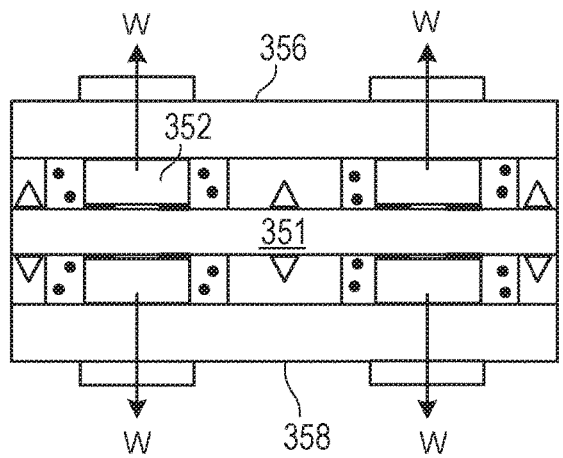
FIG. 34 illustrates two light sheets back-to-back, which may use a common middle substrate, to create a bidirectional emission pattern.

FIG. 34 illustrates two light sheets back-to-back, similar to the light sheet of FIG. 13, but sharing a common middle substrate layer 351. The LED dies 352 are shown as flip-chips, and the conductor layers for interconnecting the LED dies on each side in series are deposited on opposite sides of the middle substrate 351. The light sheet structure is sandwiched by transparent substrates 356 and 358. The middle substrate 351 may include a reflective layer that reflects all impinging light back through the two opposite surfaces of the bidirectional light sheet.

Figure 35:
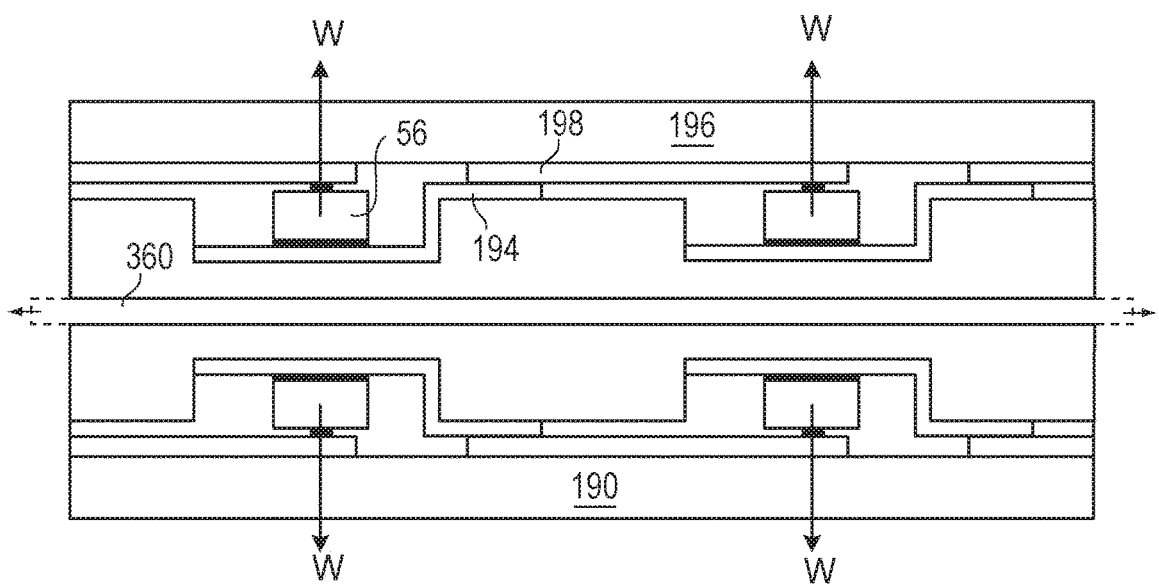
FIG. 35 illustrates another embodiment of two light sheets back-to-back to create a bidirectional emission pattern.

FIG. 35 is another example of two light sheets or strips, similar to the light sheet described with respect to FIG. 20B, affixed back-to-back with a middle reflective layer 360. The conductors 194 and 198 and substrates 196 and 190 are described with respect to FIGS. 20A and 20B. The light sheets may be affixed to the middle reflective layer 360 using a thin layer of silicone or other adhesive. Phosphor (not shown) may be used to convert the blue LED light to white light.

The middle reflective layer 360 may have as a property that it is a good conductor of thermal energy which can assist the traces 194 in dissipating the heat from the chips 56. There may be enough thermal mass within the middle layer 360 that it provides all of the heat sink required to operate the chips safely or it may be extended laterally (beyond the edges of the substrates 190 and 196, shown in dashed outline) to regions where the heat may be dissipated more freely to the air within the lighting fixture.

Any of the light sheet/strip structures described herein may be adapted to create a bidirectional light sheet.

The light output surfaces of the various substrates may be molded to have lenses, such as Fresnel lenses, that customize the light emission pattern, such as directing the peak intensity light 55 degrees off the normal, which is a desired angle to reduce glare and to allow the light to merge smoothly with light from an adjacent fixture. Different lenses may be formed over different LED dies to precisely control the light emission so as to create any spread of light with selectable peak intensity angle(s).

Figure 36:
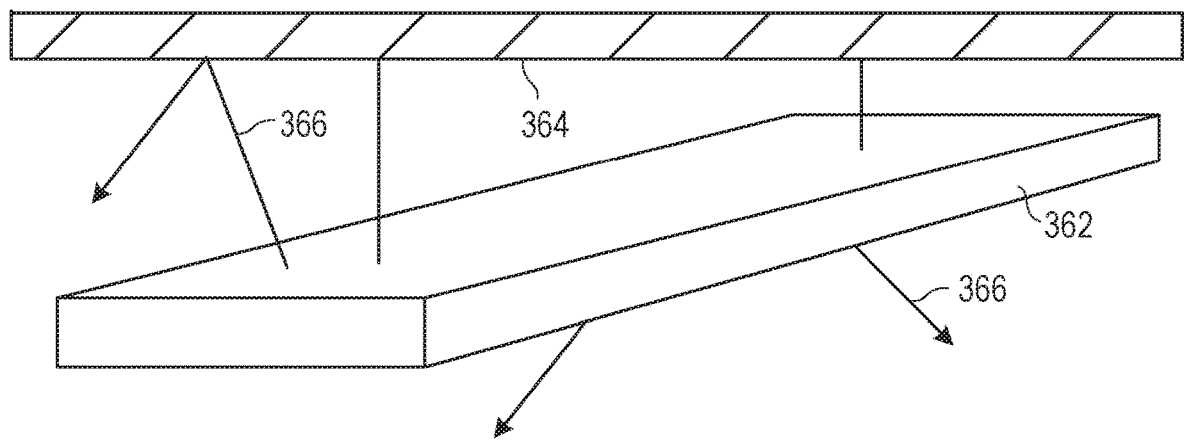
FIG. 36 illustrates a bidirectional light sheet hanging from a ceiling.

FIG. 36 illustrates a bidirectional light sheet 362 hanging from a ceiling 364. Light rays 366 are shown being reflected off the ceiling for a soft lighting effect, while downward lighting provides direct light for illumination. The light output surfaces of the light sheet 362 may be patterned with lenses, as described above, to create the desired effect. The top and bottom light emissions may be different to achieve different effects. For example, it would be desirable for the upward emitting light sheet to output the peak light emission at a wide angle to achieve more uniform lighting of the relatively proximate ceiling, while the downward emitting light sheet would emit light within a narrower range to avoid glare and cause the light to smoothly merge with light from an adjacent fixture. In one embodiment, the size of the light sheet 362 is 2×4 feet; however, the light sheet 362 can be any size or shape.

The top and bottom light emissions may also be adapted to have different spectral contents in addition to different optical dispersion characteristics. It is advantageous in some designs to consider that the soft fill light from above have one spectral content such as the lighter blue of daylight, for example 5600 Kelvin, and the direct light downwards having a preferred spectral content such as 3500 Kelvin, which mimics direct sunlight. The design of light sheet 362 is well suited to the creation of these two components. Furthermore, the modulation of light levels from the top and bottom light emissions may differ temporally as in the simulation of a day lighting cycle or to favor background illumination over direct illumination or in any combination as may be desired by users to increase their comfort and performance of tasks within the space.

Alternatively, the bidirectional light sheet 362 may be mounted in a conventional diffusively reflective troffer.

In one embodiment, the ceiling panels above the fixture may be infused with phosphor or other wavelength conversion material to achieve a desired white point from the ceiling light. In such a case, the light sheet may direct UV or blue light toward the ceiling.

In some applications, it may be desirable to provide a bidirectional light sheet emitting low intensity up-light and higher intensity down light, or vice versa. In the various disclosed embodiments of unidirectional light sheets having a reflective layer, the reflective layer may be omitted so there is a primary light emission surface and an opposing light leakage surface. The light leakage may be useful in certain applications, such as illuminating a ceiling to avoid a shadow and decreasing luminance contrast ratios.

To avoid any manufacturing difficulties with lamination and alignment, the snap-in structure of FIG. 37A may be used. The LED die 368 is mounted on a trapezoidal or frustum shaped base substrate 370. The base substrate 370 can have many other shapes that mate with a corresponding mating feature in a top substrate 372. The base substrate 370 can be small and support a single LED die 368 or may be a strip and support many LED dies (e.g., 18) connected in series. The conductor 374 connects to the die's top electrode 376, and the conductor 378 connects to the die's bottom electrode 380 via the base substrate's conductor 382. The conductors 374 and 378 extend into the plane of the figure to create a series connection between adjacent LED dies (anode to cathode) along the length of the top substrate 372 one example of which is shown in FIG. 37B.

Figure 37B:
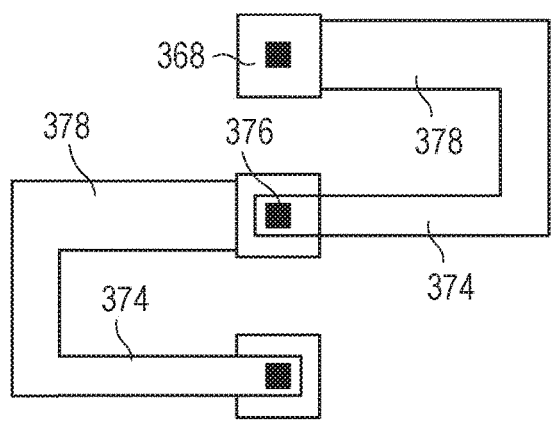
FIG. 37B illustrates the series connections formed on the top substrate for connecting the LED dies in series.

As seen in FIG. 37B, the conductor 374 connected to the LED's top (e.g., anode) electrode 376 leads to the conductor 378 connected to the adjacent LED's bottom (e.g., cathode) electrode. The serpentine pattern continues to connect any number of LEDs together. Many other conductor patterns may be used to make the series connections. Alternatively, the conductor pattern used make the series connections may be formed on the snap-in strips (supporting the LED dies 368).

At least the top substrate 372 is formed of a resilient material, such as transparent plastic or silicone, so as to receive the base substrate 370 and resilient fix it in place. The spring force will provide a reliable compressive force between the opposing conductors, so a conductive adhesive between the abutting metal surfaces may be optional. The resulting structure may contain a string of LED dies that can be mounted on a larger support substrate with other strings of LED dies, or the top substrate 372 may extend laterally to receive multiple strips of base substrates 370, each supporting a series string of LED dies. The resulting structure may resemble that of FIG. 25, where the substrates can be any length and contain any number of LED dies. FIG. 37A shows the replication of identical top substrates 372 as part of a single large substrate. The top substrate 372 may be molded to have side reflectors 384 coated with a reflector or with a diffused reflector. The half-cylindrical top surface of the top substrate 372 may have a phosphor layer 386 for generating white light. A remote optical sheet 388 may be molded with optical elements (e.g., prisms, lenses, etc.) to create any light emission pattern.

In one embodiment, the base substrate 370 is formed of a metal, such as aluminum, with a dielectric coating so that the base substrate 370 acts as a heat sink. Since the back surface of the base substrate 370 will be the highest part of the light sheet/strip when the light sheet is mounted in a ceiling or fixture, ambient air will cool the exposed surface of the metal.

In the various snap-in embodiments, the top substrate may be flexed to open up the edges of the receiving cavity or groove to allow the die substrate to easily snap in place. Alternatively, the top substrate may be heated to the point of plastic deformation such that the die substrate could also be readily inserted and the assembly then allowed to cool thereby locking the two parts together.

An encapsulant may be deposited along the sides of the die, which then squishes out when the die substrate snaps in place to encapsulate the die and provide a good index of refraction interface between the die and the top substrate.

The die substrates may be formed as a strip, supporting a plurality of spaced dies, or may be formed to only support a single die.

Figure 38:
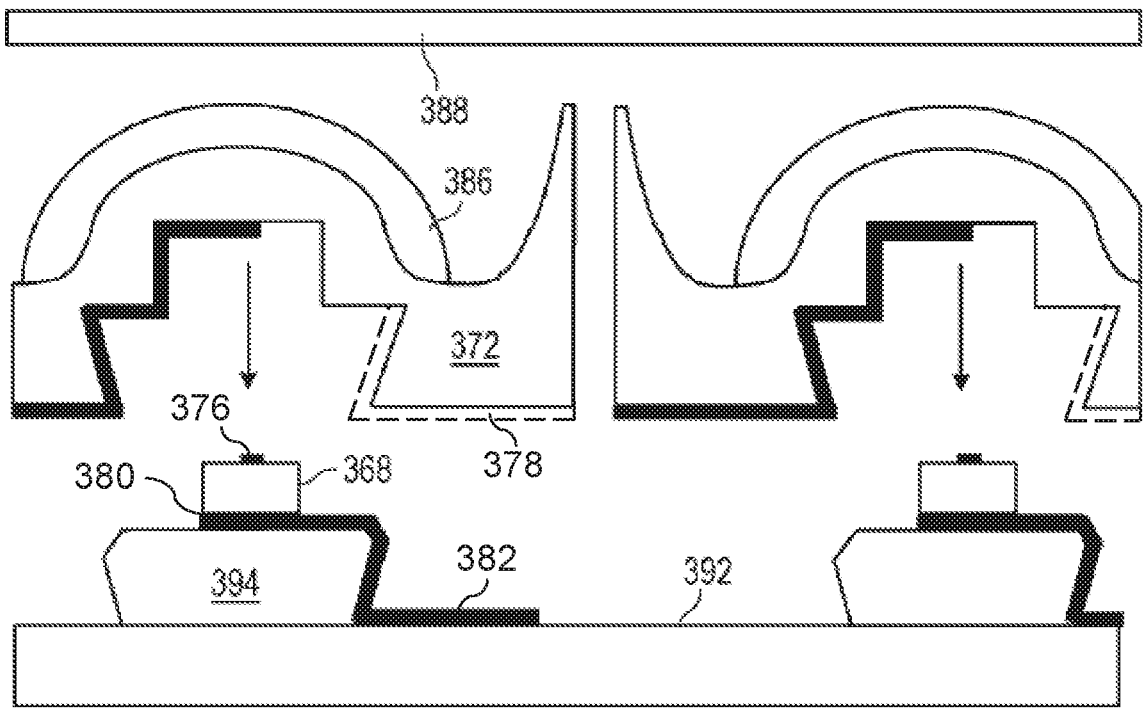
FIG. 38 illustrates how a plurality of top substrates may be snapped over a mating bottom substrate.

FIG. 38 illustrates how a plurality of top substrates 372 may be snapped over mating features of a single bottom substrate 392 that is molded to create islands or strips of snap-in features 394, similar to those described with respect to FIG. 37A. Using such snap-in techniques automatically aligns the top and bottom substrates and simplifies the electrical contacts for forming serial strings of LEDs. The conductor pattern of FIG. 37B may be used with all the snap-in embodiments to connect the LED dies in series.

The phosphor layer 386 may be different for each serial column of LED chips so that the overall color temperature of the light sheet can be adjusted by changing the brightness of the various series strings of LED chips. For example, a thinner phosphor layer 386 will create bluer light, and the brightness of the associated LED chips can be adjusted to make the overall color temperature higher or lower. Many variations can be envisioned where different chromaticity of each LED string phosphor layer 386 may be controlled to create tunable white light.

In one embodiment, the bottom substrate 392 is formed of one type of material, such as a dielectric, and the snap-in features 394 may be die substrates formed of a different material, such as metal.

Figure 39:
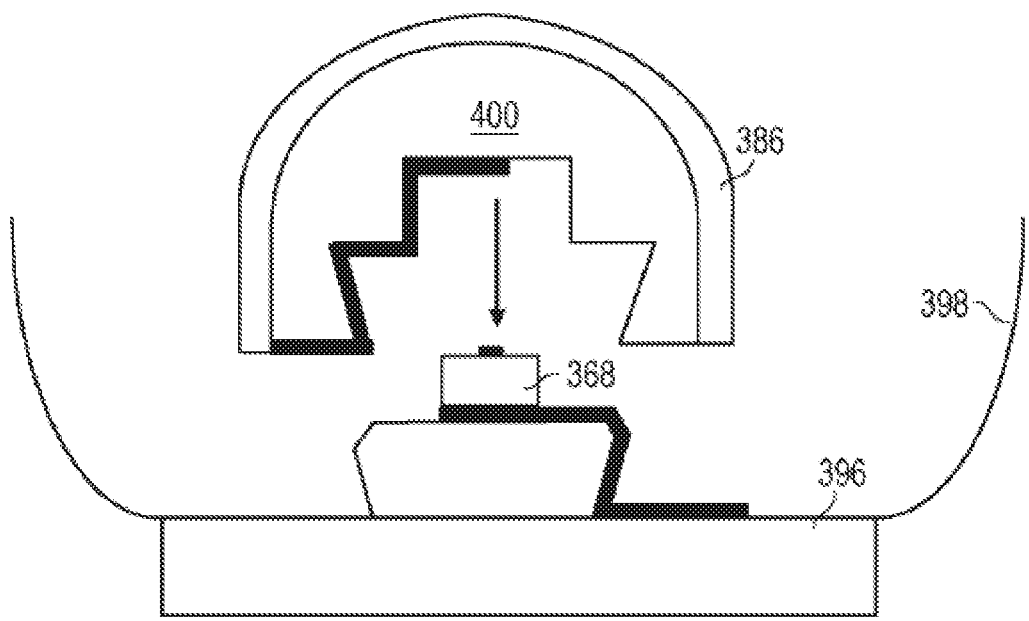
FIG. 39 illustrates that the bottom substrate may include one or more curved reflectors along the length of the LED strip to reflect side light toward an object to be illuminated.

FIG. 39 illustrates that the bottom substrate 396 may include one or more curved reflectors 398 along the length of the LED strip to reflect side light toward an object to be illuminated. The reflectors 398 may be part of a molded, single piece substrate 396. A reflective film may be deposited over the curved surface. The top substrate 400, resembling a half cylinder, snaps over the mating feature of the bottom substrate 396 and can be any length.

The top or bottom substrate in FIGS. 37A-39 may be formed with additional reflectors, such as prisms (previously described), that reflect an LED die's light toward the output surface when the light is emitted into and out of the plane of the figures. In addition, molded variations in the outer profile of the top substrate 400 in the longitudinal direction may be advantageous to increase light emission out of the top substrate out of the plane of the figures. Phosphor layer 386 on the top substrate may be a layer of any wavelength converting material which can alter the final emitted light spectrum from the device. There can be variations in the density and thickness of this coating to achieve a desirable spatial emitting pattern of light spectrum.

FIG. 40 is similar to FIG. 37A except that the LED die substrate 410 is fixed in place by a conductive adhesive 412 or solder reflow. There are no snap-in features in FIG. 40. Pressing the substrate 410 into the top substrate 414 causes the conductive adhesive 412 to make electrical contact with the conductors 374 and 378. Curing the conductive adhesive 412, such as by heat, UV, or chemical catalyst action creates a bond.

If required for heat sinking, the LED die substrate 410 may include a metal slug 416 for transmitting heat to the ambient air, or the die substrate 410 itself may be metal.

In all embodiments of a light sheet with a phosphor overlying the LED chips, the LED chips may first be energized and tested for color temperature and brightness before or after being part of the light sheet. Then, each phosphor tile or layer deposited on the top substrate over an associated LED chip can be customized for the particular LED chip to achieve a target white point. In this way, there will be color uniformity across the surface of the light sheet irrespective of the peak wavelength of the individual blue LED chips. However, even if the same phosphor tile were positioned over each LED chip, the large number of LED chips (e.g., 300-600) would ensure that the overall (averaged) emitted light from the light sheet will be consistent from one light sheet to another in the far field.

FIG. 41 illustrates a small portion of a bidirectional light sheet 420, similar to FIG. 35, positioned in front of an air vent 424 in a ceiling 425, where UV LED chips 426 are mounted in the upper portion, and blue LED chips 428 (along with phosphor) are mounted in the bottom portion. The top emission is UV for disinfecting air 430, and the bottom emission is white light for illumination. The direction of air flow around the fixture can either be from the ceiling down or it could be part of the return air path where the air flows upwards and around the fixture where it is recycled and re-used in the space.

FIG. 42 is similar to FIG. 41 but the air 440 is allowed to flow through holes 441 in the light sheet 442 and/or forced around the edges of the light sheet 442. The light sheet 442 may be installed as a ceiling panel. More specifically, FIG. 41 illustrates a small portion of a bidirectional light sheet 442 positioned in front of an air vent or air return duct in a ceiling, where UV LED chips 426 are mounted in the upper portion, and blue LED chips 428 (along with phosphor) are mounted in the bottom portion. The top emission is UV for disinfecting air 440, and the bottom emission is white light for illumination.

If a phosphor layer is positioned over an LED chip, the phosphor layer should ideally intercept all the blue light emitted from the LED chip. However, due to light spreading in the transparent top substrate, the blue light may spread beyond the edges of the phosphor layer, creating an undesirable blue halo. FIG. 43, similar to FIG. 20B, illustrates how a lens 446 may be formed (e.g., molded) in the top substrate 448 on the surface opposing the LED chip 450. In one embodiment, the lens 446 is a Fresnel lens. The lens 446 serves to collimate the LED light 452 so that a larger percentage of the blue light impinges on the phosphor tile 454. This will avoid a blue halo around each LED area. A lens in the top substrate may be employed for other purposes to create any light emission pattern.

Although the examples of the light sheets herein have used blue LED chips with phosphors or other wavelength conversion materials (e.g., quantum dots) to create white light, white light may also be created by mixing the light from red, green, and blue LED chips, as shown in FIG. 44. FIG. 44 illustrates that red LED chips 456, green LED chips 457, and blue LED chips 458 may make up the light sheet 460 (similar to that of FIG. 20B) and be controllable to achieve any white point. Other combinations of LED chips and phosphor converted LED chips, or assemblies, can also be combined in numerous ways to produce different possible gamuts of light that can be controlled to produce specific color and white points.

The LED chips of a single color may be connected in series, and the relative brightness of the strings of LED chips is controlled by current to achieve the desired overall color or white point of the light sheet.

In another embodiment, various strings of LED chips may be phosphor-converted chips producing white light. Other strings may be composed of LED chips producing red, green, or blue light to allow those strings to be controlled to add more red, green, or blue to the white light.

Alternatively, all blue or UV LED chips may be used but the phosphors may be selected for each LED area to generate either red, green, or blue light. The relative brightness of the red, green, and blue light may be controlled to generate any overall color or white point.

FIG. 45, similar to FIG. 20B, illustrates that blue and infrared LED chips may make up the light sheet 470, where blue LED chips 458 are used for generating white light in conjunction with some form of wavelength converting material, and the infrared LED chips 472 are only energized while the blue LEDs are off, such as in response to a motion sensor, for providing low energy lighting for surveillance cameras. No phosphor is used with the IR chips. It is known to generate IR light by dedicated fixtures for surveillance camera illumination, but incorporating IR LED chips in light sheet fixtures that contain other chips for producing white light for general illumination of a room is an improvement and creates synergy, since the locations of the white light fixtures ensure that the IR light will fully illuminate the room.

Various light sheet embodiments disclosed herein have employed conductors on the inner surfaces of the top and bottom substrates opposing the LED chip electrodes. FIGS. 46A and 46B illustrate a technique where the conductors are formed on the outside surface of the substrates for possible improvement in electrical reliability and heat sinking. FIG. 46A illustrates masked or focused laser light 480 ablating openings 484 in a top substrate 486 and a bottom substrate 488 of a light sheet 489 for exposing the top and bottom electrodes of LED chips 490. Also, areas of the light sheet may be completely ablated through for forming a series connection. The laser may be an excimer laser. A reflector layer 492 is also shown. FIG. 46A may also be formed by plastic deforming two plastic substrate layers such that LED chips 490 are encased between the two sheets of material 488 and 486 under the correct temperature and pressure.

Once encased, their top and bottom contacts are exposed by laser removal of materials down to the electrical contact points on the die.

In FIG. 46B, a metal 494, such as copper or aluminum, or a conductive metallic composite material, fills the openings 484 to electrically contact the LED chips' electrodes. Metal deposition may be by printing, sputtering, or other suitable technique. If a phosphor layer is used, the phosphor may be deposited before or after the laser ablation and before or after the metal deposition. In the example, the metal 494 fills the openings 484 and also forms a conductor pattern that connects any number of LED chips in series. The metal contacting the bottom electrode of the LED chips will also sink heat since it will be facing upward when the light sheet is installed as a fixture.

Some blue LED chips, such as the SemiLEDs SL-V-B15AK vertical LED, are extremely thin, so there is minimal side light and high extraction efficiency. The thickness of the SL-V-B15AK die is only about 80 microns, which is less than a typical sheet of paper (about 100 microns). The bottom surface area of the SL-V-B15AK is about 400×400 microns. The data sheet for the SL-V-B15AK is incorporated herein by reference. In one embodiment of a light sheet to replace a standard 2×4 foot fluorescent lamp troffer, there are about 500 LED chips, with an average pitch of about 2 inches (5 cm). By using such thin LED chips, the flexibility and plasticity of the substrates allows the substrates to seal around the LED chips, obviating the need for any cavity, groove, or intermediate layer to accommodate the thickness of the LED chip. An encapsulant may be unnecessary for light extraction if there is direct contact between the top substrate and the top surface of the LED chip.

FIGS. 47A-47C illustrate sandwiching a thin LED chip 500 between two substrates 502 and 504 without the use of any cavity, groove, or intermediate substrate layer to accommodate the thickness of the LED chip 500. Thin LEDs having a thickness equal to or less than 200 microns can be encapsulated by the deformation of one or both of the substrates over the LEDs during lamination. Heating the substrates during lamination softens the substrates to improve the conformance of the substrates to the thickness of the LEDs. The bottom substrate 502 has a conductor pattern 506 with an electrode 507 for bonding to the nominal wire bond electrode 508 of the LED chip 500. A typical conductor (a metal trace) thickness is less than 35 microns. A small amount of a conductive adhesive 510 (e.g., silver epoxy) may be deposited on the electrode 507. The electrode 507 may be a transparent layer, such as ITO. An automatic pick and place machine uses machine vision to align the LED chip 500 with a fiducial formed in the conductor pattern 506. A typical placement tolerance for such pick and place machines is on the order of 20 microns. The LED chip electrode 508 has a width of about 100 microns, so bonding the electrode 508 to the substrate electrode 507 is a simple task.

A very thin layer of silicone may be printed on the surface of the bottom substrate 502 as an adhesive and to seal around the LED chip 500.

If relatively large transparent substrate electrodes are used to contact the nominal wire bond terminals of the LEDs, positioning the LEDs is not as critical, so the LEDs may be positioned with their wire bond terminals facing upward, and the top substrate transparent electrodes may easily be aligned with the wire bond electrodes of the LEDs.

Next, the top substrate 504 is laminated over the bottom substrate 502. The top substrate 504 has a conductor pattern 520 that makes electrical contact with the LED chip bottom electrode and the conductor pattern 506 on the bottom substrate to create a serial connection between LED chips. A small amount of conductive adhesive 522 is deposited on the conductor pattern 520 to ensure good electrical contact.

FIG. 47B illustrates a simplified portion of the laminated light sheet, however, in an actual device, the top and bottom substrates (along with any thin silicone layer) will conform to the LED chip 500 and bend (deform) around it to seal the chip. In one embodiment, one or both substrates have a thickness of less than 2 mm to allow flexibility yet provide sufficient material to enable adequate conformity around the LEDs.

Any lens structures may be formed in the top substrate 504, such as hemispherical lenses.

FIG. 47C is a bottom up view of FIG. 47B illustrating the series connections between LED chips. Many other conductor patterns may be used to create the serial connection.

FIG. 48 is a perspective view of a solid state lighting structure 604 that can directly replace standard fluorescent lamps in fixtures as a retrofit for reducing energy consumption and adding controllability. A light strip 606, representing any of the embodiments described herein, is supported by any means between two sets of standard fluorescent lamp electrodes 608 (or suitable facsimiles) that provide drive power to the LED dies on the strip 606. In one embodiment, the light strip 606 is bidirectional. The electrodes 608 will typically provide the only physical support of the structure 604 within the fixture. In another type of fixture, the structure 604 may be additionally supported along its length by a support attached to the fixture. The electrodes 608 may provide a non-converted mains voltage to a converter on the strip 606 or in a separate module. It is preferable that the driver convert the mains voltage to a higher frequency or DC voltage to avoid flicker. Drivers for strings of LED dies are commercially available. Alternatively, the converter may be external to the structure 604 so the electrodes 608 receive the converted voltage. Further, the structure 604 may also be adapted to work with the standard output from the retrofit fluorescent ballast. Air vents may be made along the structure 604 to remove heat. In one embodiment, the light strip 606 is within a transparent or diffused plastic, or glass, tube for structural integrity. The tube may also have optical characteristics for mixing and shaping the light.

Any number of light strips 606 may be supported between the electrodes 608, and the light strips 606 may have different emission patterns or angles. For example, some light strips 606 may emit a peak intensity at 55 degrees relative to the normal, while others may emit a peak intensity at 0 degrees. The brightness of each strip 606 may be controlled to provide the desired overall light emission for the structure 604. In one embodiment, the structure 604 is about four feet long.

It is further advantageous to recognize that the US Department of Energy in their testing has noted that many of the commercially available fluorescent type replacement products utilizing LED sources fail to interact correctly with the fixture and produce the incorrect illumination patterns or create undesirable glare that is outside the accepted practice known as RP1. It is another object of the invention to adapt the optics of the sheet within the tube so that it provides a more favorable distribution of light from the light fixture.

The planar light sheet 606 may be pivotally suspended from and connected between two ends of the outer tube structure 604 by means of a pivot joint 609. This allows the light sheet 606 to be turned such that its top and bottom faces may be presented in any orientation within the light fixture once the electrodes are mechanically locked and energized.

This ability to orient the light sheet independent of the ends provides a means for the installation and commissioning staff to adjust the light distribution within the fixture to suit user preference or to comply with field lighting requirements. Since the tube can have openings, it is an easy task to insert a tool through a hole to tilt the light sheet 606.

In another embodiment, the outer tube of the structure 604 is eliminated, and the light strip 606 is supported by the electrodes 608. This improves heat and light extraction. If required, the light strip 606 may be supported by an additional support rod or platform between the electrodes 608.

FIG. 49 illustrates how the fluorescent tube form factor may be changed to have a flat surface 610 that supports the light strip 606 (FIG. 48) and improves heat transfer to the ambient air. When the structure 612 of FIG. 49 is mounted in a fixture, the flat surface 610 will be at the highest point to allow heat to rise away from the structure. Air vents 614 may be formed in the flat surface 610 and through the light sheet, if necessary, to allow heated air to escape. The flat surface 610 may also have patterns of corrugations at the same or different scales (e.g., wide/deep and narrow/shallow) to enhance heat dissipation. Since only low power LED dies are used in the light sheet, and the heat is spread over virtually the entire area of the light sheet, no special metal heat sinks may be needed, so the structure 612 is light weight, comparable to a standard fluorescent lamp. This may allow the structure 612 to be supported by the electrode sockets in a standard fixture. In some embodiments, the structure 612 may be lighter than a fluorescent tube, since the structure is only half a cylinder and the tube material can be any thickness and weight.

In another embodiment, the flat surface 610 may be a thermally conductive thin sheet of aluminum for spreading heat. The light strip 606 may include metal vias distributed throughout it and thermally connected to the sheet of aluminum to provide good heat sinking from the LED chips. The aluminum sheet may also add structural stability to the light strip 606 or structure 612.

FIG. 50 is a cross-sectional view of a fixture 616 incorporating the light structure 612 of FIG. 49, with the light strip 606 being supported by the top flat surface 610 of the structure 612 and showing heated air 618 escaping through vents 614 in the flat surface 610 and through corresponding holes (not shown) in the LED strip 606. LED dies 624 are shown. A voltage converter 622 is shown internal to the structure 612, but it may be external.

In the example of FIG. 50, there are three different light strips or portions 626, 627, and 628, each having a different peak light intensity angle to allow the user to customize the light output of the fixture 616. Three light rays 629, 630, and 631, representing the different peak light intensity angles, illustrate that the different light strips or portions 626-628 have different emission properties. The light emission of a strip may be customized by the angles of reflectors making up the strip, or external to the strip, or lenses molded into the top surfaces of the strips.

FIG. 51 is a side view of an embodiment where the flexible light sheet 650 is bent to have a tube shape to emulate the emission of a fluorescent tube. The light sheet 650 may be any of the embodiments described herein. The light sheet 650 may have holes 652 to allow heat to escape. End caps 654 interface the light sheet 650 to the standard electrodes 656 typically used by fluorescent tubes. A supporting rod may be incorporated in the middle between the caps 654 to provide mechanical support for the structure.

A larger, substantially cylindrical structure, but without the protruding electrodes 656, may instead be suspended from a ceiling as a standalone fixture. Such a fixture will illuminate the ceiling and floor of a room.

FIG. 52 is a perspective view of a light sheet 670, illustrating that a bidirectional light sheet may be bent to have a rounded shape. The top emission 672 may illuminate a ceiling, and the bottom emission 674 will broadly illuminate a room. The orientation of the bidirectional light sheet 670 may be reversed to provide more directed light downward.

FIG. 53 is a perspective view of a fixture 678 that includes a bidirectional light sheet 680 suspended from a top panel 682 by wires 683. The top emission 684 impinges upon the top panel 682, where the top panel may be diffusively reflective or have a phosphor coating that can convert the upward blue light from the LED chips to substantially white light. Some ratio of the blue light may be reflected and some may be absorbed and converted by the light converting material in the panel such that the composite light output is substantially white light that is emitted into the room. The top panel 682 will typically be much larger than the light sheet 680. This may be appropriate for a light fixture for very high ceilings, where the fixture is hung relatively far from the ceiling. If the top panel 682 is coated with a phosphor, interesting lighting and color effects may be created. The top emission 684 may be blue or UV light, and the bottom emission 686 may be white light. The top panel 682 may be any shape, such as a gull wing shape or V shape to direct light outward.

In the various embodiments, the phosphor, whether infused in the top substrate or a separate layer, may be varied to take into account the higher blue light intensity directly over the LED chip compared to the intensity at an angle with respect to the chip. For example, the phosphor thickness or density may be tapered as the phosphor extends away from the blue LED chip to provide a consistent white point along the phosphor area. If the phosphor is infused in the top substrate, the top substrate may be molded or otherwise shaped to have varying thicknesses for controlling the effective phosphor thickness. Alternatively, optics may be formed beneath the phosphor to provide more uniform illumination of the phosphor by the LED chip.

For improved heat extraction, any portion of the bottom substrate (which will be the highest surface when the light sheet is attached to/in a ceiling) may be metal.

Any portion of the light sheet may be used as a printed circuit board for mounting a surface mount package or discrete components, such as driver components. This avoids the use of costly connectors between the package/component terminals and the conductors in the light sheet.

FIGS. 54A and 54B illustrate one way to encapsulate the LED dies after being laminated between the top and bottom substrates. Any of the embodiments may be used as an example, and the embodiment of FIG. 20B is used to illustrate the technique.

FIG. 54A is a top down view of a portion of a transparent top substrate 740 with holes 742 for filling spaces around the LED dies 744 (shown in dashed outline) with an encapsulant and holes 746 for allowing air to escape the spaces. The holes may be formed by laser ablation, molding, stamping, or other method. Representative conductors 748 are also shown formed on the top substrate 740.

FIG. 54B is a cross-sectional view of a laminated light sheet 750 showing a liquid encapsulant 752, such as silicone, being injected into the empty space 753 around each LED die 744 through the holes 742 in the top substrate 740. The injector 756 may be a syringe or other tool nozzle typically used in the prior art to dispense silicone over LED dies before mounting a lens over the LED dies. Air 758 is shown escaping from the holes 746. The syringe will typically be a programmed mechanism. By using the encapsulation technique of FIG. 54B, the lamination process is simplified since there is less concern about the insulating encapsulant preventing good contact between the LED electrodes and the substrate electrodes. Further, the viscosity of the encapsulant may be low so that the liquid encapsulant fills all voids in the space around the LED dies. Any excess encapsulant will exit from the air holes 746. When cured, the encapsulant will seal up the holes 742 and 746. Curing may be by cooling, heating, chemical reaction, or UV exposure.

The encapsulant may include phosphor power or any other type of wavelength conversion material, such as quantum dots.

As an alternative to using an injector 756, the liquid encapsulant 752 may be deposited using a pressured printing process or other means.

FIGS. 55A and 55B illustrate another encapsulation technique used to ensure that the space around the LED dies is completely filled with an encapsulant. The embodiment of FIG. 20B will again be used in the example, although the technique can be used with any of the embodiments.

FIG. 55A is a cross-sectional view showing a blob of a softened encapsulant material 760 deposited over the LED dies 762 prior to the top substrate 764 being laminated over the bottom substrate 766. There is a small reservoir 768 formed in the bottom substrate 766 for receiving excess encapsulant to avoid excessive internal pressure during the lamination process.

FIG. 55B illustrates the softened encapsulant material 760 being pressed and spread out within the space around the LED dies 762, with any excess material overflowing into the reservoir 768. The space around the LED dies 762 may be, for example, a rectangle or circle around the LED dies, or the space can be an elongated groove.

In FIG. 56A, thin LEDs 780 are first sandwiched between a bottom substrate 782 and a top substrate 784. The substrates 782 and 784 may be created from polymer material, silicones, or even low melt temperature glass or combinations thereof. There may be a reflective layer 786 on the bottom substrate 782. The thinness of the LEDs 780, such as less than 200 microns, allows the substrate layers (especially if heated) to conform around the LEDs 780 and encapsulate them. The LEDs 780 will typically be of the type that have had their growth substrate (e.g., sapphire, SiC, GaAs) removed so that they are relatively thin when compared to the substrate thickness. In one embodiment, there are no conductive traces formed on the substrates. To access the electrodes on the LEDs 780, a laser beam 790 from an excimer laser, or other suitable laser, is focused over the electrodes or masked so as to ablate the substrates to expose all or a portion of the contact electrodes. The ablation inherently stops once the substrate has been removed. Sacrificial stop layers or extra metallization may be employed in the processing of the contact electrodes to facilitate a clean removal of material down to the electrical contact area. In the example, the LEDs 780 are vertical LEDs, but the LEDs may also be horizontal LEDs (both electrodes on same surface). If the LEDs are horizontal type, then the contact ablation procedure only needs to be carried out on one side of the laminated structure, and the electrical interconnects are made from only one side. The structure may be a light sheet having a two-dimensional array of LEDs, or it may be a narrow light strip (e.g., width less than 10 mm) having one column of LEDs.

FIG. 56B illustrates the light sheet/strip of FIG. 56A where the openings 792 are filled with a conductive material 794, and the conductive material 794 is patterned to connect some or all of the LEDs 780 in series or in any other configuration. The conductive material 794 may be aluminum, copper, silver, a conductive paste, or any other suitable conductor deposited by sputtering, evaporating, plating, printing, silk screening, or deposited in any other way. The conductive material 794 may be patterned by a conventional masking and etching process, or another process, to interconnect the LEDs 780, such as in series or in series/parallel. The external conductors improve heat dissipation to the ambient air and allow the interconnections to be customized during the metallization step independent from the substrate lamination step.

The structures described herein may be formed using various types of lamination processes. One practical process for mass production is a roll-to-roll process, where the substrates are originally provided on rolls. Another method may be via a panel lamination process whereby panels or strips of substrate material are laminated in a vertical press operation.

FIG. 57 illustrates a roll-to-roll process, where two substrates 800 and 802 are laminated together with LEDs 804 inserted in-between. The LEDs 804 may be supported by a very thin sheet (not shown) or separately placed on the bottom substrate 802. Any conductor technique can be used to connect the LEDs in series or in any other configuration, such as by using traces on the inside surfaces of the substrates or on the outside surfaces. A laminating roller 806 provides even pressure, and optionally heat, to encapsulate the LEDs 804. The substrates may be in sheets or strips. A take-up roll (not shown) may receive the laminated structure. If the conductors are accessible at intervals, the strips may later be cut to any length.

FIG. 58A illustrates a roll-to-roll process where a laser ablates openings 810 in the top and bottom substrates 800 and 802 for interconnecting the LEDs 804 with a conductive material, similar to FIG. 56B.

FIG. 58B illustrates how the choice of LEDs could also include LEDs that have pre-applied phosphor layers 812 on their light emitting surfaces so that the light conversion process occurs in proximity of the LED die. If phosphor layers 812 are applied to the LED die prior to lamination between the substrates, then the ablation process is ideally suited to also ablate a portion of the phosphor layer through to the electrode layer on the top of the die. This simplifies the design of the light sheet/strip since a phosphor does not need to be deposited on the substrate, and color uniformity will typically be improved. Depositing a phosphor layer over an LED may be performed using well-known processes. When the phosphor is ablated away through to the electrode layer, then the conductive material 794 (FIG. 56B) can be applied such that it creates an electrical contact with the die. This is a significant improvement in the art since it eliminates several processing steps that normally occur in the downstream packaging process and puts them closer to the wafer processing level where the economy of scale is better supported.

FIG. 59 illustrates a roll-to-roll process where the LEDs 814 are flip-chips, and the bottom substrate 802 has a conductor pattern that interconnects first and second die electrodes 817 of the LEDs.

Side emissions from bare LEDs may be a concern since the LED light (e.g., blue light) may not be uniformly converted to white light by phosphor, either positioned over the LED or around the LED. FIG. 60 is a cross-sectional view of a single light source element 818 that is positioned by a pick-and place machine onto a bottom substrate 820, where the element 818 is an LED 822 mounted in a reflective cup 824 to avoid issues with side emission. The reflective cup 824 may be plastic with a reflective coating, etched silicon with a reflective coating, or other material. If the cup 824 is a dielectric, a conductive via 826 may be formed through it to contact the bottom electrode of the LED 822. Conductors (not shown) on the substrates connect the LEDs in any configuration. The height of the cup 824 is preferably about even with the top of the LED 822 to reflect almost all of the side light into a narrow beam for conversion to white light by a phosphor layer over the LED 822. The LED 822 may be encapsulated by depositing silicone in the cup 824 around the LED 822. The cup 824 may also help protect the delicate LED 822 during the lamination process and improve heat sinking from the LED 822. A top substrate 823 provides electrical connections to the anodes of the LEDs 822 for connecting them in series.

FIG. 61 is a cross-sectional view of a light sheet/strip, where the bottom substrate 830 is a reflective sheet, such as Miro-4™, that is formed with indentations 832, where the sides of the indentations 832 reflect side light from the LEDs 834 upward. Miro-4 is a well-known reflective sheet having multiple layers, including a reflective aluminum layer. The indentations 832 may be made by coining, using a mold or die. Since the top surface of the substrate 830 is a dielectric, conductors may be formed on it for interconnecting the LEDs 834. The top substrate 836 may have conductors as well and support a phosphor layer over each indentation 832. Multiple LEDs may even be mounted within a single indentation 832 for mixing the light.

In all embodiments, the phosphor layer may be phosphor infused in a separately formed optical layer, or covering a separately formed optical layer, that is laminated over the light sheet/strip, where the "remote" phosphor converts the blue LED light to white light. The optical layer may also diffuse the light.

Various techniques have been described above for improving the uniformity of color temperature across the light sheet or strip or for providing an overall target color temperature. Due to the use of the disclosed light sheets/strips being preferably for general illumination, adequate light mixing may occur at a distance in front of the light sheet/strip, rather than requiring all areas of the light sheet/strip to output a uniform color temperature, which may be a requirement for an LCD backlight. By relaxing the requirements for near-field color uniformity, LEDs from different bins may be used in a single light fixture to greatly increase the effective yield of the LEDs. Therefore, it is desirable to have a technique for using LEDs from a variety of bins while achieving a target color temperature or target spectral distribution at some distance in front of the light fixture.

FIG. 62 is a front view of a 2×4 foot solid state fixture 840, where the light sources are LEDs encapsulated in strips 842. The support structure 844 for the strips 842 may be reflective and provide power supply terminals connected to the strips. In one embodiment, the fixture is divided up into eight sections 846. Only strips in four sections 846 are shown for simplicity. There may be any number of strips 842 per section 846. In one embodiment, all strips 842 in a single section 846 are powered by a single power converter providing, for example, 40 volts, and each strip 842 is connected to its own current source.

FIG. 63 is a flowchart of the process used to form the fixture of FIG. 62.

Each strip 842 is formed by LEDs from a variety of bins, where a bin number just identifies a particular narrow range of peak wavelengths, typically within the blue color range. In another embodiment, LEDs from only a single bin are used to form a strip, but different strips are formed from different bins of LEDs. Once a strip is formed, the phosphor provided in the strip will convert the LEDs' blue light to white light having a particular correlated color temperature (CCT). Strips 842 formed by the same combination of LEDs will have similar overall CCTs. However, to use essentially all of the LEDs in the different bins, the strips 842 will have a variety of overall CCTs. Each strip 842 is energized and optically tested to determine its overall CCT or spectral distribution. The strips 842 are then binned according to their CCT or spectral distribution (step 850 in FIG. 63). An algorithm is then used to determine the various combinations of strips 842 in a single section 846 that will result in the section 846 generating the same target color temperature for the fixture (step 852). The strips 842 from the different bins are then combined so that each section 846 generates approximately the same target color temperature or spectral distribution (step 854). The light from the different sections 846 will blend together. Further, a reflective support structure 844 aids in the mixing of light.

Accordingly, virtually all the LEDs in the bins will be used, while the overall color temperature of each fixture 840 will be consistent, and there will be good color uniformity across the fixture 840. Furthermore, there can also be an enhancement to the overall Color Rendering Index (CRI) of the resultant fixture due to the broadening of spectral power distributions that are inherent in this mixing of many different bins of LEDs.

The technique of FIGS. 62 and 63 can be applied to any size luminaire having any number of sections. For example, the luminaire can be 2×2 feet and there may be four sections comprised of LED strips, where each section has a substantially identical CCT due to the selection of strips making up each section.

FIGS. 64-84 illustrate various additional techniques for forming LED strips and LED sheets, where the interconnection pattern for serially connecting the LEDs is formed over the outer surface of the top substrate. Such techniques may be used to form variations of any of the embodiments described herein.

FIG. 64 is similar to FIG. 19A and illustrates bottom electrodes (e.g., anodes) of the LED chips 56 bonded to the conductors 178 on the bottom substrate 176. For a series connection between LED chips 56, the metal interconnectors 180 are also bonded to the conductors 178. The intermediate sheet 182 has holes that correspond to the LED chip 56 locations and interconnector 180 locations, and the tops of the chips 56 and interconnectors 180 are approximately planar with the top of the intermediate sheet 182. The areas surrounding the LED chips 56 may be filled in with a phosphor/silicone mixture 72.

FIG. 65 illustrates a top substrate material 870 deposited over the LED chips 56. The material 870 may be a light-transmissive laminated polymer sheet, a sprayed on silicone layer, or any other solid or liquid material. If the material 870 is deposited as a liquid or a softened material, it can be used as an encapsulant instead of the mixture 72. The material 870 is then cured if necessary. The substrate material in all embodiments described herein may be infused with a YAG phosphor or other wavelength conversion material to convert the blue LED light to white light.

An excimer laser beam 872 is then automatically controlled to drill small holes over the top cathode electrodes 874 and over the interconnectors 180. The laser drilling will automatically stop at the metal. The laser beam 872 may be optically aligned with targets or may be aligned with a fiducial on the bottom substrate 176. Laser drilling to form vias is a well known process in the field of integrated circuitry.

In another embodiment, the holes are preformed in the top substrate material 870 using any technique, such as stamping, molding, or laser drilling, prior to the top substrate being positioned over the LED chips 56.

FIG. 66 illustrates a thin metal seed layer 876 deposited over the surface of the structure by sputtering or other technique. In one embodiment, the seed layer 876 is TiN followed by copper.

FIG. 67 illustrates the seed layer 876 being selectively patterned with a photoresist 878 to cover areas that are not to be plated with copper.

FIG. 68 illustrates the exposed seed layer 876 electroplated with copper 880 to any thickness suitable for the current conducted by the series connection of LED chips 56. Depositing a seed layer followed by electroplating copper is a well known technique in the field of integrated circuitry.

FIG. 69 illustrates the LED structure after the photoresist 878 has been stripped away, using conventional techniques, and after a blanket etch in which the exposed seed layer 876 has been etched away, resulting in the LED chips 56 being connected in series. Any number of LED chips 56 may be connected in series in this way.

FIG. 70 is a top down view of two LED chips 56 connected in series, where the interconnecting copper 880 may be formed to have a wide area between LED chips 56 to reduce resistance. A phosphor layer or tile may be formed overlying the LED chips for conversion of the blue LED light into white light.

By creating an external metal connection between LED chips after the LED chips are encapsulated by a top layer, a reliable electrical connection can be made using conventional metallization techniques. Further, the metallization can be customized after the LED chips are encapsulated. This technique avoids complexities related to aligning and laminating a top sheet, having a preformed metal pattern, over the LED chips while making ohmic connections between the patterned metal and the LED electrodes.

The LED structure may be a narrow LED strip, having a single column of series connected LED chips, or may be an LED sheet, having a two dimensional array of LED chips.

FIG. 71 illustrates a variation of FIGS. 64-70 where there is no interconnector 180 positioned in the hole in the intermediate layer 182. The same processes performed in FIGS. 65-69 are then performed on the structure of FIG. 71. In another embodiment, there is no hole initially formed in the intermediate layer leading to the conductor on the bottom substrate 176. In such a case, the hole may be formed by the laser beam 872 or by other methods.

As shown in FIG. 72, the seed layer 876 and electroplated copper 881 then fill (or partially fill) the hole to create a series connection.

Any gaps between the top substrate material 870 and the bottom substrate 176 in all embodiments may be filled by a silicone adhesive layer.

FIG. 73 illustrates thin LED chips 500 similar to FIG. 47A where there is no intermediate layer used. A bottom substrate 882 has a conductor pattern 884, and the bottom electrodes (e.g., anode) of the LED chips 500 are bonded to pads formed by the conductor pattern 884. A top substrate material 886 is laminated or otherwise deposited over the LED chips 500. The material 886 may encapsulate the LED chips 500, or the LED chips 50 may have been previously encapsulated by a layer of silicone or other suitable material. The substrate material 886 may be infused with a YAG phosphor or other conversion material.

FIG. 74 illustrates the top substrate material 886 being laser drilled by beams 888 to expose metal areas to be contacted by an external conductor pattern. The drilling process may be the same as that previously described.

FIG. 75 illustrates a metal or other conductor 890 (e.g., conductive ink) deposited over the top substrate material 886 and into the holes to interconnect the LED chips 500 in series. The conductor 890 may be sputtered and patterned or deposited by any other method. Depositing a conductive ink using a conventional inkjet printing process is particularly advantageous since it avoids the use of a vacuum chamber and other expensive equipment and avoids the need for etching.

FIG. 76 is a top down view of two LED chips 500 connected in series, where the interconnecting conductor 890 may be formed to have a wide area between LED chips 500 to reduce resistance.

FIG. 77 illustrates a liquid encapsulant 894, such as silicone, sprayed on, spun on, molded over, or otherwise deposited over the LED chips 500 to form the top substrate. The encapsulant conforms to the outer surface of the LED chips 500. The encapsulant 894 may form a planar surface over the structure. The encapsulant 894 may be infused with a phosphor to convert blue light into white light.

FIG. 78 illustrates the encapsulant 894 being laser drilled by beams 896 to form holes to expose metal areas to be contacted by an external conductor pattern.

FIG. 79 illustrates a metal or other conductor 898 (e.g., conductive ink) deposited over the encapsulant 894 and into the holes to interconnect the LEDs in series. As previously mentioned, printing the conductor 898 using an inkjet printing process is advantageous to allow the LED strip or sheet to be fabricated inexpensively. The top down view may be similar to FIG. 76.

FIG. 80 illustrates photoresist posts 910 or metal studs over areas to be contacted by an external metal layer. The posts 910 may be formed by a simple photolithographic process. If metal studs are used, the studs may be gold balls that are positioned and attached using an automatic machine typically used to form a ball grid array on the bottom of an integrated circuit package. FIG. 80 also illustrates the structure being coated with a liquid encapsulant 894 similar to the encapsulant 894 described with respect to FIG. 77. The surface may be planar.

FIG. 81 illustrates the cured encapsulant 894 being polished or etched using CMP to expose the photoresist posts 910 or metal studs. If photoresist posts 910 are used, the photoresist is then stripped away to form holes.

FIG. 82 illustrates a conductor 912 filling the holes and forming a series connection between the LED chips 500. The conductor 912 may be deposited by any of the techniques described herein, such as by sputtering and etching, printing, lift-off, etc. If lift-off is used, a photoresist pattern is created over areas where a metal conductor is not to be formed. The metal is then blanket deposited over the structure, and the photoresist with its overlying metal is stripped to lift off the metal.

FIG. 83 illustrates a dielectric layer 916 that is patterned with trenches 920 and holes that define an interconnection pattern.

FIG. 84 illustrates a metal 924, such as copper, blanket deposited over the structure to fill the trenches 920 and holes.

FIG. 85 illustrates the metal 924 being polished down to the dielectric layer 916, using CMP, so that only the metal in the trenches 920 and holes remains to create a series connection between the LED chips 500. The top down view may be similar to FIG. 76.

In other embodiment, the metal connectors may be solder, and the solder is patterned using a printed or laminated solder mask.

In the various processes described, the conductor over the LED chips may be a transparent conductor so as to not block light. The transparent conductor will be connected to a lower resistivity conductor away from the chip. Transparent conductors include ITO, silver nanowires in a binder, and other known materials.

FIG. 86 illustrates a roll-to-roll process for forming LED strips (single column of series-connected LEDs) or LED sheets (arrays of LEDs.

A bottom substrate 950 may be supplied on a roll 952. The substrate 950 may be a flexible circuit with a conductor pattern 954. The substrate 950 may be formed with a reflective bottom surface.

At a first station 956, the LED chips 958 are positioned on metal pads on the substrate 950, and the bottom electrodes (e.g., anode electrodes) of the LED chips 958 are bonded to the pads. This may be performed by conventional pick and place equipment.

At a next station 962, a top substrate material 964 may be laminated on, sprayed on, or otherwise deposited over the LED chips 958. The substrate material 964 may be a transparent material infused with a phosphor and may encapsulate the LED chips 958.

At a next station 966, holes 968 are formed where metal is to contact the LED electrodes and other conductors covered by the top substrate material 964. Holes may be formed by laser, ion beam, or other techniques described herein.

At a next station 972, a conductor 974 is deposited, such as by injet printing of conductive ink, to fill the holes and interconnect the LED chips 958 in series.

At a next station 980, a phosphor 982 is deposited, such as a preformed tile, a droplet of phosphor in a binder, a molded phosphor, a sprayed on phosphor, or other type. The wavelength conversion material may instead be quantum dots or other materials.

The resulting structure is then cut or put on a second roll 990. The roll-to-roll method is very advantageous for forming strips of LED chips since all processes are conducted on a linear arrangement of LED chips so alignment is very precise. A separate process may be performed to provide electrical termination connectors to the ends of the LED strips or perform any additional steps.

In all embodiments, the top layer over the LED chips may comprise a plurality of light-transmissive layers, such as for additional protection of the LED chips and conductors, or for improving light extraction, or for optically shaping the light emission, or for wavelength conversion, or for mechanical support, or for other uses.

In all embodiments, if a thicker conductive layer is desired, a printed conductor layer may be plated with copper or other metal. A sacrificial shorting bar, connected to all metal areas to be plated, may be formed to conduct the small current during electroplating. The bar may then be cut by laser or other means. Conductive inks can easily deposit layers of 20 microns.

Electroless plating of the inkjet/seed layer or any other layer may be used. One suitable inkjet printing technology involving a catalytic inkjet process followed by an electroless copper plating process is described Conductive Inkjet Technology at www.conductiveinkjet.com/en/technology.aspx, incorporated herein by reference.

Certain commercially available conductive inkjet inks are relatively viscous and can support phosphor particles. The inkjet inks may also by transparent. Therefore, the conductive ink making contact to the top electrode of the LEDs may be large for low resistivity, transparent for allowing light to pass, and, at the same time, provide phosphor conversion of the blue LED light. Quantum dots may also be used.

Suitable inket printers are commercially available along with many suitable varieties of conductive transparent and non-transparent inks.

As used herein, the term "printing" may include any and all printing, spraying, deposition, lamination, or other printing processes. Some other suitable printing processes include electroink printing, laser jet printing, magnetic printing, electro-optical printing, screen printing, and thermal printing. The preferred printing processes do not require special vacuum chambers, clean rooms, or elevated temperatures.

Any of the various structure components and method steps may be mixed and matched in other embodiments.

All the light sheets/strips described above are easily controlled to be automatically dimmed when there is ambient daylight so that the overall energy consumption is greatly reduced. Other energy saving techniques may also be used based upon load shedding, occupancy, task illumination and user intervention Further, it may be desirable that the blue light component in the white light emitted by the light sheet/strip be adjustable over the day to conform to the circadian rhythm of humans. It is well known that humans find it more comfortable for artificial light to generally replicate some or all or the spectrum of the sun over the day. This can be generally accomplished by dynamically adjusting the amount of blue light emitted by the light source over the day. Accordingly, in a variation of all embodiments, blue LEDs having no phosphor or a reduced phosphor are distributed around the array of LEDs and controlled to have a variable brightness to selectively add or reduce the amount of blue light in the overall light emission of the light sheet/strip. These additional blue LEDs can be automatically controlled by an external controller for the circadian rhythm. One form of control may be by a signal through the power lines controlling a current source for the additional blue LEDs, such as the current source 202 in FIG. 20D.

Any embodiment may be used for overhead illumination to substitute for fluorescent fixtures or any other lighting fixture. Small light strips may be used under cabinets. Long light strips may be used as accent lighting around the edges of ceilings. The light sheets may be bent to resemble lamp shades. Many other uses are envisioned.

The standard office luminaire is a 2×4 foot ceiling troffer, containing two 32 watt, T8 fluorescent lamps, where each lamp outputs about 3000 lumens. The color temperature range is about 3000-5000 K. If low power LEDs are used (e.g., model SemiLEDs SL-V-B15AK LEDs driven at 20 mA), a substitute luminaire would need about 580-620 chips for equivalence to the DOE CALiPER benchmark troffer. Assuming chip prices in the range of 3-5 cents, the total chip cost would be $17.50-$31. If the chips are operated at higher currents, say 30 mA, then the total chip count could be reduced by approximately one-third. Power conversion/driver efficiency is about 85%. Overall then, the lightsheet efficacy (120 V AC to total lumens out) would be 78-86 lm/W at 20 mA drive current and 3.2 V (compared to the benchmark T8 troffer performance of 63 lm/W). Accordingly, the invention can provide a practical, cost-effective solid state substitute for a conventional 2×4 foot troffer, while achieving improved performance and enabling a wide range of dimming. The invention has applications to other geometric arrangements of light fixtures.

The various features of all embodiments may be combined in any combination.

While particular embodiments of the present invention have been shown and described, it will be obvious to those skill in the art that changes and modifications may be made without departing from this invention in its broader aspects and, therefore, the appended claims are to encompass within their scope all changes and modifications that fall within the true spirit and scope of the invention.

What is claimed is:

1. A light emitting device, comprising:
   a first layer having an elongate shape extending along a length from a first end to a second end, the first layer having a width and a thickness, the width and the thickness being orthogonal to each other and to the length, and the width and the thickness both being less than the length;
   multiple non-packaged light emitting diode (LED) dies configured to emit light having a first spectral power distribution, each of the multiple non-packaged LED dies having a first die electrode and a second die electrode, the multiple non-packaged LED dies being supported by the first layer and spaced apart from one another along the length of the first layer;
   a solid second layer entirely composed of a first material, the solid second layer having an elongate shape and a non-planar interface facing the first layer, the solid second layer being in contact with the first layer between the spaced apart multiple non-packaged LED dies such that the non-planar interface encapsulates each of the multiple non-packaged LED dies, the first material comprising a wavelength conversion material for converting the light having the first spectral power distribution to light having a second spectral power distribution; and
   an electrically-conducting material on a surface of the first layer, the electrically-conducting material arranged in a pattern that operatively connects the first die electrode and the second die electrode of the multiple non-packaged LED dies without wire bonds, the multiple non-packaged LED dies disposed on the pattern;
   wherein a surface of the solid second layer is an outermost surface of the light emitting device and the light emitting device is a flexible light emitting device.

2. The light emitting device of claim 1, wherein the first material is plastically deformed to encase the multiple non-packaged LED dies.

3. The light emitting device of claim 1, wherein the first layer and the second layer are coextensive along a length of the light emitting device.

4. The light emitting device of claim 3, wherein the surface of the first layer is a flat surface.

5. The light emitting device of claim 1, wherein the multiple non-packaged LED dies are blue or UV emitting LED dies.

6. The light emitting device of claim 5, wherein the light emitting device is a white light emitting device.

7. The light emitting device of claim 1, wherein the wavelength conversion material comprises a phosphor.

8. The light emitting device of claim 1, wherein the first layer comprises a light-transmissive material.

9. The light emitting device of claim 8, wherein the first layer is transparent.

10. The light emitting device of claim 1, wherein the first layer comprises a metal.

11. The light emitting device of claim 1, wherein the multiple non-packaged LED dies are electrically connected in series.

12. The light emitting device of claim 1, wherein the first die electrode and the second die electrode are located on a first side of each of the multiple non-packaged LED dies.

13. The light emitting device of claim 12, wherein each of the multiple non-packaged LED dies is configured to emit the light having the first spectral power distribution through a second side of each of the multiple non-packaged LED dies opposite the first side of each of the multiple non-packaged LED dies.

14. The light emitting device of claim 13, wherein the first side of each of the multiple non-packaged LED dies reflects light from within the non-packaged LED die back into the non-packaged LED die.

15. The light emitting device of claim 13, wherein the first side of each of the multiple non-packaged LED dies faces the first layer.

16. The light emitting device of claim 1, further comprising a third layer, the first layer being arranged between the solid second layer and the third layer.

17. The light emitting device of claim 16, wherein the third layer comprises the wavelength conversion material.

18. The light emitting device of claim 1, wherein the multiple non-packaged LED dies are flip-chip LED dies.

19. The light emitting device of claim 1, wherein the light emitting device has a flexible cylinder or half-cylinder shape and the multiple non-packaged LED dies are arranged in a single string of multiple non-packaged LED dies connected in series.

20. The light emitting device of claim 1, wherein the light emitting device has a thickness in a range from 1 mm to 1 cm.

21. The light emitting device of claim 1, wherein the first material comprises a light-transmissive material.

22. The light emitting device of claim 1, wherein the non-planar interface of the solid second layer is a textured interface.

23. The light emitting device of claim 1, wherein a thickness of the solid second layer is greater than a height of the multiple non-packaged LED dies.

* * * * *